(12) United States Patent
Adamovich et al.

(10) Patent No.: US 11,515,482 B2
(45) Date of Patent: Nov. 29, 2022

(54) DEEP HOMO (HIGHEST OCCUPIED MOLECULAR ORBITAL) EMITTER DEVICE STRUCTURES

(71) Applicant: Universal Display Corporation, Ewing, NJ (US)

(72) Inventors: Vadim Adamovich, Yardley, PA (US); Eric A. Margulies, Philadelphia, PA (US); Pierre-Luc T. Boudreault, Pennington, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 441 days.

(21) Appl. No.: 16/596,948

(22) Filed: Oct. 9, 2019

(65) Prior Publication Data

US 2020/0127212 A1 Apr. 23, 2020

Related U.S. Application Data

(60) Provisional application No. 62/749,290, filed on Oct. 23, 2018.

(51) Int. Cl.
*H01L 51/00* (2006.01)
*C09K 11/06* (2006.01)
*H01L 51/50* (2006.01)

(52) U.S. Cl.
CPC .......... *H01L 51/0067* (2013.01); *C09K 11/06* (2013.01); *H01L 51/0072* (2013.01); *H01L 51/0073* (2013.01); *H01L 51/0074* (2013.01); *H01L 51/0085* (2013.01); *C09K 2211/185* (2013.01); *H01L 51/5004* (2013.01); *H01L 51/5012* (2013.01); *H01L 51/5096* (2013.01); *H01L 2251/552* (2013.01)

(58) Field of Classification Search
CPC ............. H01L 51/0067; H01L 51/0072; H01L 51/0073; H01L 51/0074; H01L 51/0085; H01L 51/5004; H01L 51/5012; H01L 51/5096; H01L 2251/552; H01L 51/0071; H01L 2251/5384; H01L 51/5024; H01L 51/502; H01L 51/504; C09K 11/06; C09K 2211/185; C07F 15/0033; Y10S 977/774
USPC ...................................................... 428/690
See application file for complete search history.

(56) References Cited

U.S. PATENT DOCUMENTS

| | | | |
|---|---|---|---|
| 4,769,292 A | 9/1988 | Tang | |
| 5,061,569 A | 10/1991 | VanSlyke et al. | |
| 5,247,190 A | 9/1993 | Friend | |
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 6,528,187 B1 | 3/2003 | Okada | |
| 6,687,266 B1 | 2/2004 | Ma et al. | |
| 6,835,469 B2 | 12/2004 | Kwong et al. | |
| 6,921,915 B2 | 7/2005 | Takiguchi et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |
| 7,250,226 B2 | 7/2007 | Tokito et al. | |
| 7,279,704 B2 | 10/2007 | Walters | |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |

(Continued)

FOREIGN PATENT DOCUMENTS

| EP | 0650955 | 5/1995 |
|---|---|---|
| EP | 1725079 | 11/2006 |

(Continued)

OTHER PUBLICATIONS

Noviandri, I., et al., "The Decamethylferrocenium/Decamethylferrocene Redox Couple: A Superior Redox Standard to the Ferrocenium/Ferrocene Redox Couple for Studying Solvent Effects on the Thermodynamics of Electron Transfer," J. Phys. Chem. B, 1999, vol. 103, pp. 6713-6722.

Extended European Search Report for Application No. EP19204284. 4, dated Mar. 10, 2020, 8 pages.

Baldo et al."Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

(Continued)

*Primary Examiner* — Douglas J McGinty

(74) *Attorney, Agent, or Firm* — Duane Morris LLP

(57) ABSTRACT

Embodiments of the disclosed subject matter provide an organic light emitting diode (OLED) having an anode, a cathode, an emissive layer disposed between the anode and the cathode, and a hole blocking layer disposed between the emissive and the cathode. The emissive layer may include a phosphorescent dopant, where the phosphorescent dopant has an emission in 0.5% doped PMMA (Poly(methyl methacrylate)) thin film with a peak maximum wavelength that is greater than or equal to 600 nm at room temperature. The energy of a highest occupied molecular orbital (HOMO) of the phosphorescent dopant may be lower than or equal to −5.1 eV, and the energy of the HOMO of the hole blocking layer is at least 0.1 eV lower than the energy of the HOMO of the phosphorescent dopant.

20 Claims, 7 Drawing Sheets

(56) References Cited

U.S. PATENT DOCUMENTS

| | | | |
|---|---|---|---|
| 7,431,968 B1 | 10/2008 | Shtein | |
| 7,445,855 B2 | 11/2008 | Mackenzie et al. | |
| 7,534,505 B2 | 5/2009 | Lin et al. | |
| 7,968,146 B2 | 6/2011 | Wagner | |
| 10,340,464 B2* | 7/2019 | Ma | H01L 51/0074 |
| 10,522,776 B2* | 12/2019 | Adamovich | H01L 51/504 |
| 10,672,996 B2* | 6/2020 | Ma | C09K 11/025 |
| 11,276,829 B2* | 3/2022 | Tsai | C09K 11/06 |
| 2002/0034656 A1 | 3/2002 | Thompson et al. | |
| 2002/0134984 A1 | 9/2002 | Igarashi | |
| 2002/0158242 A1 | 10/2002 | Son et al. | |
| 2003/0138657 A1 | 7/2003 | Li et al. | |
| 2003/0152802 A1 | 8/2003 | Tsuboyama et al. | |
| 2003/0162053 A1 | 8/2003 | Marks et al. | |
| 2003/0175553 A1 | 9/2003 | Thompson et al. | |
| 2003/0230980 A1 | 12/2003 | Forrest | |
| 2004/0036077 A1 | 2/2004 | Ise | |
| 2004/0137267 A1 | 7/2004 | Igarashi et al. | |
| 2004/0137268 A1 | 7/2004 | Igarashi et al. | |
| 2004/0174116 A1 | 9/2004 | Lu | |
| 2005/0025993 A1 | 2/2005 | Thompson et al. | |
| 2005/0112403 A1 | 5/2005 | Ju | |
| 2005/0112407 A1 | 5/2005 | Ogasawara et al. | |
| 2005/0238919 A1 | 10/2005 | Ogasawara | |
| 2005/0244673 A1 | 11/2005 | Satoh et al. | |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0202194 A1 | 9/2006 | Jeong et al. | |
| 2006/0240279 A1 | 10/2006 | Adamovich et al. | |
| 2006/0251923 A1 | 11/2006 | Lin et al. | |
| 2006/0263635 A1 | 11/2006 | Ise | |
| 2006/0280965 A1 | 12/2006 | Kwong et al. | |
| 2007/0190359 A1 | 8/2007 | Knowles et al. | |
| 2007/0278938 A1 | 12/2007 | Yabunouchi et al. | |
| 2008/0015355 A1 | 1/2008 | Schafer et al. | |
| 2008/0018221 A1 | 1/2008 | Egen et al. | |
| 2008/0106190 A1 | 5/2008 | Yabunouchi et al. | |
| 2008/0124572 A1 | 5/2008 | Mizuki et al. | |
| 2008/0220265 A1 | 9/2008 | Xia et al. | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Prakash et al. | |
| 2009/0108737 A1 | 4/2009 | Kwong et al. | |
| 2009/0115316 A1 | 5/2009 | Zheng et al. | |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |
| 2009/0191427 A1 | 7/2009 | Liao | |
| 2015/0295197 A1 | 10/2015 | Adamovich | |
| 2016/0028021 A1* | 1/2016 | Zeng | C07D 409/04 252/301.16 |
| 2016/0093808 A1* | 3/2016 | Adamovich | H01L 51/0085 252/301.16 |
| 2017/0077425 A1* | 3/2017 | Ma | C07F 15/0033 |
| 2017/0229663 A1 | 8/2017 | Tsai | |
| 2020/0220088 A1* | 7/2020 | Ma | C09K 11/025 |

FOREIGN PATENT DOCUMENTS

| | | |
|---|---|---|
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008057394 A1 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2010011390 A2 | 1/2010 |

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato)beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

(56) References Cited

OTHER PUBLICATIONS

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based On Silole Derivatives And Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4): 1248-1255 (2003).

Sakamoto, Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91: 209-215 (1997).

Shirota, Yasuhiko et al., "Starburst Molecules Based on pi-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

T. Östergård et al., "Langmuir-Blodgett Light-Emitting Diodes Of Poly(3-Hexylthiophene) Electro-Optical Characteristics Related to Structure," Synthetic Metals, 88:171-177 (1997).

Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).

Tang, C.W. and VanSlyke, S.A., "Organic Electroluminescent Diodes," Appl. Phys. Lett., 51(12):913-915 (1987).

Tung, Yung-Liang et al., "Organic Light-Emitting Diodes Based on Charge-Neutral Ru II PHosphorescent Emitters," Adv. Mater., 17(8)1059-1064 (2005).

Van Slyke, S. A. et al., "Organic Electroluminescent Devices with Improved Stability," Appl. Phys. Lett., 69(15):2160-2162 (1996).

Wang, Y. et al., "Highly Efficient Electroluminescent Materials Based on Fluorinated Organometallic Iridium Compounds," Appl. Phys. Lett., 79(4):449-451 (2001).

Wong, Keith Man-Chung et al., A Novel Class of Phosphorescent Gold(III) Alkynyl-Based Organic Light-Emitting Devices with Tunable Colour, Chem. Commun., 2906-2908 (2005).

Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

DEEP HOMO (HIGHEST OCCUPIED MOLECULAR ORBITAL) EMITTER DEVICE STRUCTURES

CROSS-REFERENCE TO RELATED APPLICATIONS

This application claims priority to U.S. Patent Application Ser. No. 62/749,290, filed Oct. 23, 2018, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

An embodiment of the disclosed subject matter may provide an organic light emitting diode (OLED) having an anode, a cathode, an emissive layer disposed between the anode and the cathode, and a hole blocking layer disposed between the emissive and the cathode. The emissive layer may include a phosphorescent dopant. The phosphorescent dopant may have an emission in 0.5% doped PMMA (Poly (methyl methacrylate)) thin film with a peak maximum wavelength that is greater than or equal to 600 nm at room temperature. The energy of a highest occupied molecular orbital (HOMO) of the phosphorescent dopant may be lower than or equal to −5.1 eV, and the energy of the HOMO of the hole blocking layer may be at least 0.1 eV lower than the energy of the HOMO of the phosphorescent dopant.

The peak maximum wavelength of the phosphorescent dopant may be greater than or equal to 610 nm, greater than or equal to 620 nm, greater than or equal to 630 nm, greater than or equal to 650 nm, greater than or equal to 700 nm, greater than or equal to 750 nm, or greater than or equal to 800 nm.

The OLED may have the hole blocking layer disposed on the emissive layer.

The energy of the HOMO of the phosphorescent dopant may be lower than or equal to −5.2 eV, lower than or equal to −5.3 eV, or lower than or equal to −5.4 eV. The energy of the HOMO of the hole blocking layer may be at least 0.2 eV lower than the energy of the HOMO of the phosphorescent dopant, at least 0.3 eV lower than the energy of the HOMO of the phosphorescent dopant, or at least 0.4 eV lower than the energy of the HOMO of the phosphorescent dopant.

The hole blocking layer may include the compound of Formula I, which may be one or more of:

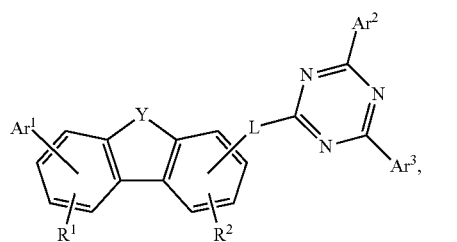

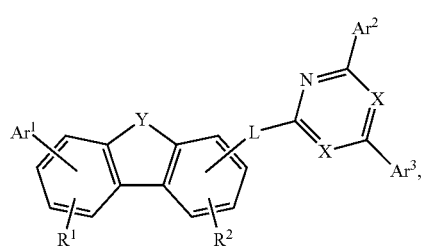

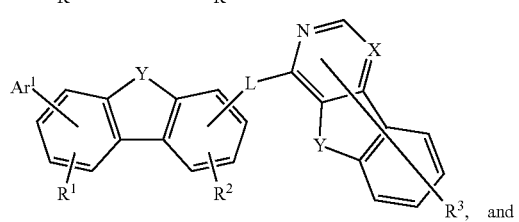

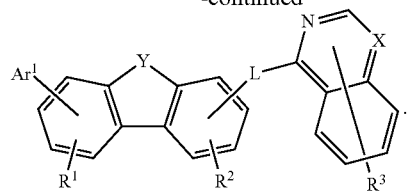

$R^1$ and $R^2$ each may independently represent mono to the maximum allowable substitution, or no substitution. Each $R^1$ and $R^2$ may be independently a hydrogen or deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and/or combinations thereof. Y nay be O, S, Se, $NAr^4$, $CAr^4Ar^5$, and $SiAr^4Ar^5$. Each $Ar^1$-$Ar^5$ may be independently selected from aryl, heteroaryl, and/or a combination thereof, and L may be a direct bond or a linker comprising at least one aromatic ring. Each $R^1$ and $R^2$ may be independently a hydrogen or a substituent such as aryl, heteroaryl, and/or combinations thereof. Y may be O, S, and/or $NAr^4$. In some embodiments, the compound of Formula I may be the only compound in the hole blocking layer.

The compound of Formula I may be one or more of:

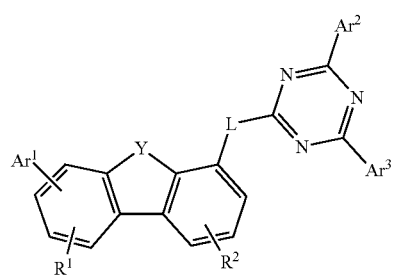

, and

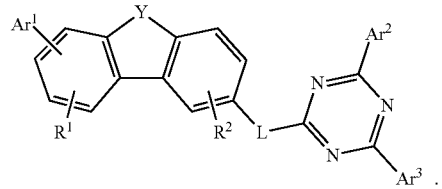

The phosphorescent dopant may emit light from a triplet excited state to a ground singlet state in the device at room temperature. The phosphorescent dopant may be a metal coordination complex having a metal-carbon bond. The metal may be Ir, Os, Pt, Pd, Ag, Au, or Cu. The metal coordination complex may include a ligand having a chemical moiety of pyridazine, pyrimidine, pyrazine, and/or triazine. The metal coordination complex may have the formula of $M(L^1)_x(L^2)_y(L^3)_z$, where $L^1$, $L^2$ and $L^3$ may be the same or different, where x is 1, 2, or 3, where y is 0, 1, or 2, where z is 0, 1, or 2, where x+y+z is the oxidation state of the metal M, where $L^1$, $L^2$ and $L^3$ may each independently selected from:

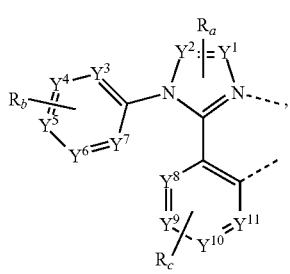
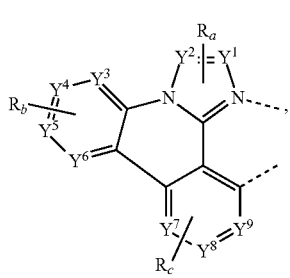
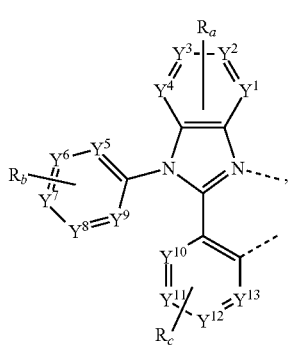
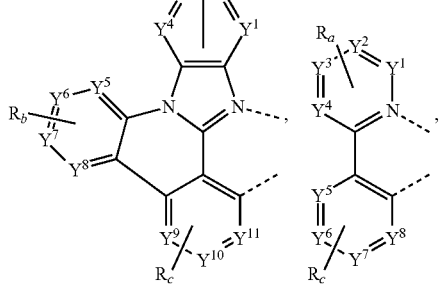
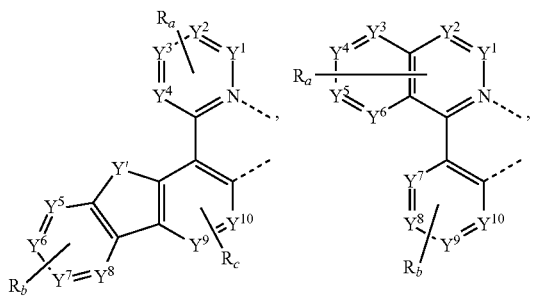
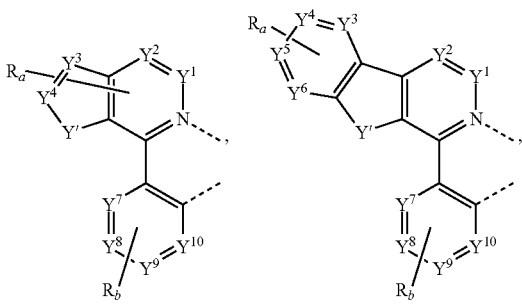
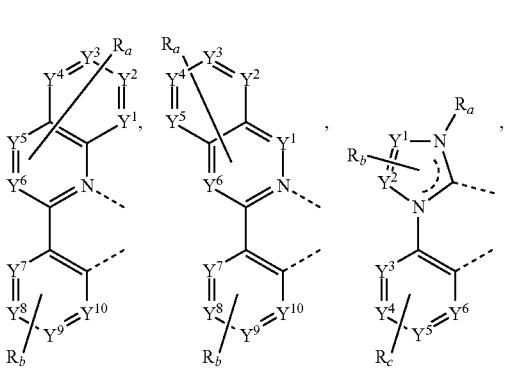
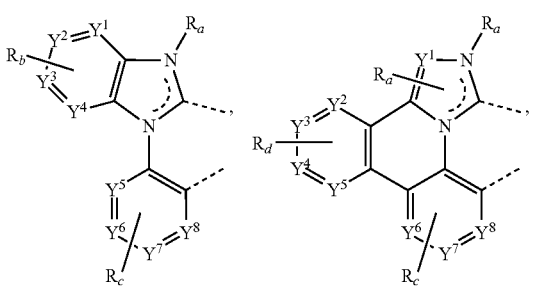
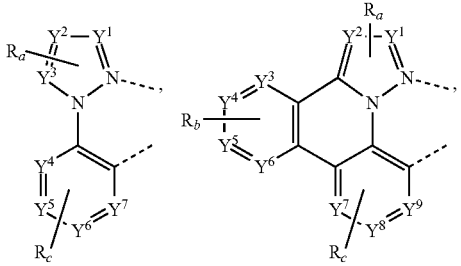
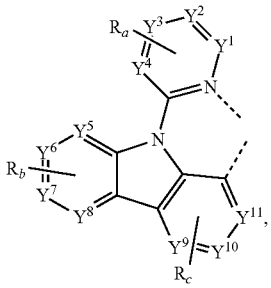

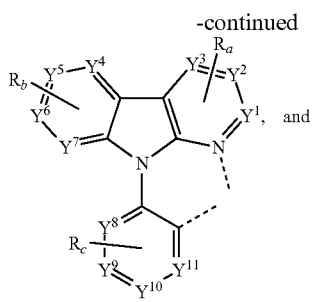

and

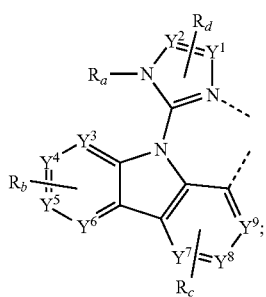

where $L^2$ and $L^3$ can also be

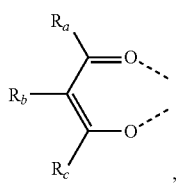

where each $Y^1$ to $Y^{13}$ are independently selected from carbon and nitrogen, where Y' may be at least one of $BR_e$, $NR_e$, $PR_e$, O, S, Se, C=O, S=O, $SO_2$, $CR_eR_f$, $SiR_eR_f$, and $GeR_eR_f$, where $R_e$ and $R_f$ may be optionally fused or joined to form a ring, where each $R_a$, $R_b$, $R_c$, and $R_d$ may independently represent from mono substitution to the maximum possible number of substitution, or no substitution, where each $R_a$, $R_b$, $R_c$, $R_d$, $R_e$ and $R_f$ is independently selected from hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, and where any two adjacent substituents of $R_a$, $R_b$, $R_c$, and $R_d$ are optionally fused or joined to form a ring or form a multidentate ligand.

The metal coordination complex may have the formula of $Ir(L_A)_3$, $Ir(L_A)(L_B)_2$, $Ir(L_A)_2(L_B)$, $Ir(L_A)_2(L_C)$, or $Ir(L_A)(L_B)(L_C)$, where $L_A$, $L_B$, and $L_C$ are different from each other. The metal coordination complex may have a formula of $Pt(L_A)(L_B)$, where $L_A$, and $L_B$ can be same or different, and where $L_A$, and $L_B$ may be optionally connected to form a tetradentate ligand.

The metal coordination complex may have a formula of $Ir(L_A)_2(L_C)$, where $L_A$ is selected from:

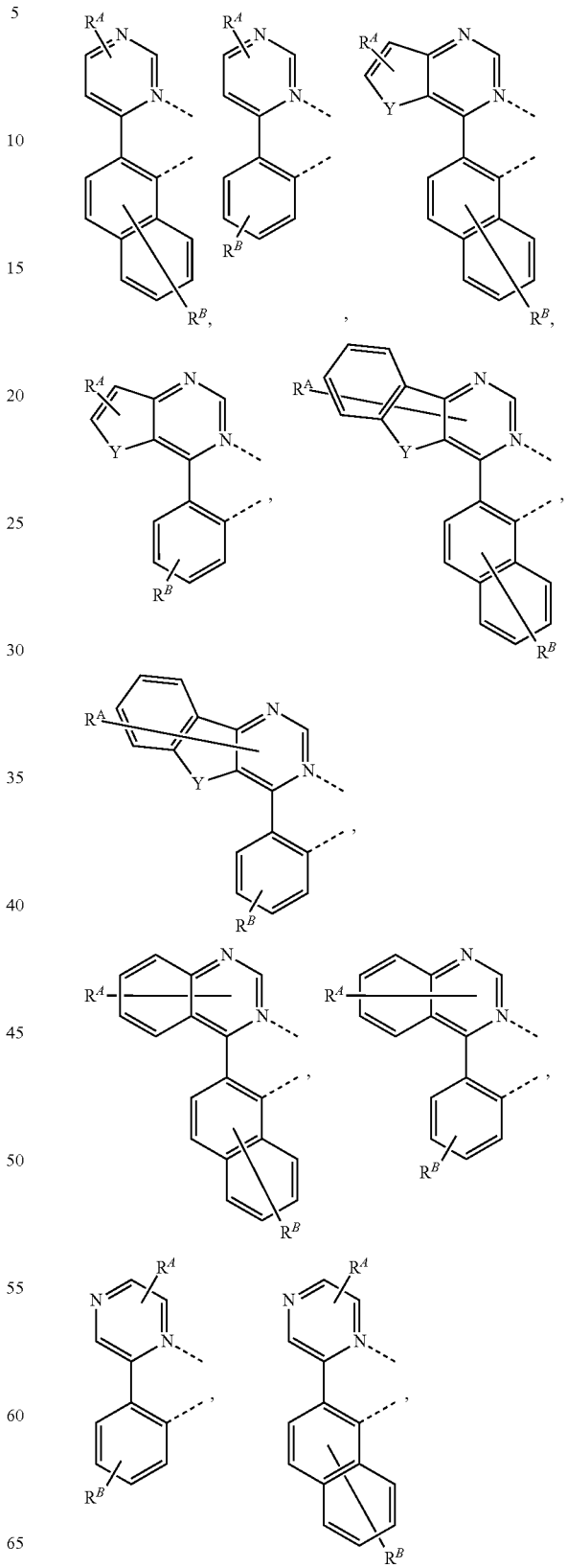

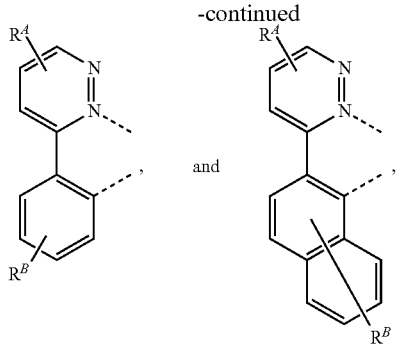

where L_C is

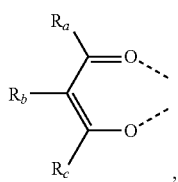

and where each $R^A$, and $R^B$ may independently represent from mono substitution to the maximum possible number of substitution, or no substitution. Each $R^A$, and $R^B$ may be independently selected from: hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof. Any two adjacent substituents of $R^A$, and $R^B$ may be optionally fused or joined to form a ring or form a multidentate ligand.

The metal coordination complex may be selected from:

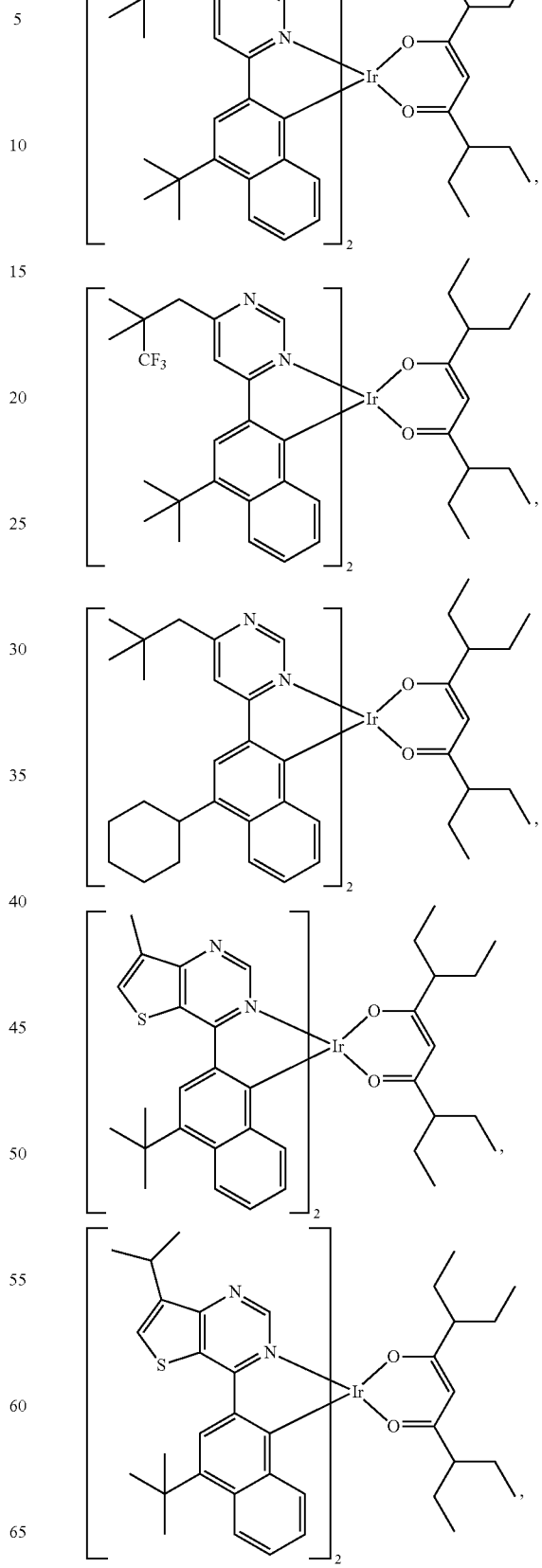

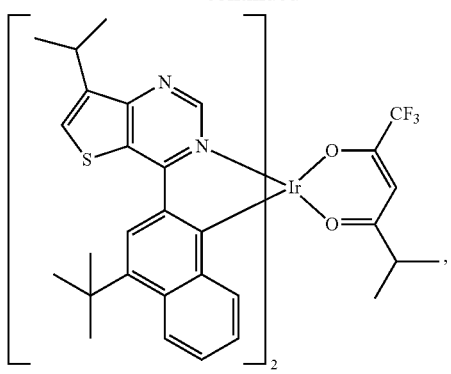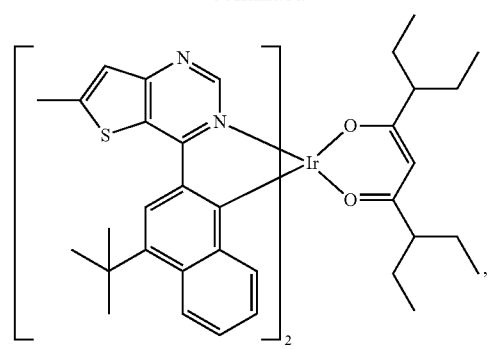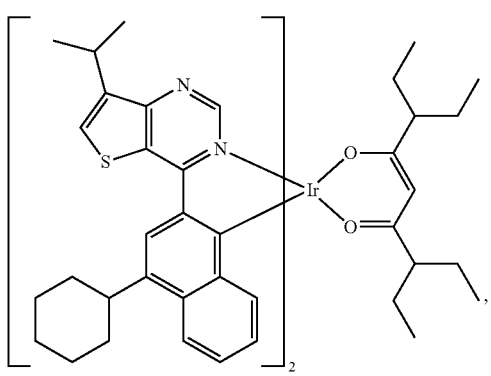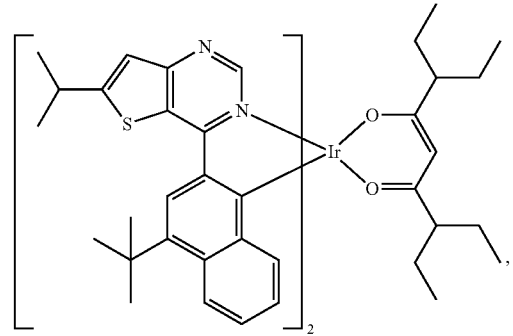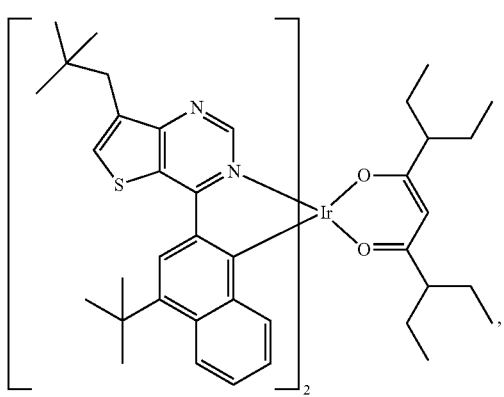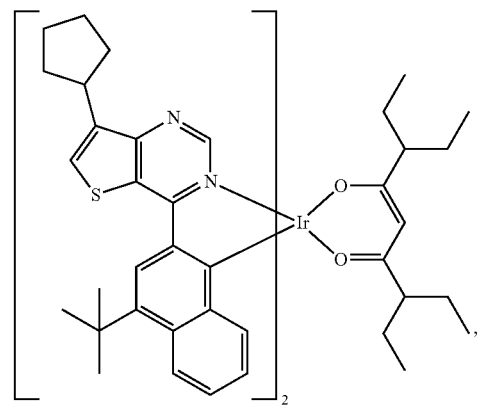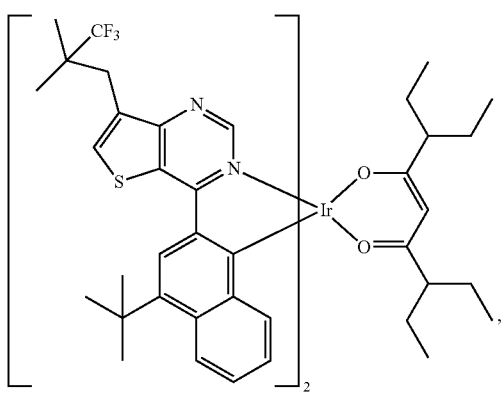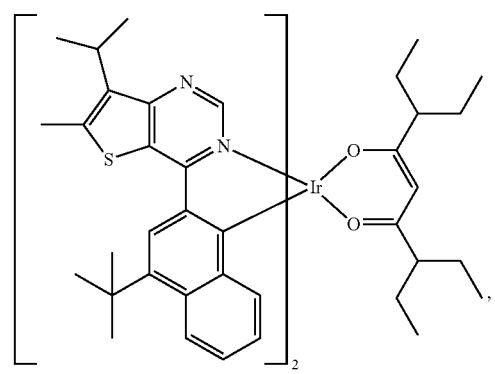

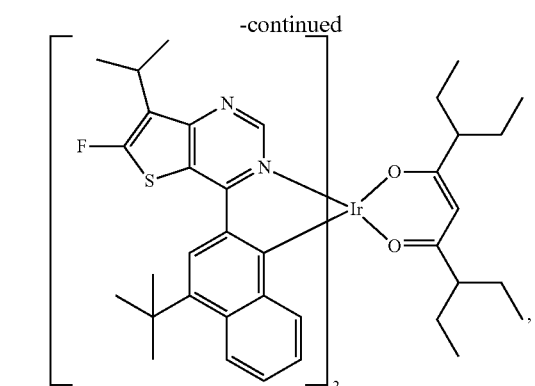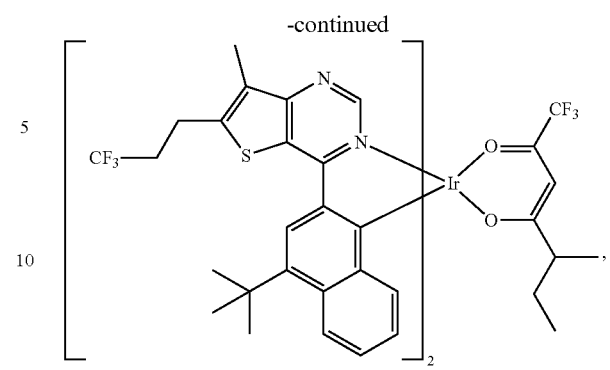

15
-continued
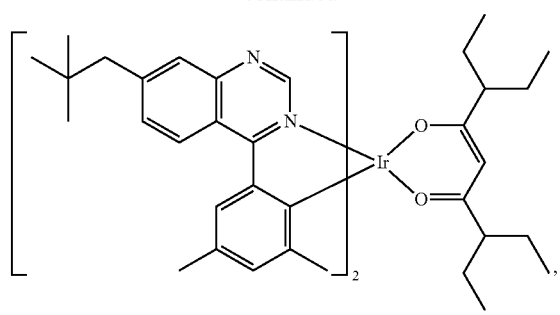
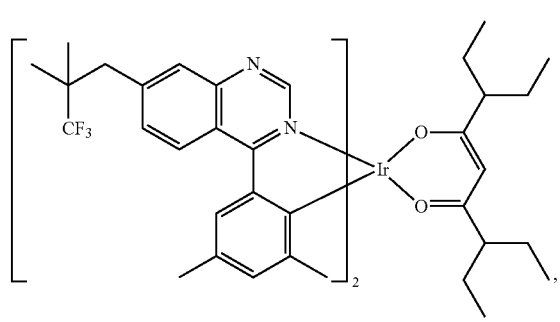
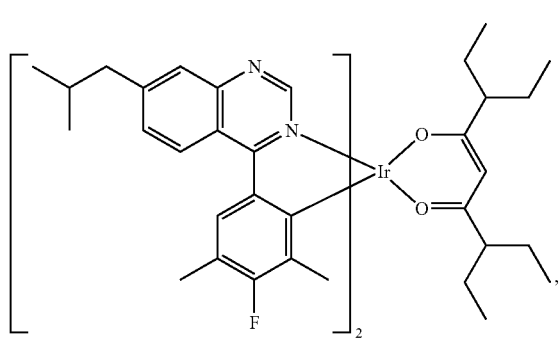
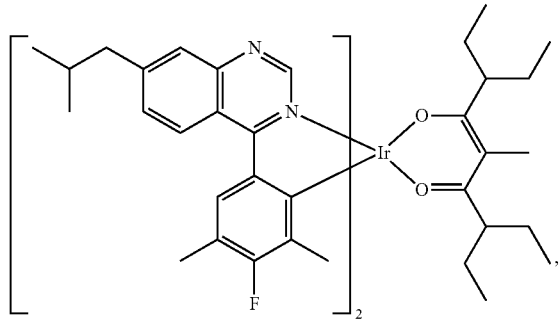
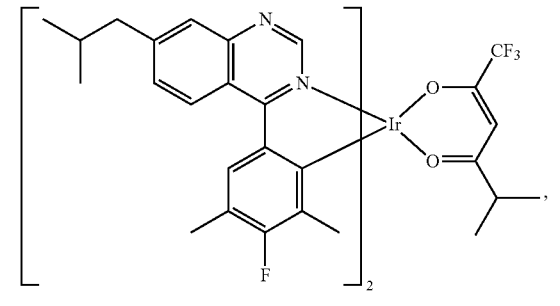
16
-continued
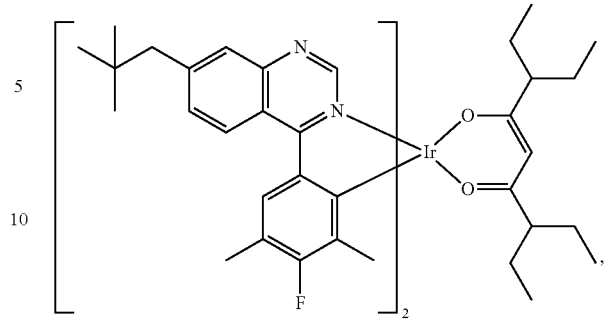
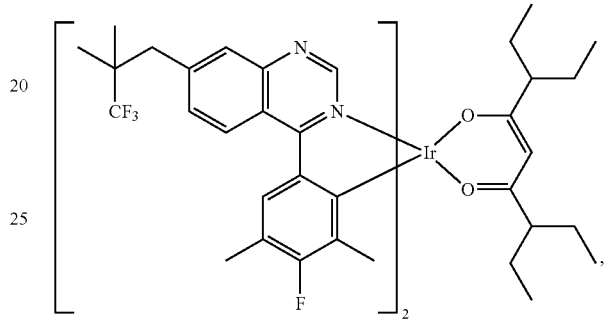
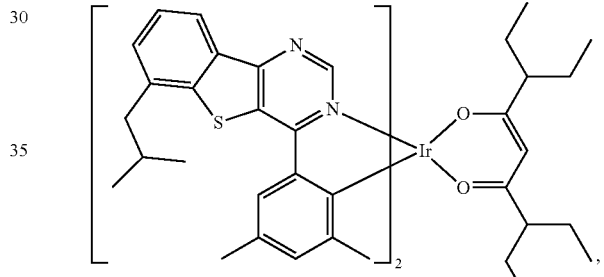
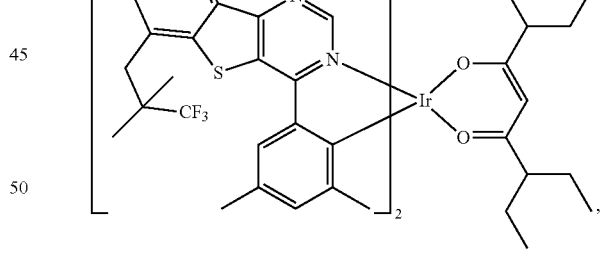
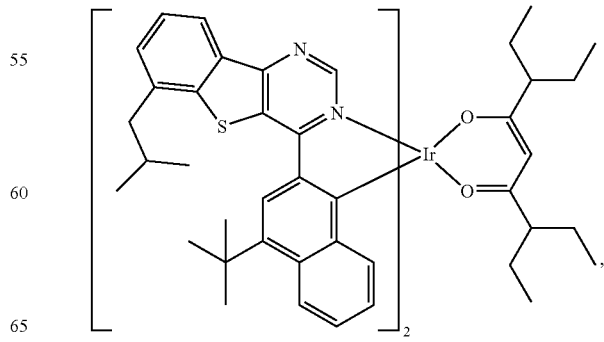

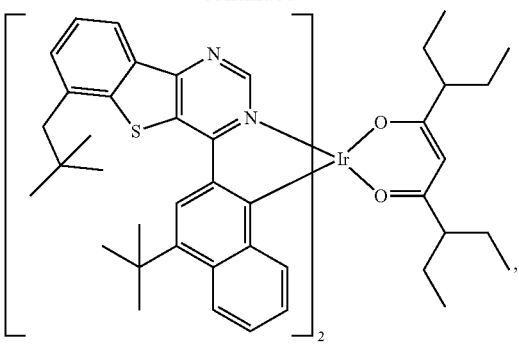

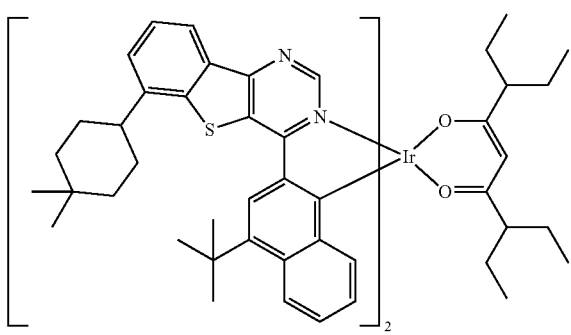

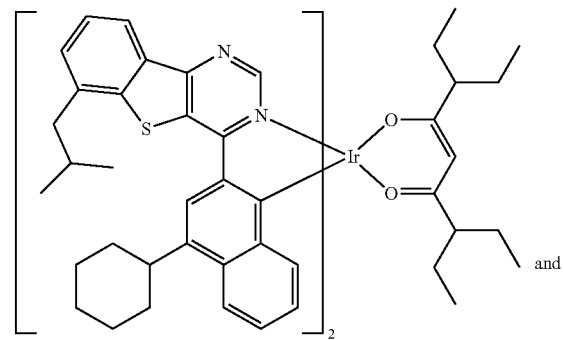

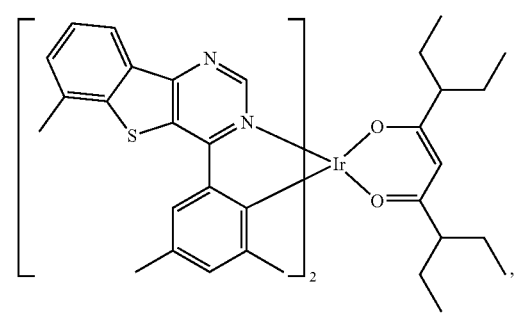
,

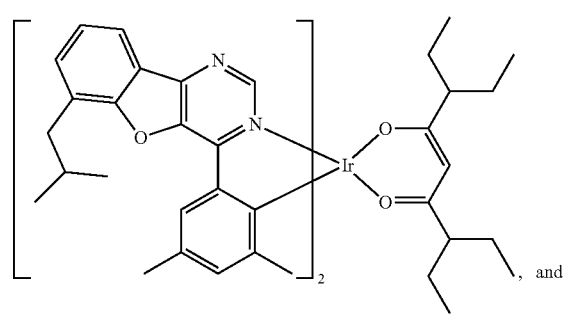
, and

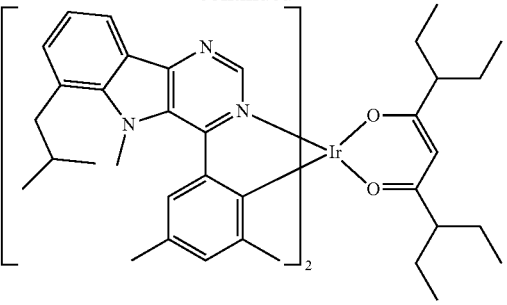

The metal coordination complex may be a Pt complex having a tetradentate ligand. The tetradentate ligand may have four coordination atoms selected from: (two anionic C, two neutral N); (one anionic C, one carbene C, one neutral N, and one anionic N); (two anionic C, one carbene C, one neutral N); (one anionic C, one anionic N, two neutral N); (one anionic C, one anionic O, two neutral N); (two carbene C, two anionic N).

The electron blocking layer may include the compound of Formula II:

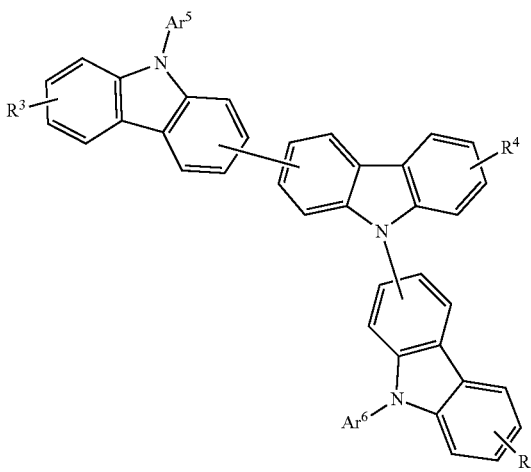

Formula II where $R^3$, $R^4$, and $R^5$ may each independently represent mono to the maximum allowable substitution, or no substitution, where each $R^3$, $R^4$, and $R^5$ may be independently a hydrogen or a substituent selected from deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and/or combinations thereof, and where each $Ar^5$ and $Ar^6$ may be independently selected from aryl, heteroaryl, and/or combination thereof. Each $R^3$, $R^4$, and $R^5$ may independently be a hydrogen or a substituent selected from aryl, heteroaryl, and/or combination thereof.

In embodiments of the disclosed subject matter, the device may be at least one type selected from: a flat panel display, a computer monitor, a medical monitor, a television, a billboard, a light for interior or exterior illumination and/or signaling, a heads-up display, a fully or partially transparent display, a flexible display, a laser printer, a telephone, a mobile phone, a tablet, a phablet, a personal digital assistant (PDA), a wearable device, a laptop computer, a digital camera, a camcorder, a viewfinder, a micro-display having an active area with a primary diagonal of 2 inches or less, a 3-D display, a virtual reality or augmented reality display, a vehicle, a video wall comprising multiple displays tiled together, a theater or stadium screen, and a sign.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
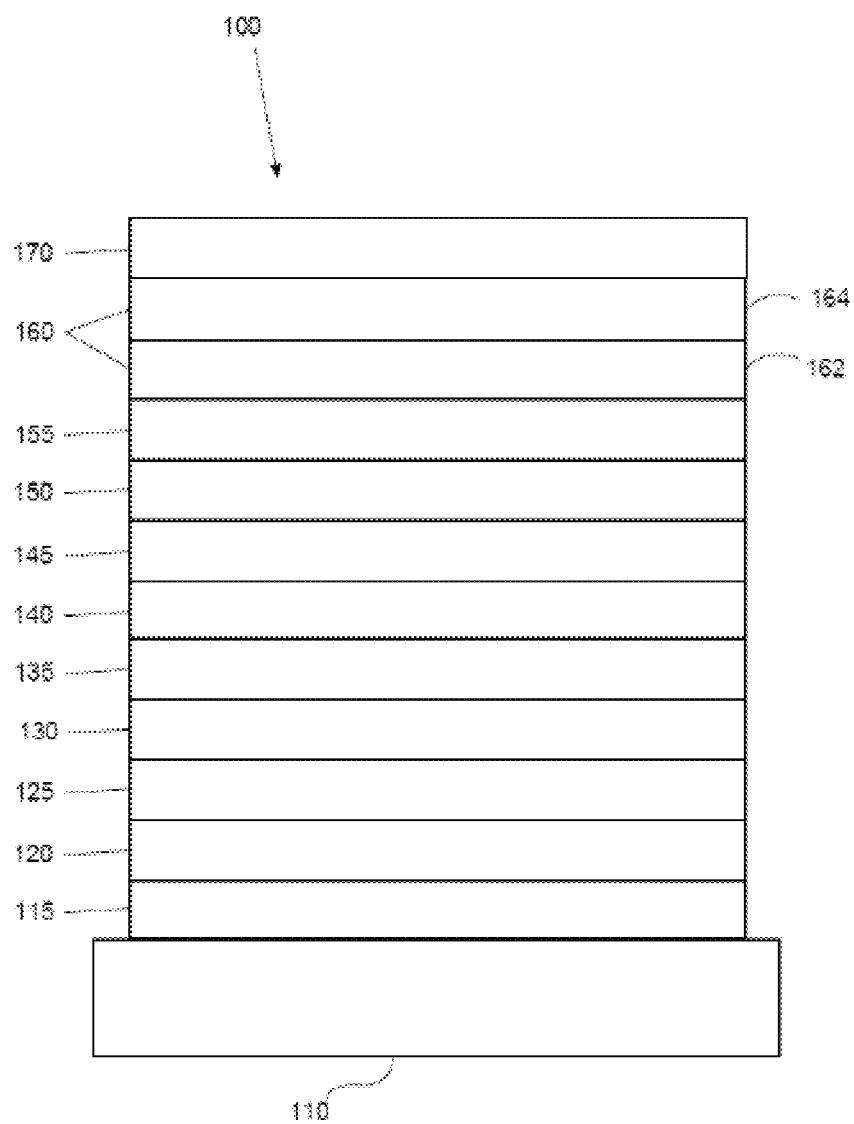
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
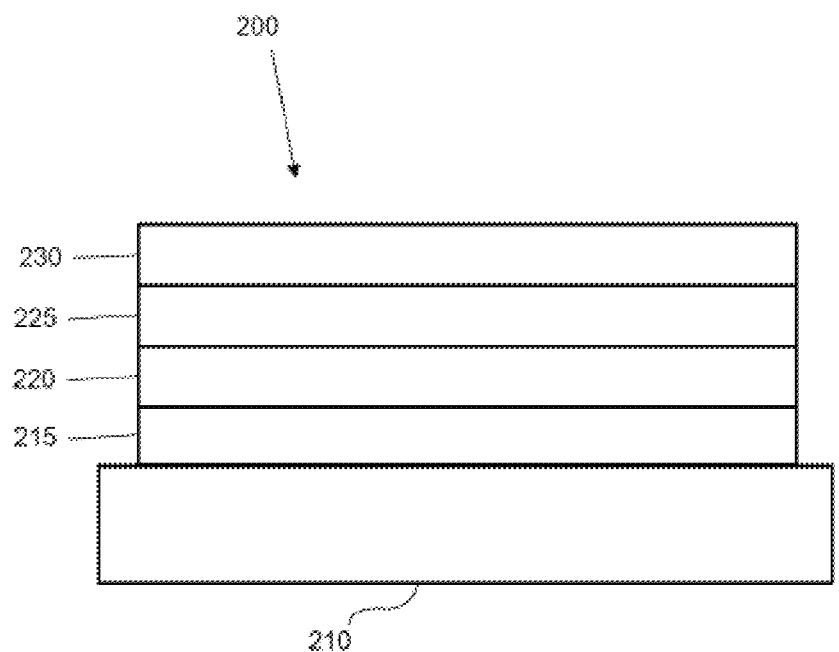
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Embodiments of the disclosed subject matter may provide an organic light emitting diode (OLED) having an anode, a cathode, an emissive layer disposed between the anode and the cathode, and a hole blocking layer disposed between the emissive and the cathode. The emissive layer may include a phosphorescent dopant. The phosphorescent dopant may have an emission in 0.5% doped PMMA (Poly(methyl methacrylate)) thin film with a peak maximum wavelength that is greater than or equal to 600 nm at room temperature. The energy of a highest occupied molecular orbital (HOMO) of the phosphorescent dopant may be lower than or equal to −5.1 eV, and the energy of the HOMO of the hole blocking layer may be at least 0.1 eV lower than the energy of the HOMO of the phosphorescent dopant. In some embodiments, the OLED may have the hole blocking layer disposed on the emissive layer.

The peak maximum wavelength of the phosphorescent dopant may be greater than or equal to 610 nm, greater than or equal to 620 nm, greater than or equal to 630 nm, greater than or equal to 650 nm, greater than or equal to 700 nm, greater than or equal to 750 nm, or greater than or equal to 800 nm.

The energy of the HOMO of the phosphorescent dopant may be lower than or equal to −5.2 eV, lower than or equal to −5.3 eV, or lower than or equal to −5.4 eV. The energy of the HOMO of the hole blocking layer may be at least 0.2 eV lower than the energy of the HOMO of the phosphorescent dopant, at least 0.3 eV lower than the energy of the HOMO of the phosphorescent dopant, or at least 0.4 eV lower than the energy of the HOMO of the phosphorescent dopant.

The hole blocking layer may include the compound of Formula I, which may be one or more of:

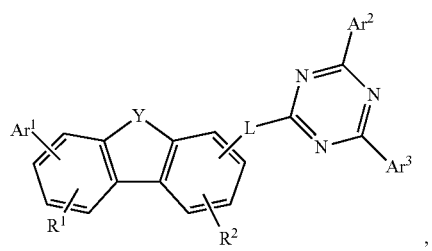

,

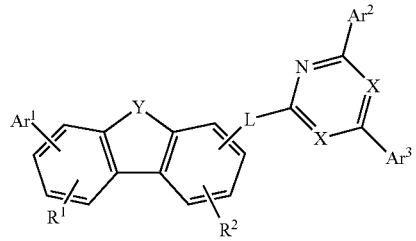

,

-continued

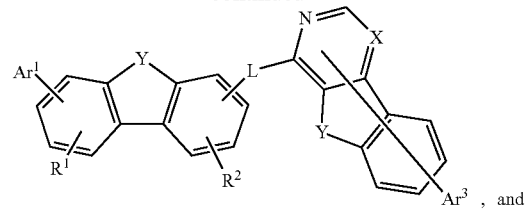

, and

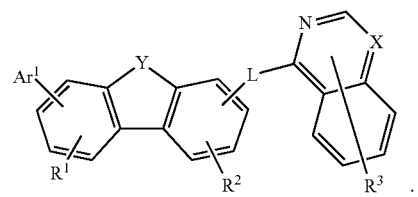

.

$R^1$ and $R^2$ each may independently represent mono to the maximum allowable substitution, or no substitution. Each $R^1$ and $R^2$ may be independently a hydrogen or deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and/or combinations thereof. Y may be O, S, Se, $NAr^4$, $CAr^4Ar^5$, $SiAr^4Ar^5$, Fluorene (C—$Ar^1Ar^2$), and/or Silicon (Si—$Ar^1Ar^2$), where $Ar^1$ and $Ar^2$ may be the same or different aryl groups. Each $Ar^1$-$Ar^5$ may be independently selected from aryl, heteroaryl, and/or a combination thereof, and L may be a direct bond or a linker comprising at least one aromatic ring. Each $R^1$ and $R^2$ may be independently a hydrogen or a substituent such as aryl, heteroaryl, and/or combinations thereof. Y may be O, S, and/or $NAr^4$. In some embodiments, the compound of Formula I may be the only compound in the hole blocking layer.

The compound of Formula I may be one or more of:

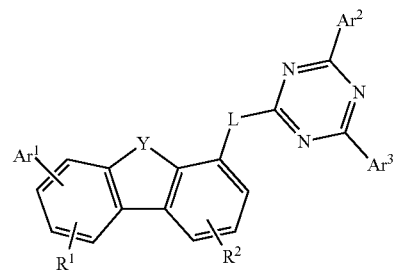

, and

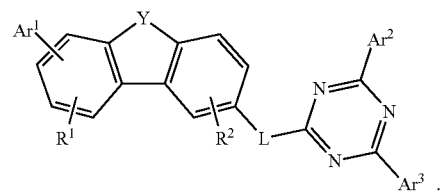

.

In some embodiments, the compound of Formula I may be one or more of:

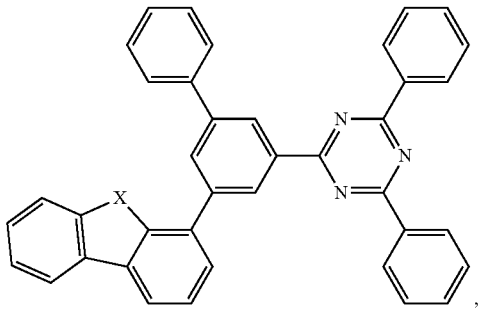

Compound A1 through A3, each represented by the formula wherein in
Compound A1: X=O,
in Compound A2: X=S,
in Compound A3: X=Se

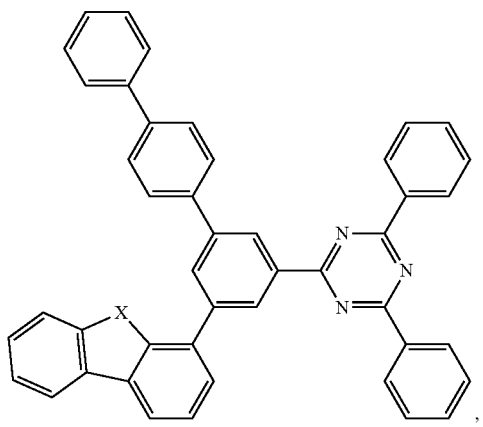

Compound A4 through A6, each represented by the formula
wherein in Compound A4: X=O,
in Compound A5: X=S,
in Compound A6: X=Se

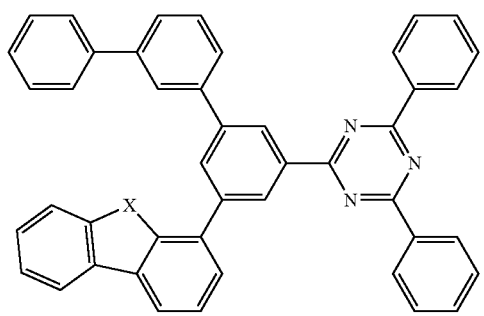

Compound A7 through A9, each represented by the formula
wherein in Compound A7: X=O,
in Compound A8: X=S,
in Compound A9: X=Se -continued

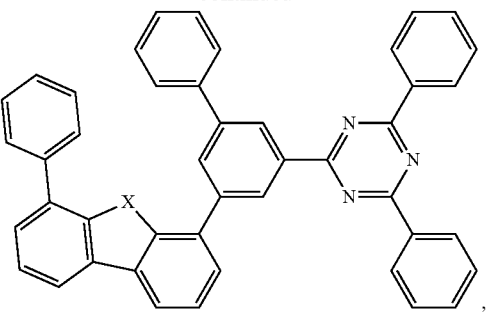

Compound A10 through A12, each represented by the formula
wherein in Compound A10: X=O,
in Compound A11: X=S,
in Compound A12: X=Se

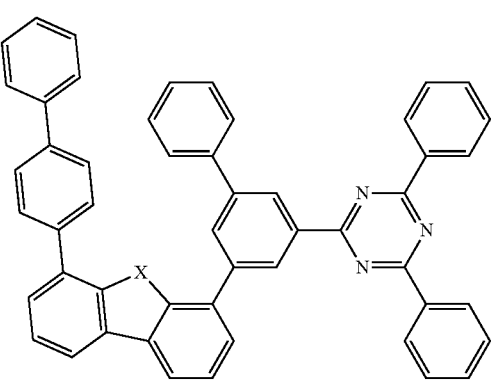

Compound A13 through A15, each represented by the formula
wherein in Compound A13: X=O,
in Compound A14: X=S,
in Compound A15: X=Se

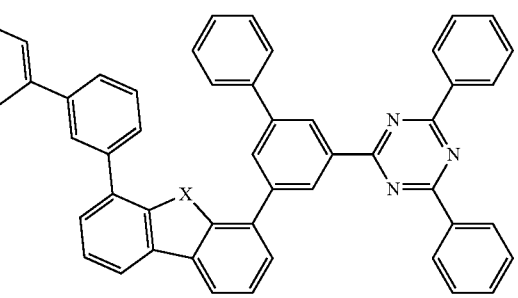

Compound A16 through A18, each represented by the formula
wherein in Compound A16: X=O,
in Compound A17: X=S,
in Compound A18: X=Se

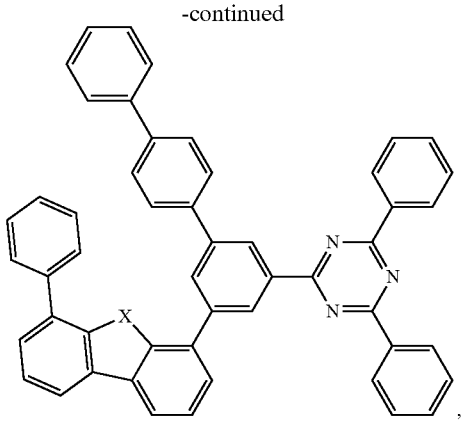

Compound A19 through A21, each represented by the formula
wherein in Compound A19: X=O,
in Compound A20: X=S,
in Compound A21: X=Se

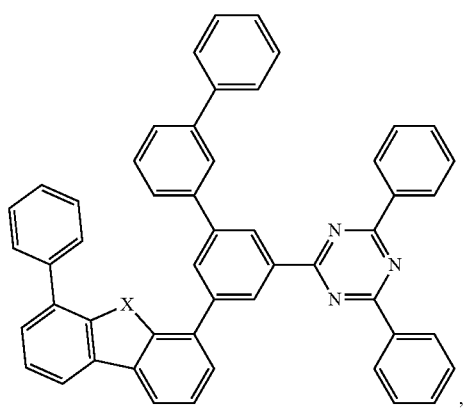

Compound A22 through A24, each represented by the formula
wherein in Compound A22: X=O,
in Compound A23: X=S,
in Compound A24: X=Se

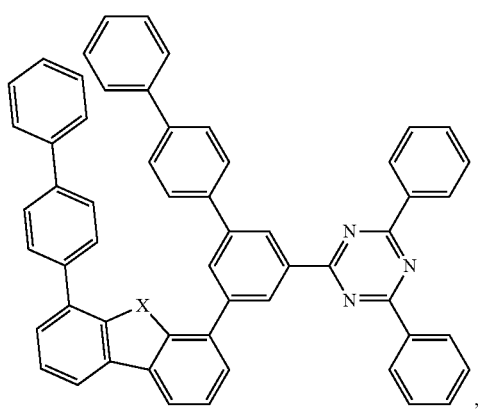

Compound A25 through A27, each represented by the formula
wherein in Compound A25: X=O,
in Compound A26: X=S,
in Compound A27: X=Se

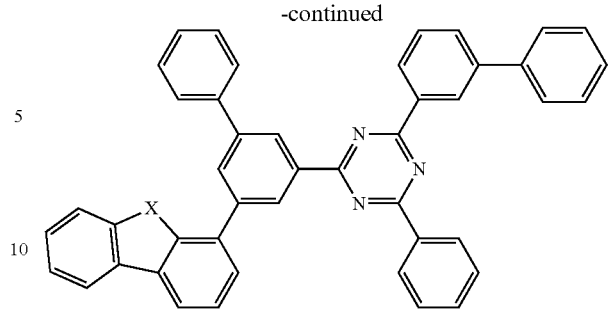

Compound A28 through A30, each represented by the formula
wherein in Compound A28: X=O,
in Compound A29: X=S,
in Compound A30: X=Se

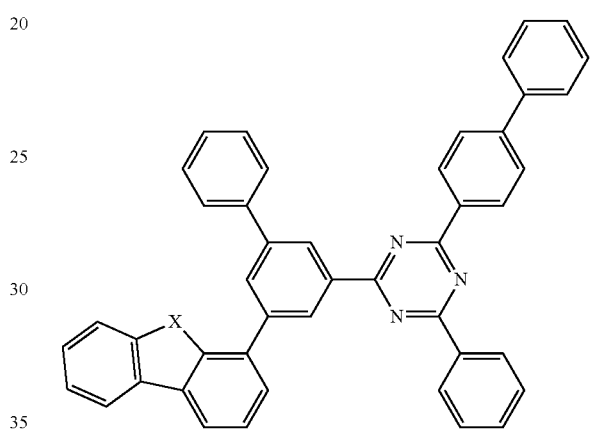

Compound A31 through A33, each represented by the formula
wherein in Compound A31: X=O,
in Compound A32: X=S,
in Compound A33: X=Se

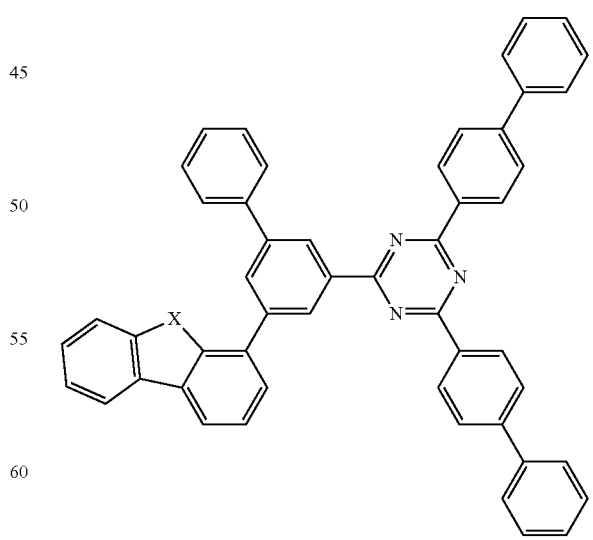

Compound A34 through A36, each represented by the formula
wherein in Compound A34: X=O,
in Compound A35: X=S,
in Compound A36: X=Se

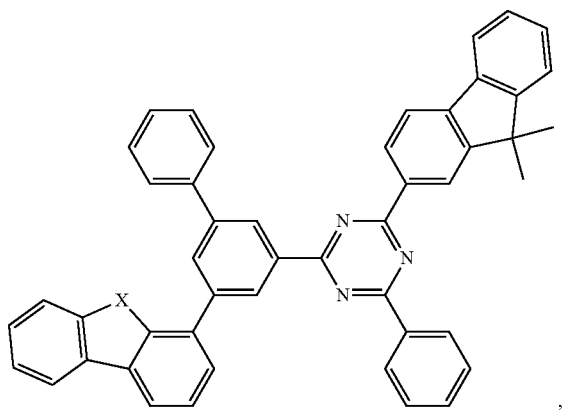

Compound A37 through A39, each represented by the formula
wherein in Compound A37: X=O,
in Compound A38: X=S,
in Compound A39: X=Se

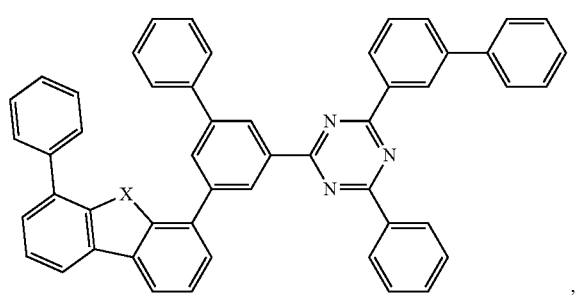

Compound A40 through A42, each represented by the formula
wherein in Compound A40: X=O,
in Compound A41: X=S,
in Compound A42: X=Se

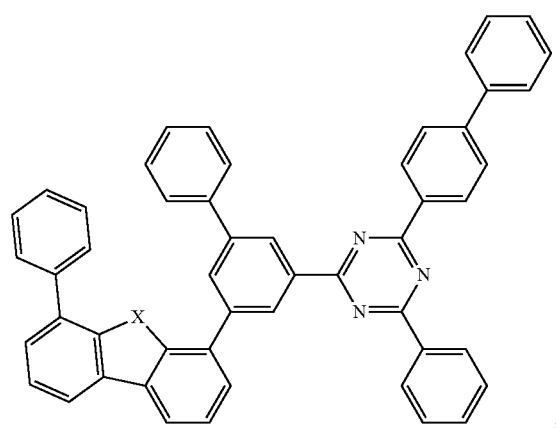

Compound A43 through A45, each represented by the formula
wherein in Compound A43: X=O,
in Compound A44: X=S,
in Compound A45: X=Se

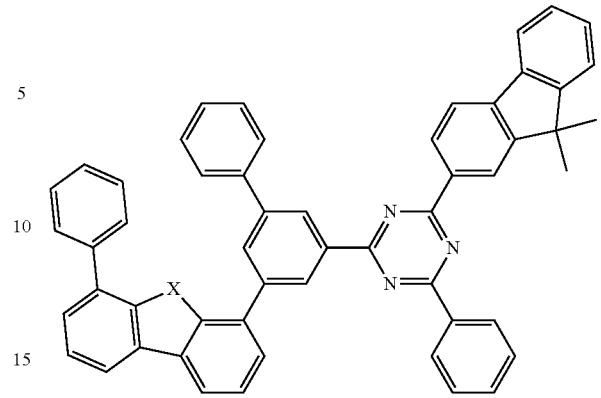

Compound A46 through A48, each represented by the formula
wherein in Compound A46: X=O,
in Compound A47: X=S,
in Compound A48: X=Se

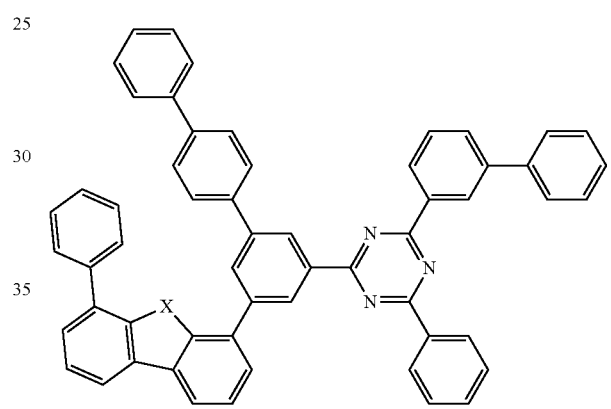

Compound A49 through A51, each represented by the formula
wherein in Compound A49: X=O,
in Compound A50: X=S,
in Compound A51: X=Se

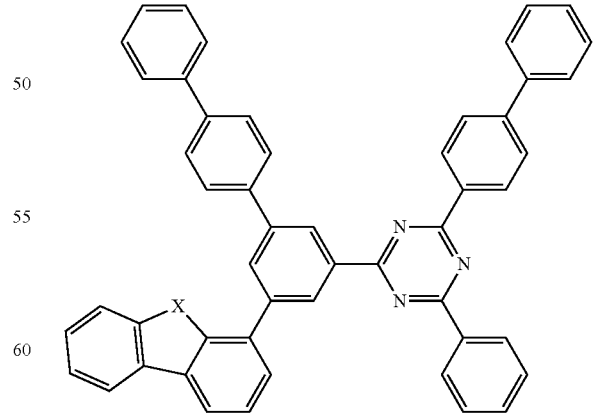

Compound A52 through A54, each represented by the formula
wherein in Compound A52: X=O,
in Compound A53: X=S,
in Compound A54: X=Se -continued

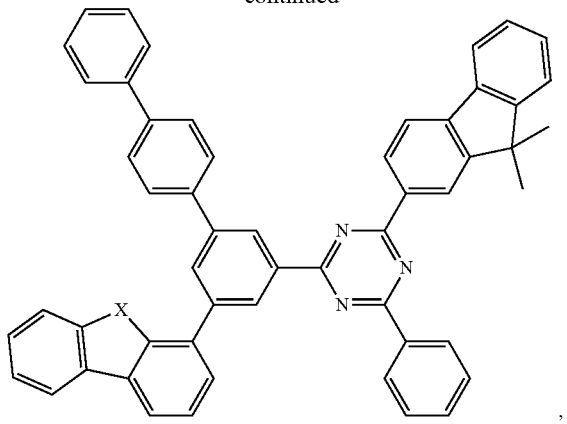

Compound A55 through A57, each represented by the formula
wherein in Compound A55: X=O,
in Compound A56: X=S,
in Compound A57: X=Se

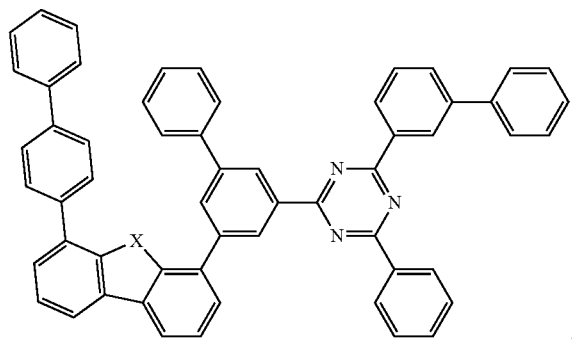

Compound A58 through A60, each represented by the formula
wherein in Compound A58: X=O,
in Compound A59: X=S,
in Compound A60: X=Se

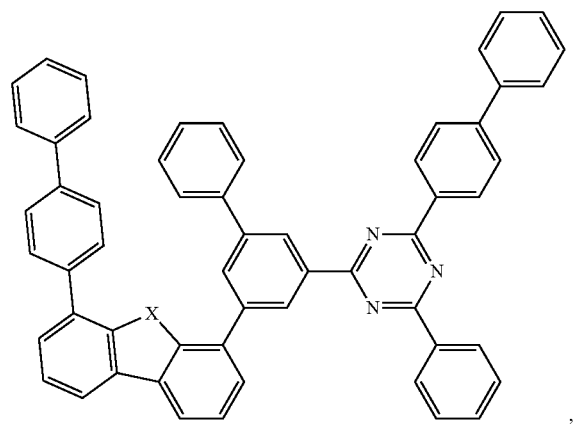

Compound A61 through A63, each represented by the formula
wherein in Compound A61: X=O,
in Compound A62: X=S,
in Compound A63: X=Se -continued

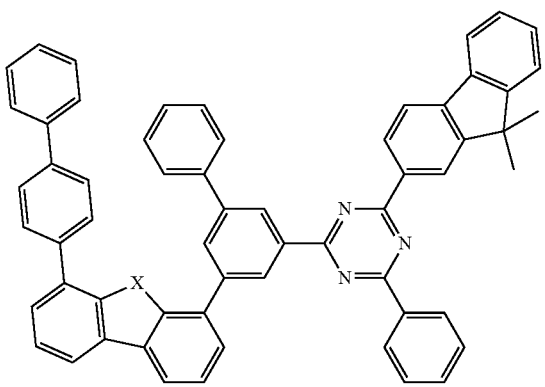

Compound A64 through A66, each represented by the formula
wherein in Compound A64: X=O,
in Compound A65: X=S,
in Compound A66: X=Se

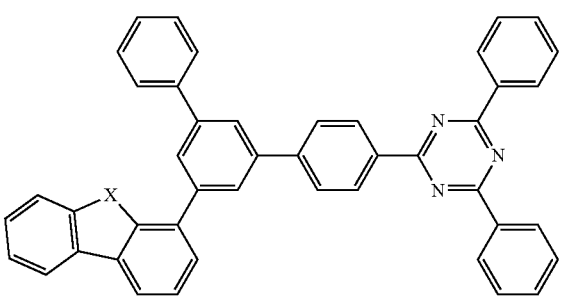

Compound A67 through A69, each represented by the formula
wherein in Compound A67: X=O,
in Compound A68: X=S,
in Compound A69: X=Se

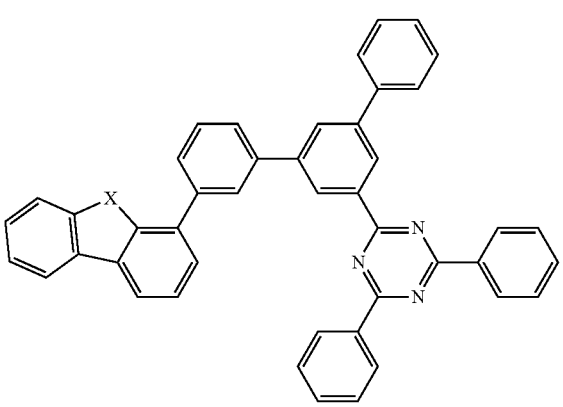

Compound A70 through A72, each represented by the formula
wherein in Compound A70: X=O,
in Compound A71: X=S,
in Compound A72: X=Se

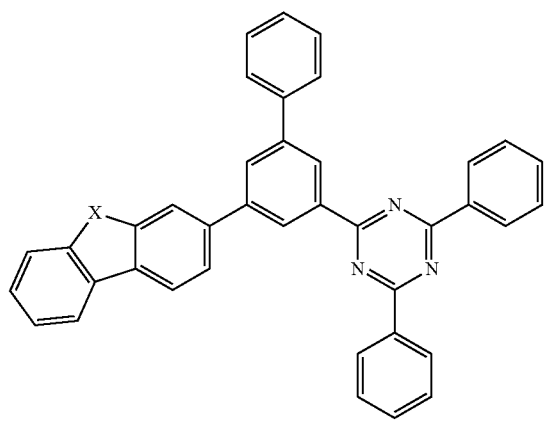

Compound A73 through A75, each represented by the formula
wherein in Compound A73: X=O,
in Compound A74: X=S,
in Compound A75: X=Se

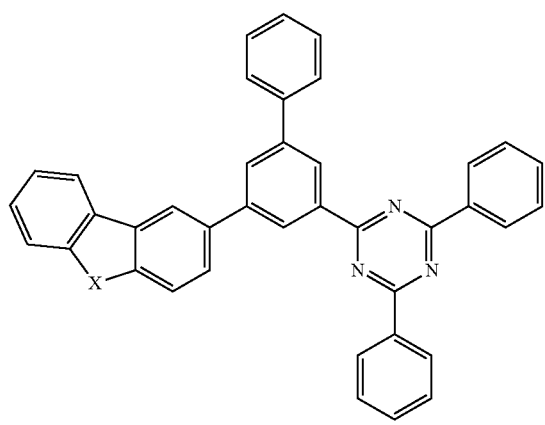

Compound A76 through A78, each represented by the formula
wherein in Compound A76: X=O,
in Compound A77: X=S,
in Compound A78: X=Se

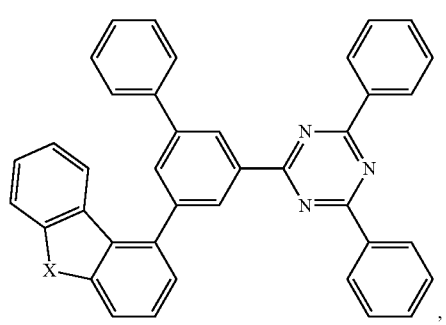

Compound A79 through A81, each represented by the formula
wherein in Compound A79: X=O,
in Compound A80: X=S,
in Compound A81: X=Se

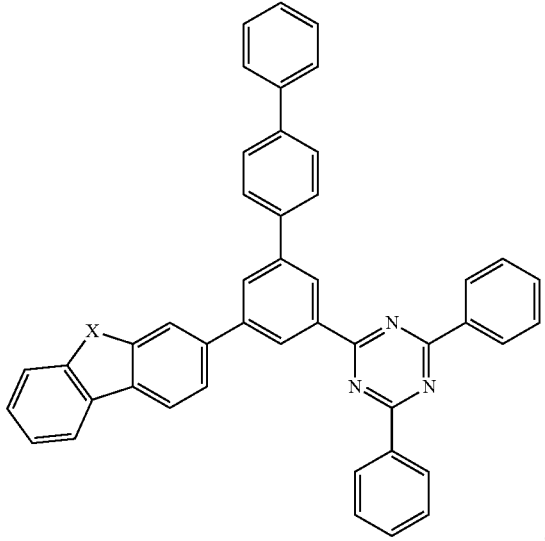

Compound A82 through A84, each represented by the formula
wherein in Compound A82: X=O,
in Compound A83: X=S,
in Compound A84: X=Se

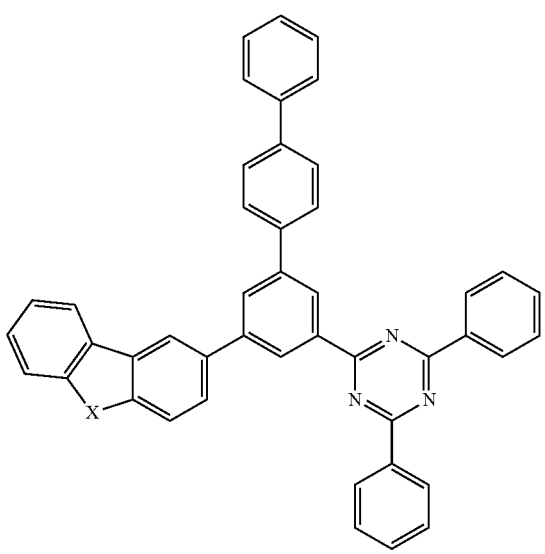

Compound A85 through A87, each represented by the formula
wherein in Compound A85: X=O,
in Compound A86: X=S,
in Compound A87: X=Se

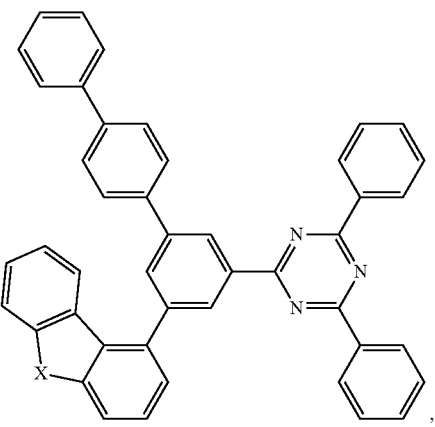

Compound A88 through A90, each represented by the formula
wherein in Compound A88: X=O,
in Compound A89: X=S,
in Compound A90: X=Se

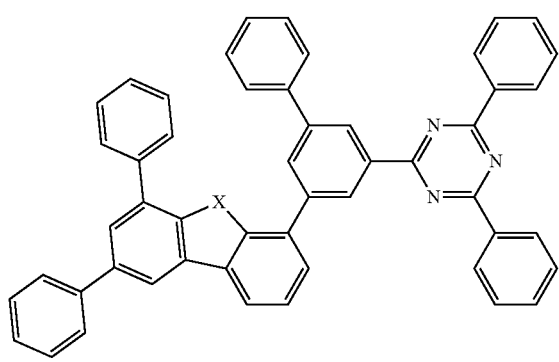

Compound A91 through A93, each represented by the formula
wherein in Compound A91: X=O,
in Compound A92: X=S,
in Compound A93: X=Se

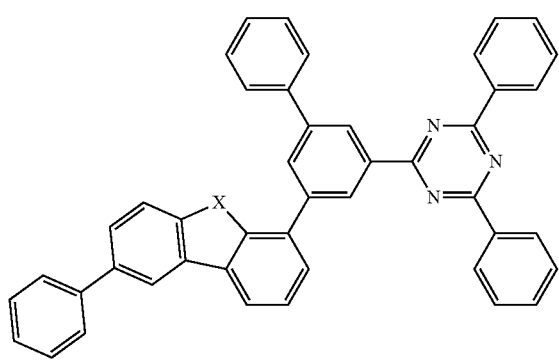

Compound A94 through A96, each represented by the formula
wherein in Compound A94: X=O,
in Compound A95: X=S,
in Compound A96: X=Se

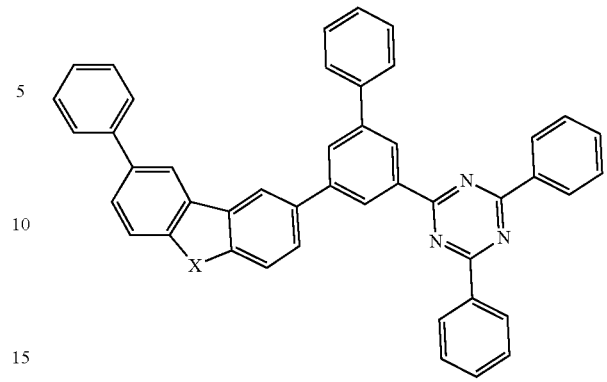

Compound A97 through A99, each represented by the formula
wherein in Compound A97: X=O,
in Compound A98: X=S,
in Compound A99: X=Se

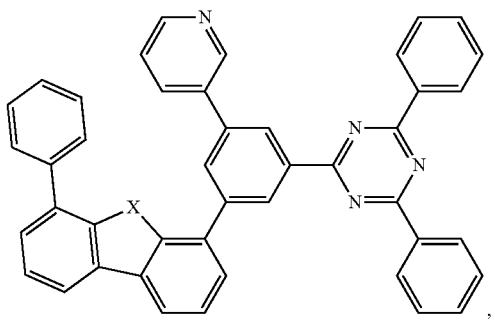

Compound A100 through A102, each represented by the formula
wherein in Compound A100: X=O,
in Compound A101: X=S,
in Compound A102: X=Se

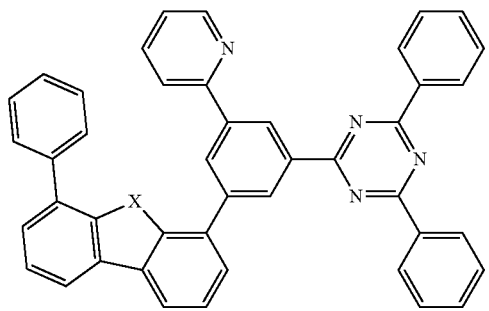

Compound A103 through A105, each represented by the formula
wherein in Compound A103: X=O,
in Compound A104: X=S,
in Compound A105: X=Se

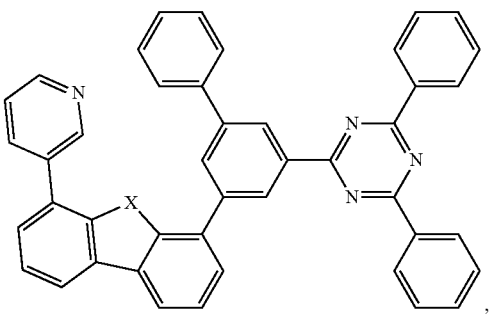

Compound A106 through A108, each represented by the formula
wherein in Compound A106: X=O,
in Compound A107: X=S,
in Compound A108: X=Se

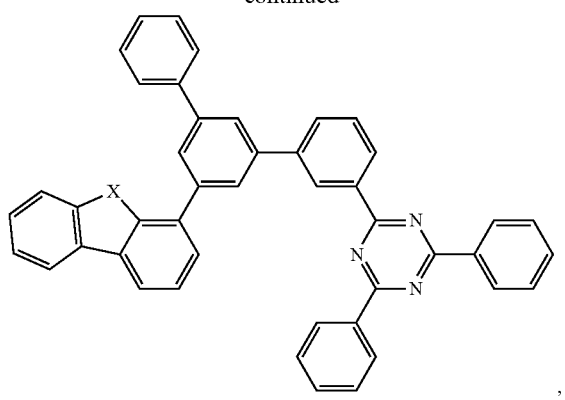

Compound A109 through A111, each represented by the formula
wherein in Compound A109: X=O,
in Compound A110: X=S,
in Compound A111: X=Se

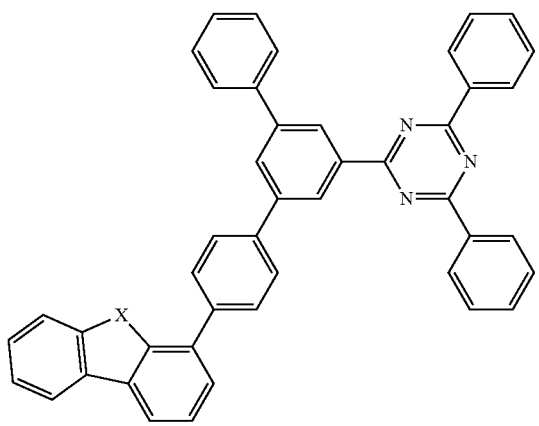

Compound A112 through A114, each represented by the formula
wherein in Compound A112: X=O,
in Compound A113: X=S,
in Compound A114: X=Se

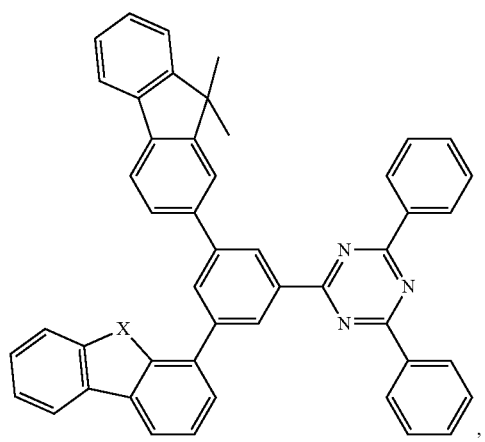

Compound A115 through A117, each represented by the formula
wherein in Compound A115: X=O,
in Compound A116: X=S,
in Compound A117: X=Se Compound B1

Compound B2

Compound B3

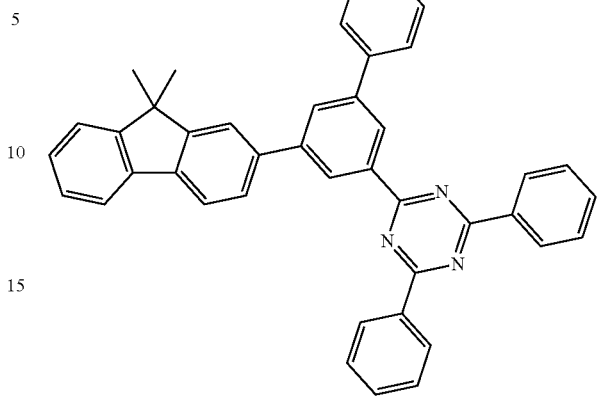

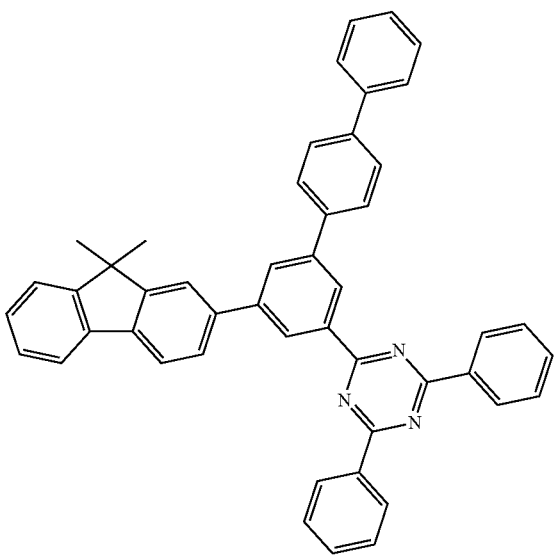

Compound B4
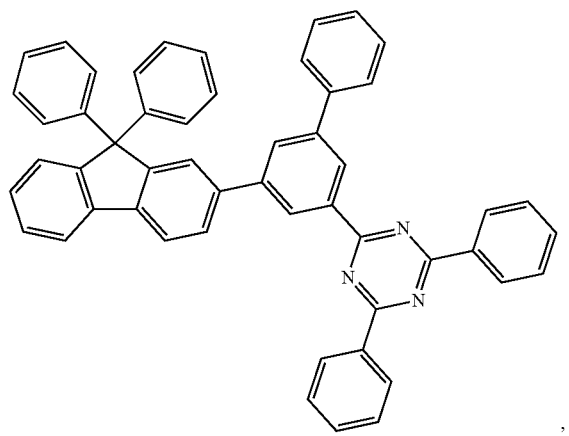
Compound B5
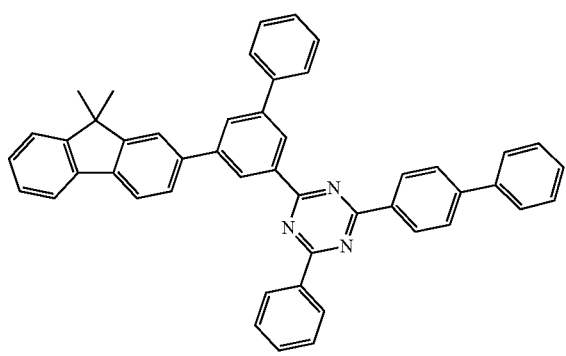
Compound B6
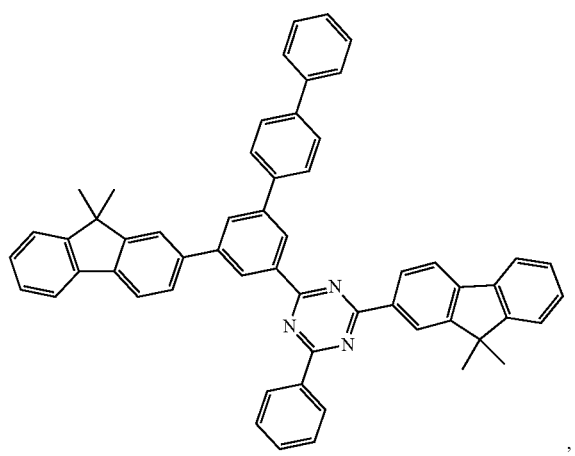
Compound B7
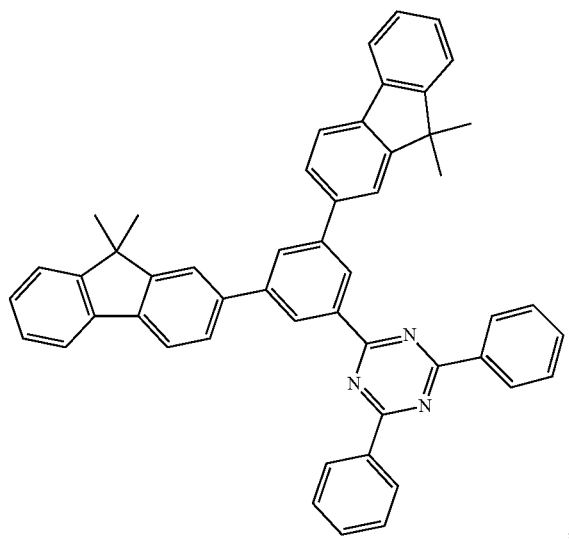
Compound B8
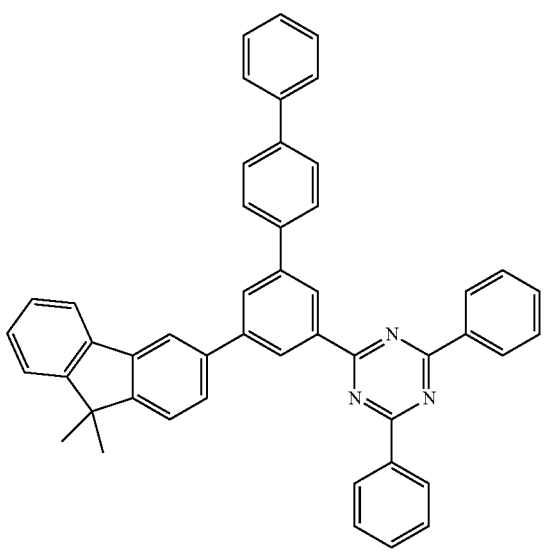
Compound C1 through C3, each represented by the formula
wherein in Compound C1: X=O,
in Compound C2: X=S,
in Compound C3: X=Se

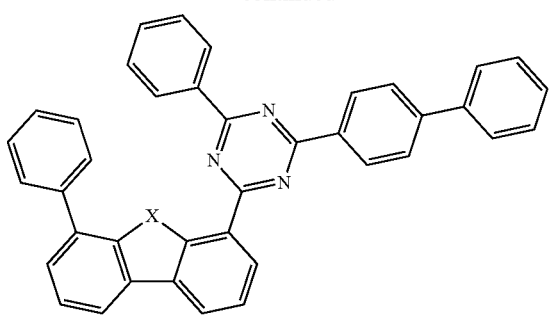

Compound C4 through C6, each represented by the formula
wherein in Compound C4: X=O,
in Compound C5: X=S,
in Compound C6: X=Se

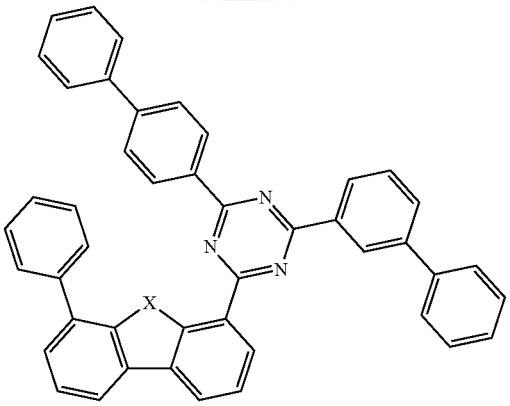

Compound C13 through C15, each represented by the formula
wherein in Compound C13: X=O,
in Compound C14: X=S,
in Compound C15: X=Se

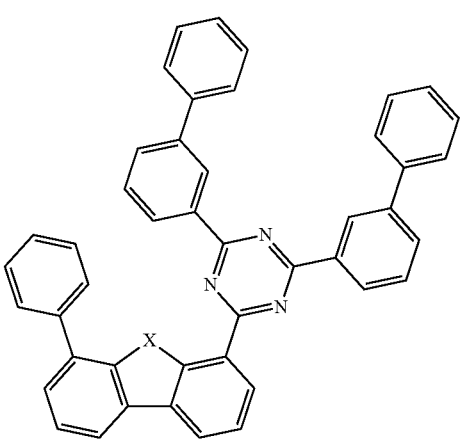

Compound C7 through C9, each represented by the formula
wherein in Compound C7: X=O,
in Compound C8: X=S,
in Compound C9: X=Se

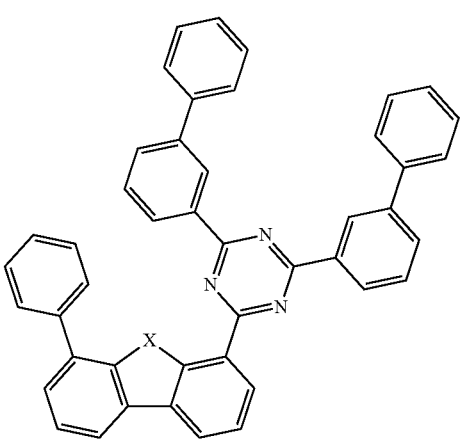

Compound C16 through C18, each represented by the formula
wherein in Compound C16: X=O,
in Compound C17: X=S,
in Compound C18: X=Se

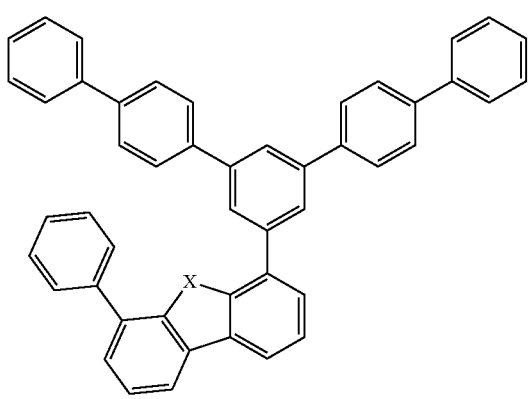

Compound C10 through C12, each represented by the formula
wherein in Compound C10: X=O,
in Compound C11: X=S,
in Compound C12: X=Se

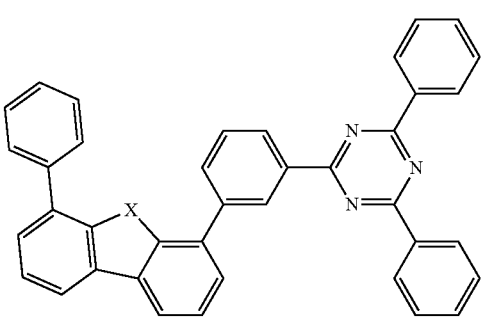

Compound C19 through C21, each represented by the formula
wherein in Compound C19: X=O,
in Compound C20: X=S,
in Compound C21: X=Se

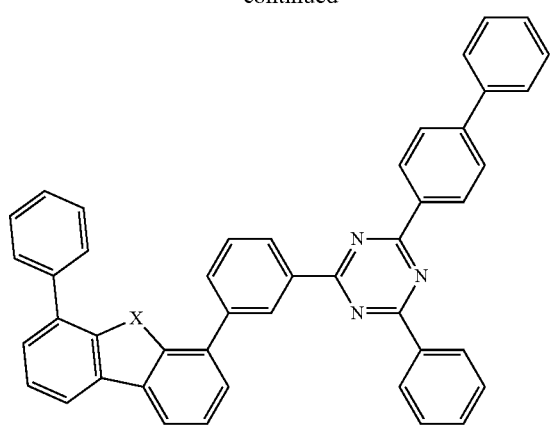

Compound C22 through C24, each represented by the formula
wherein in Compound C22: X=O,
in Compound C23: X=S,
in Compound C24: X=Se

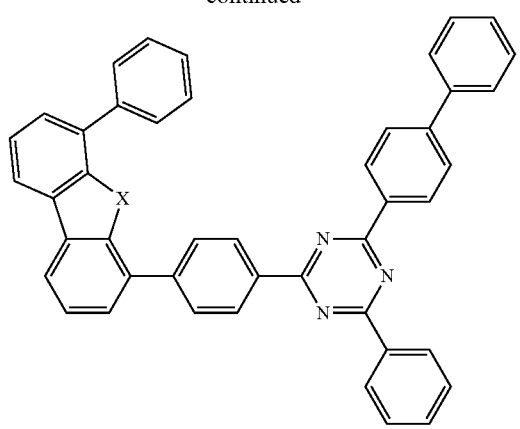

Compound C31 through C33, each represented by the formula
wherein in Compound C31: X=O,
in Compound C32: X=S,
in Compound C33: X=Se

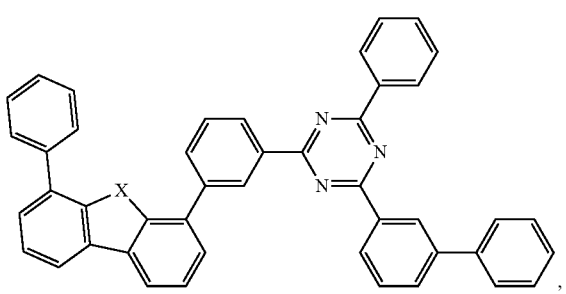

Compound C25 through C27, each represented by the formula
wherein in Compound C25: X=O,
in Compound C26: X=S,
in Compound C27: X=Se

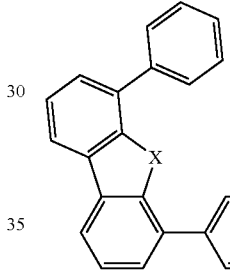

Compound C34 through C36, each represented by the formula
wherein in Compound C34: X=O,
in Compound C35: X=S,
in Compound C36: X=Se

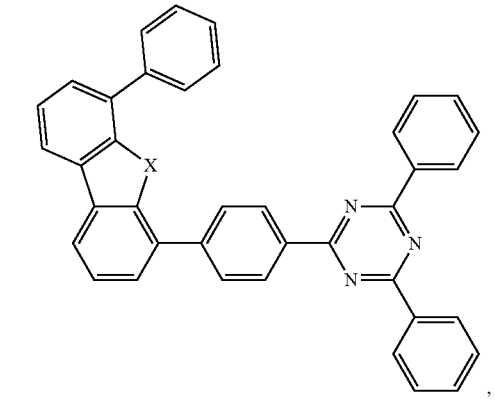

Compound C28 through C30, each represented by the formula
wherein in Compound C28: X=O,
in Compound C29: X=S,
in Compound C30: X=Se

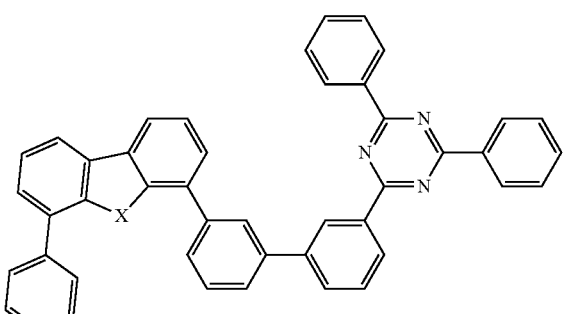

Compound C37 through C39, each represented by the formula
wherein in Compound C37: X=O,
in Compound C38: X=S,
in Compound C39: X=Se

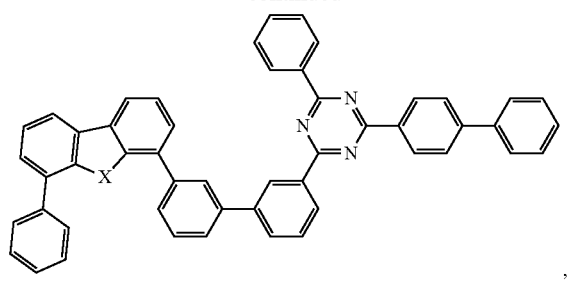

Compound C40 through C42, each represented by the formula
wherein in Compound C40: X=O,
in Compound C41: X=S,
in Compound C42: X=Se

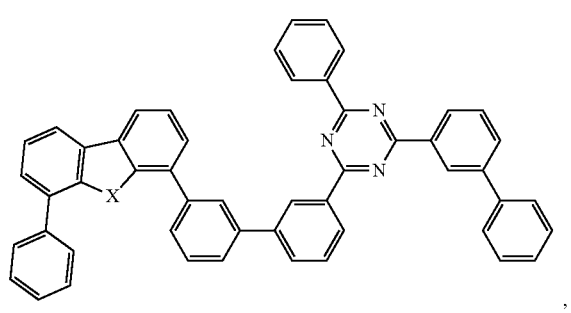

Compound C43 through C45, each represented by the formula
wherein in Compound C43: X=O,
in Compound C44: X=S,
in Compound C45: X=Se

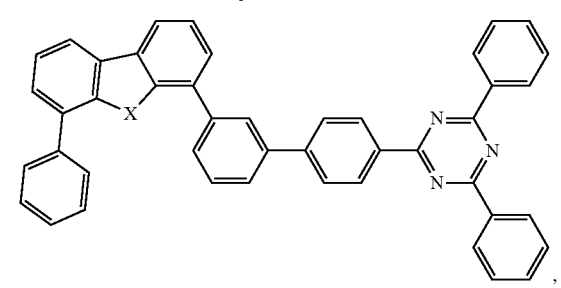

Compound C46 through C48, each represented by the formula
wherein in Compound C46: X=O,
in Compound C47: X=S,
in Compound C48: X=Se

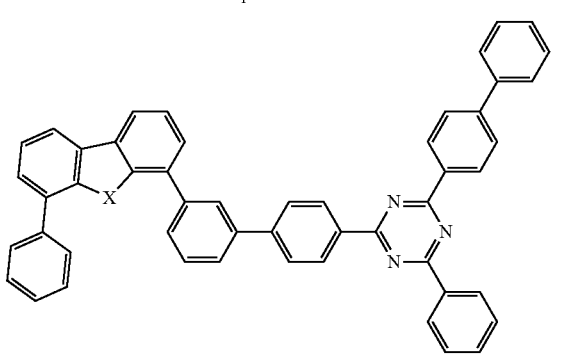

Compound C49 through C51, each represented by the formula
wherein in Compound C49: X=O,
in Compound C50: X=S,
in Compound C51: X=Se

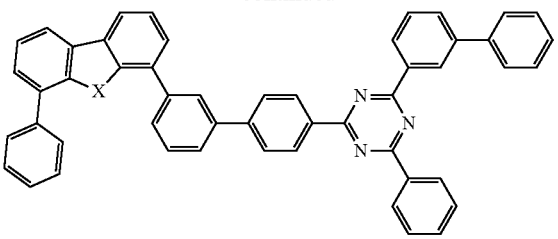

Compound C52 through C54, each represented by the formula
wherein in Compound C52: X=O,
in Compound C53: X=S,
in Compound C54: X=Se

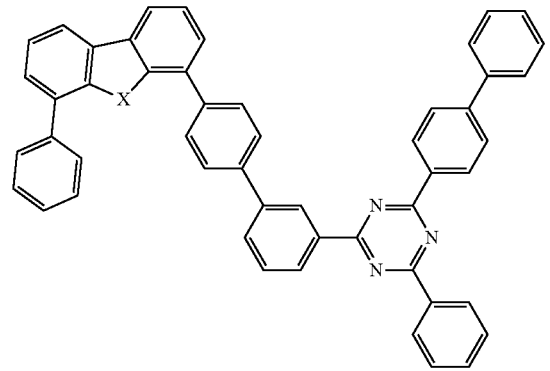

Compound C55 through C57, each represented by the formula
wherein in Compound C55: X=O,
in Compound C56: X=S,
in Compound C57: X=Se Compound C58 through C60, each represented by the formula
wherein in Compound C58: X=O,
in Compound C59: X=S,
in Compound C60: X=Se -continued

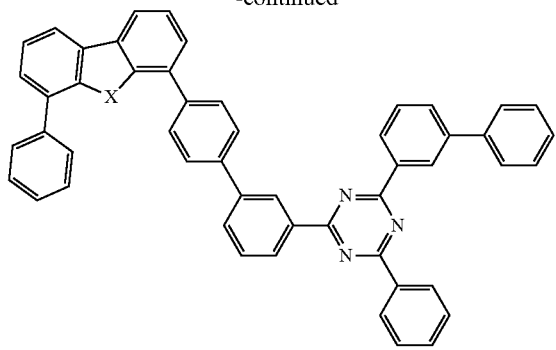

Compound C61 through C63, each represented by the formula
wherein in Compound C61: X=O,
in Compound C62: X=S,
in Compound C63: X=Se

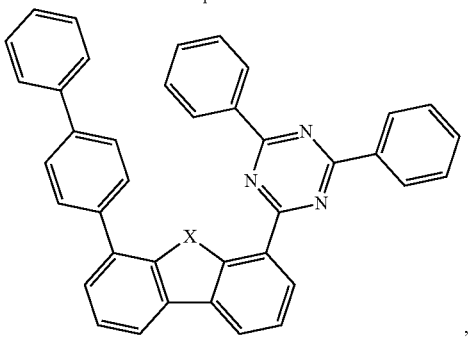

Compound C64 through C66, each represented by the formula
wherein in Compound C64: X=O,
in Compound C65: X=S,
in Compound C66: X=Se

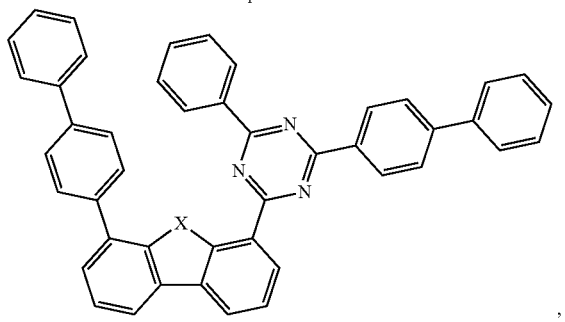

Compound C67 through C69, each represented by the formula
wherein in Compound C67: X=O,
in Compound C68: X=S,
in Compound C69: X=Se

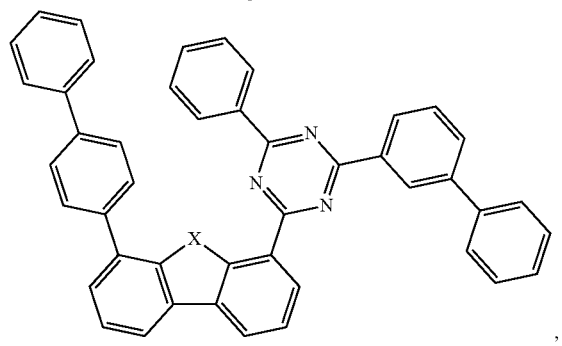

Compound C70 through C72, each represented by the formula
wherein in Compound C70: X=O,
in Compound C71: X=S,
in Compound C72: X=Se -continued

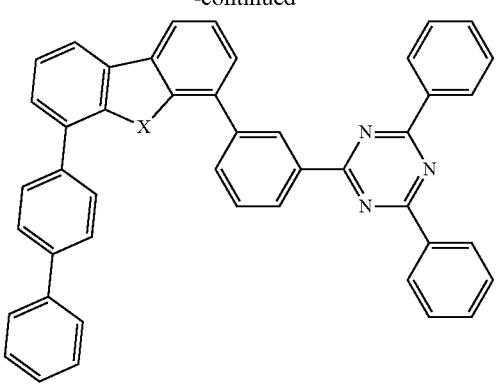

Compound C73 through C75, each represented by the formula
wherein in Compound C73: X=O,
in Compound C74: X=S,
in Compound C75: X=Se

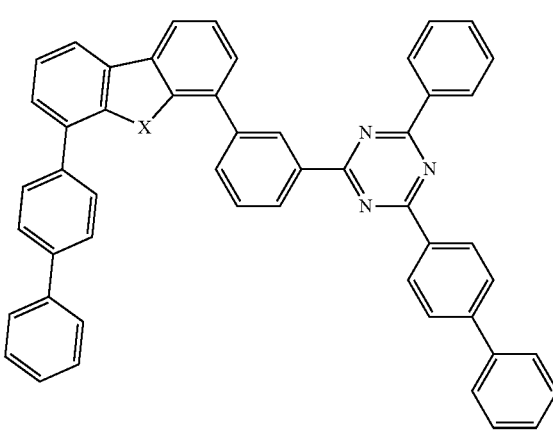

Compound C76 through C78, each represented by the formula
wherein in Compound C76: X=O,
in Compound C77: X=S,
in Compound C78: X=Se

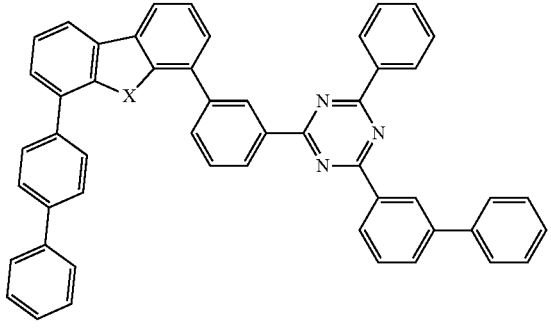

Compound C79 through C81, each represented by the formula
wherein in Compound C79: X=O,
in Compound C80: X=S,
in Compound C81: X=Se

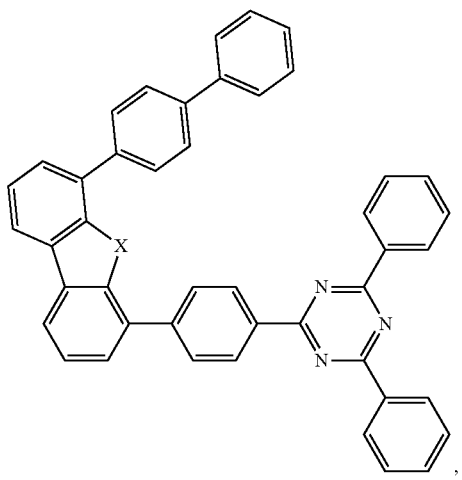

Compound C82 through C84, each represented by the formula
wherein in Compound C82: X=O,
in Compound C83: X=S,
in Compound C84: X=Se

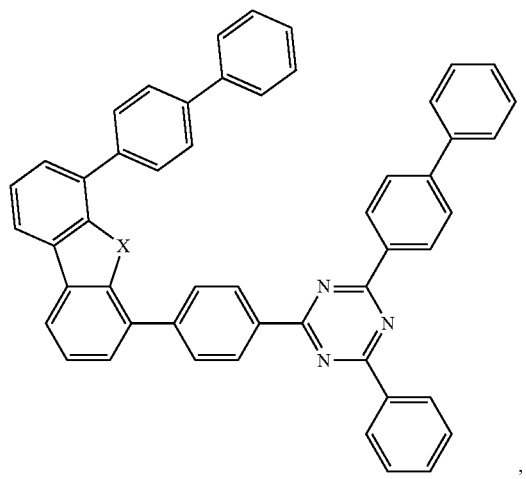

Compound C85 through C87, each represented by the formula
wherein in Compound C85: X=O,
in Compound C86: X=S,
in Compound C87: X=Se

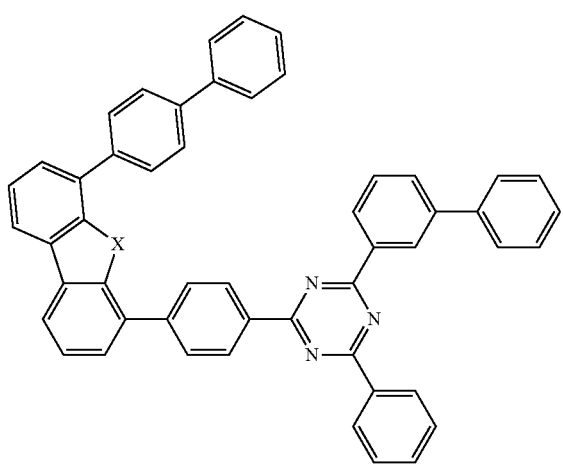

Compound C88 through C90, each represented by the formula
wherein in Compound C88: X=O,
in Compound C89: X=S,
in Compound C90: X=Se

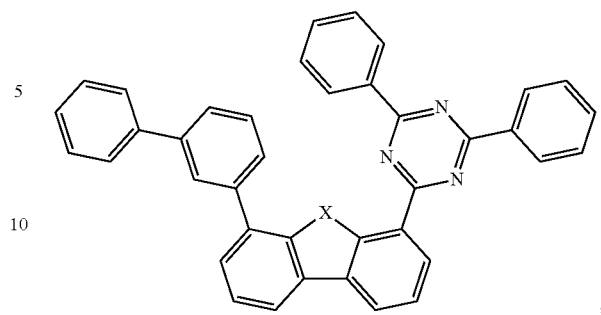

Compound C91 through C93, each represented by the formula
wherein in Compound C91: X=O,
in Compound C92: X=S,
in Compound C93: X=Se

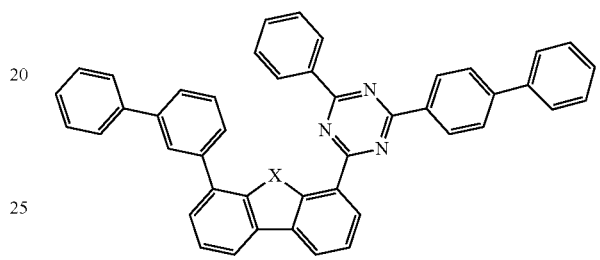

Compound C94 through C96, each represented by the formula
wherein in Compound C94: X=O,
in Compound C95: X=S,
in Compound C96: X=Se

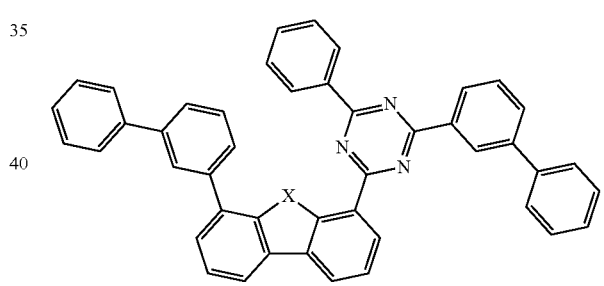

Compound C97 through C99, each represented by the formula
wherein in Compound C97: X=O,
in Compound C98: X=S,
in Compound C99: X=Se

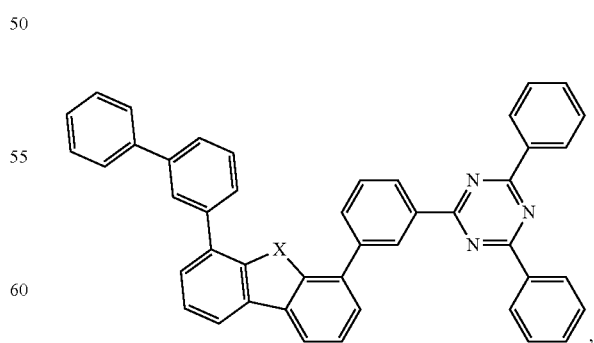

Compound C100 through C102, each represented by the formula
wherein in Compound C100: X=O,
in Compound C101: X=S,
in Compound C102: X=Se

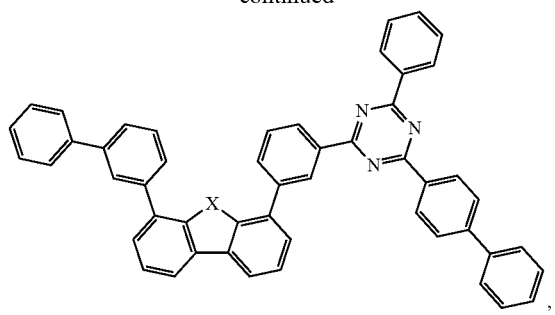

Compound C103 through C105, each represented by the formula
wherein in Compound C103: X=O,
in Compound C104: X=S,
in Compound C105: X=Se

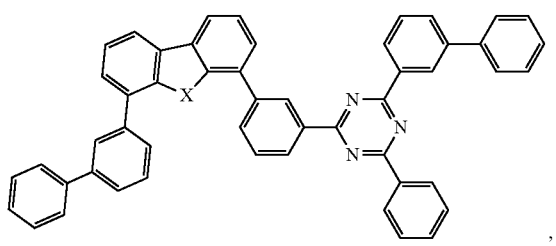

Compound C106 through C108, each represented by the formula
wherein in Compound C106: X=O,
in Compound C107: X=S,
in Compound C108: X=Se

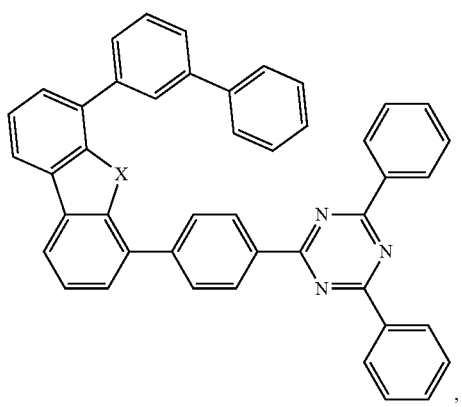

Compound C109 through C111, each represented by the formula
wherein in Compound C109: X=O,
in Compound C110: X=S,
in Compound C111: X=Se

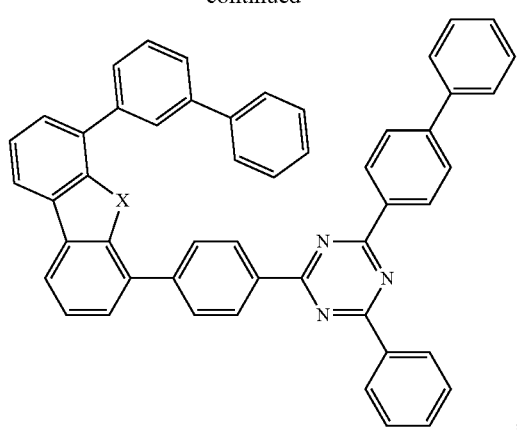

Compound C112 through C114, each represented by the formula
wherein in Compound C112: X=O,
in Compound C113: X=S,
in Compound C114: X=Se

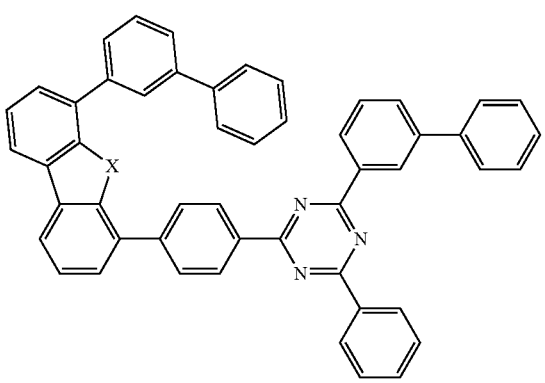

Compound C115 through C117, each represented by the formula
wherein in Compound C115: X=O,
in Compound C116: X=S,
in Compound C117: X=Se

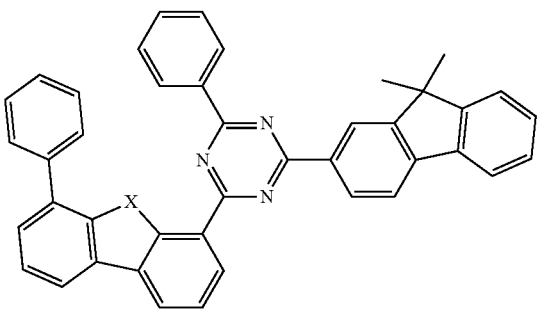

Compound C118 through C120, each represented by the formula
wherein in Compound C118: X=O,
in Compound C119: X=S,
in Compound C120: X=Se -continued

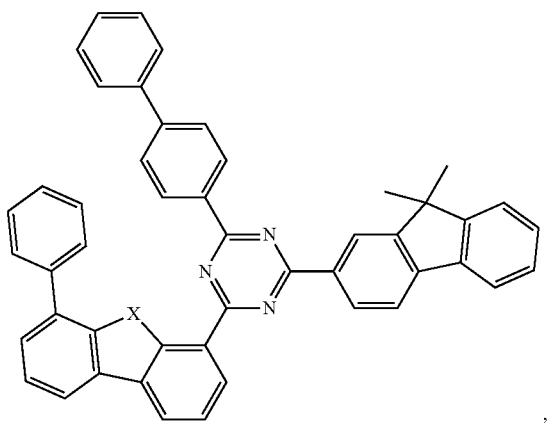

Compound C121 through C123, each represented by the formula
wherein in Compound C121: X=O,
in Compound C122: X=S,
in Compound C123: X=Se

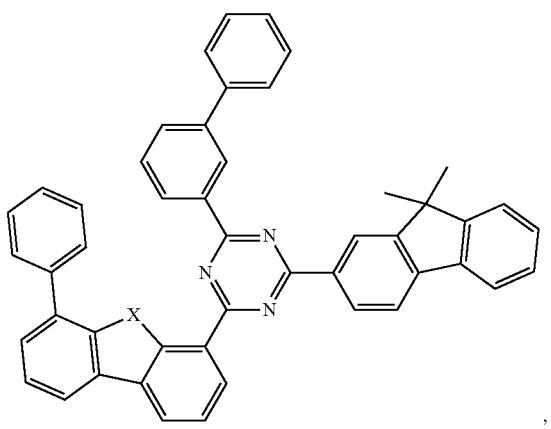

Compound C124 through C126, each represented by the formula
wherein in Compound C124: X=O,
in Compound C125: X=S,
in Compound C126: X=Se

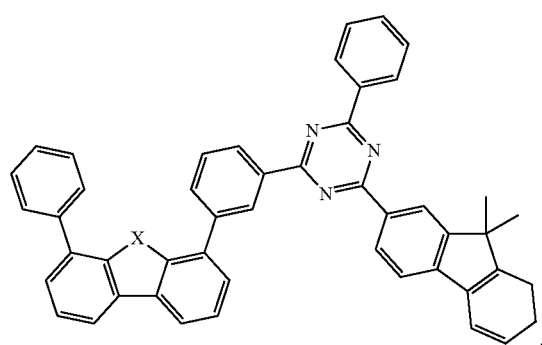

Compound C127 through C129, each represented by the formula
wherein in Compound C127: X=O,
in Compound C128: X=S,
in Compound C129: X=Se -continued

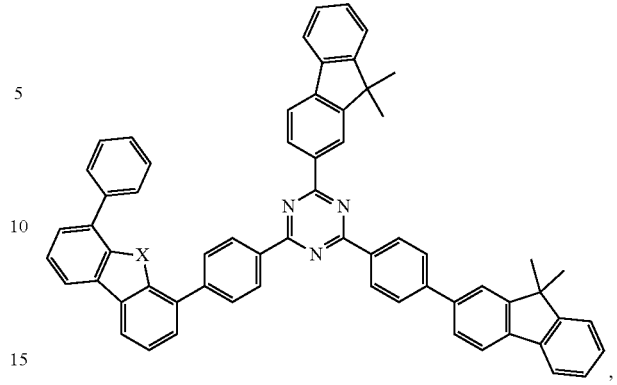

Compound C130 through C132, each represented by the formula
wherein in Compound C130: X=O,
in Compound C131: X=S,
in Compound C132: X=Se

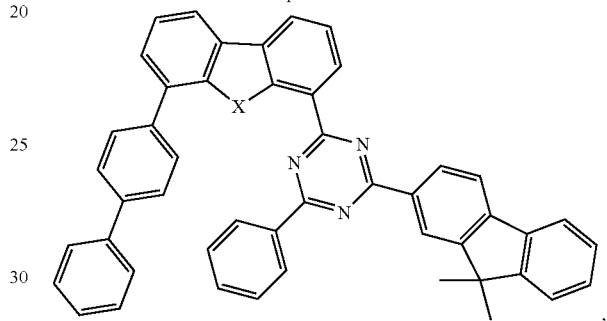

Compound C133 through C135, each represented by the formula
wherein in Compound C133: X=O,
in Compound C134: X=S,
in Compound C135: X=Se

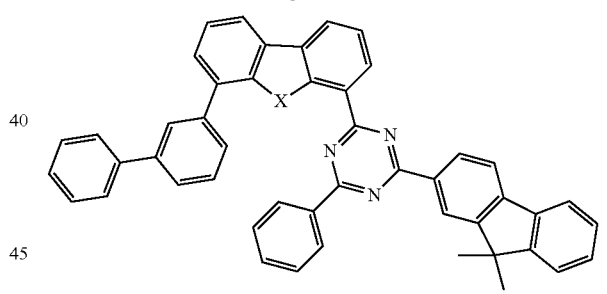

Compound C136 through C138, each represented by the formula
wherein in Compound C136: X=O,
in Compound C137: X=S,
in Compound C138: X=Se

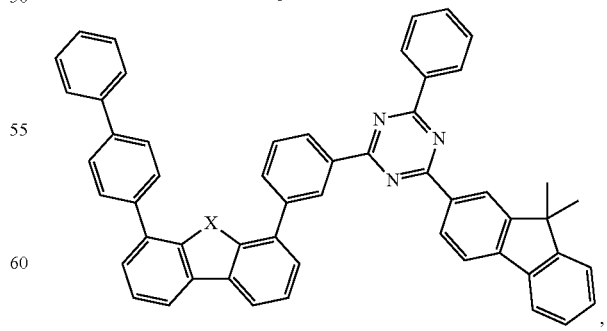

Compound C139 through C141, each represented by the formula
wherein in Compound C139: X=O,
in Compound C140: X=S,
in Compound C141: X=Se

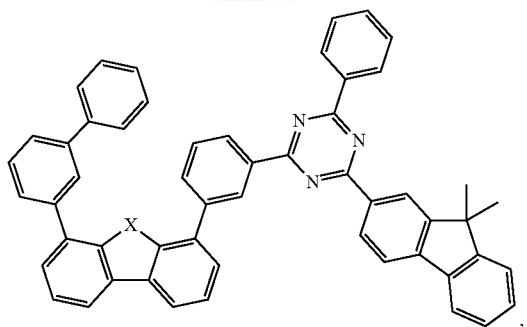

Compound C142 through C144, each represented by the formula
wherein in Compound C142: X=O,
in Compound C143: X=S,
in Compound C144: X=Se

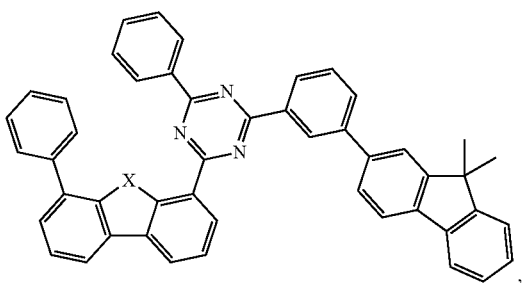

Compound C145 through C147, each represented by the formula
wherein in Compound C145: X=O,
in Compound C146: X=S,
in Compound C147: X=Se

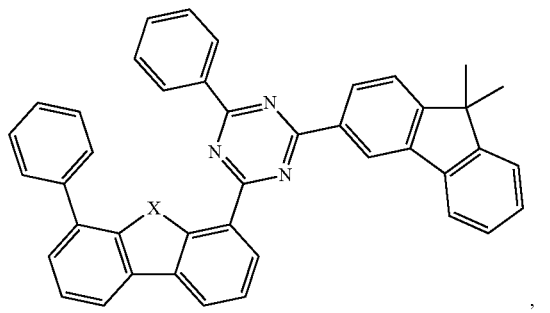

Compound C148 through C150, each represented by the formula
wherein in Compound C148: X=O,
in Compound C149: X=S,
in Compound C150: X=Se

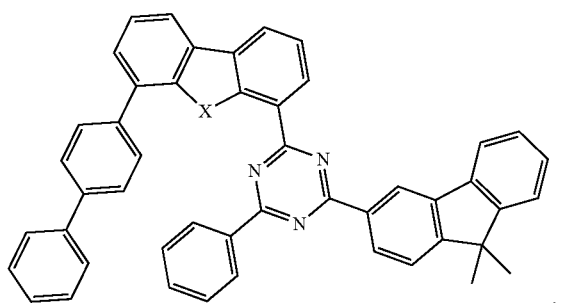

Compound C151 through C153, each represented by the formula
wherein in Compound C151: X=O,
in Compound C152: X=S,
in Compound C153: X=Se

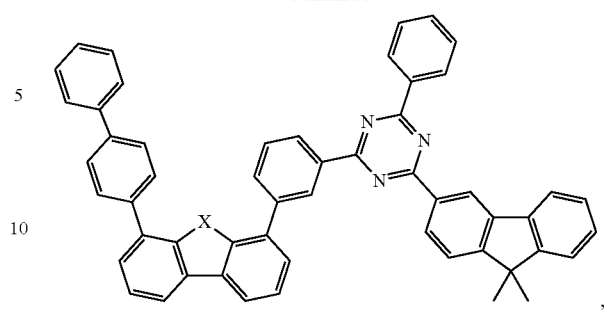

Compound C154 through C156, each represented by the formula
wherein in Compound C154: X=O,
in Compound C155: X=S,
in Compound C156: X=Se

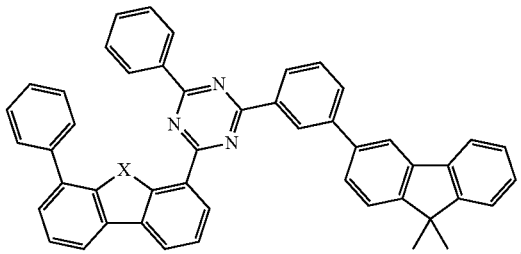

Compound C157 through C159, each represented by the formula
wherein in Compound C157: X=O,
in Compound C158: X=S,
in Compound C159: X=Se

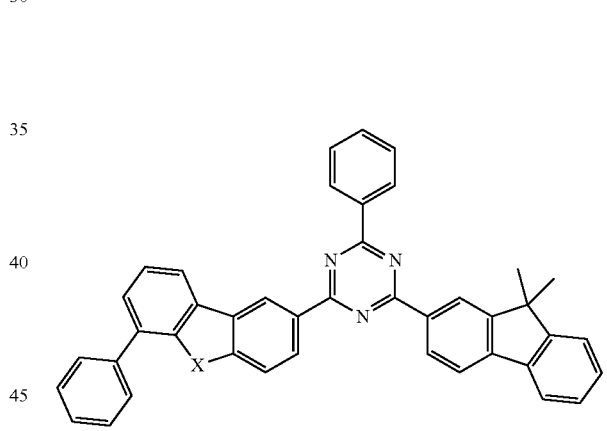

Compound C160 through C162, each represented by the formula
wherein in Compound C160: X=O,
in Compound C161: X=S,
in Compound C162: X=Se

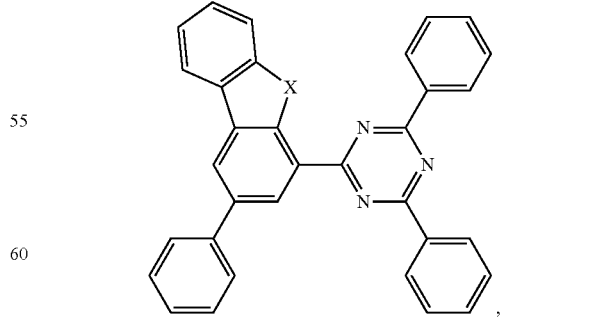

Compound C163 through C165, each represented by the formula
wherein in Compound C163: X=O,
in Compound C164: X=S,
in Compound C165: X=Se -continued

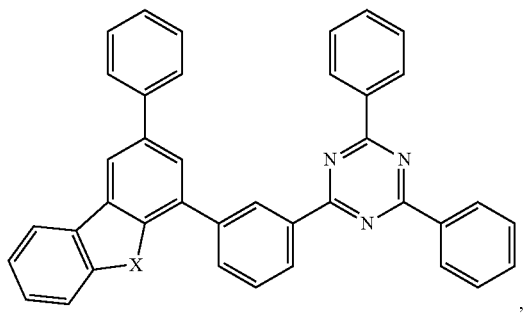

Compound C166 through C168, each represented by the formula
wherein in Compound C166: X=O,
in Compound C167: X=S,
in Compound C168: X=Se

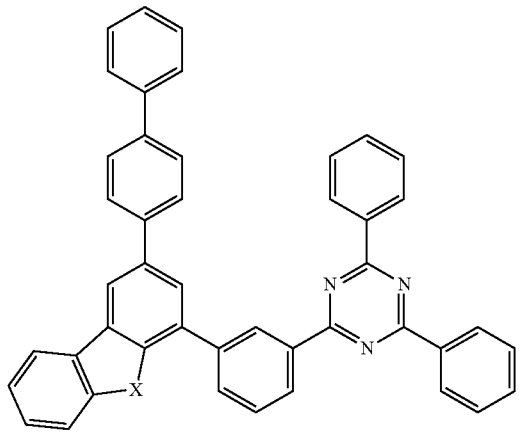

Compound C169 through C171, each represented by the formula
wherein in Compound C169: X=O,
in Compound C170: X=S,
in Compound C171: X=Se

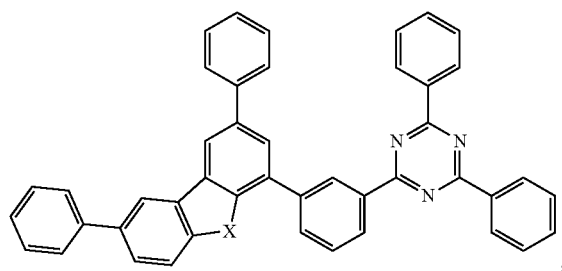

Compound C172 through C174, each represented by the formula
wherein in Compound C172: X=O,
in Compound C173: X=S,
in Compound C174: X=Se

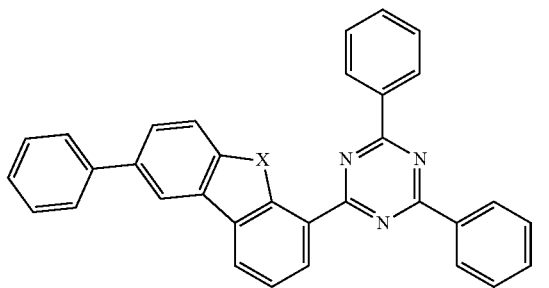

Compound C175 through C177, each represented by the formula
wherein in Compound C175: X=O,
in Compound C176: X=S,
in Compound C177: X=Se -continued

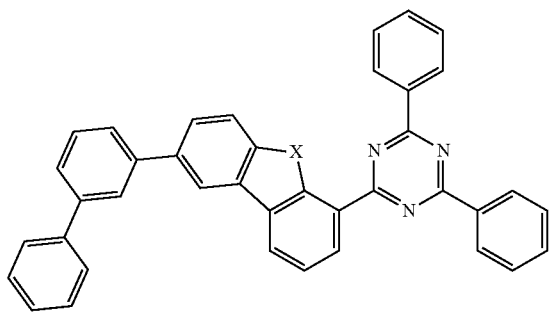

Compound C178 through C180, each represented by the formula
wherein in Compound C178: X=O,
in Compound C179: X=S,
in Compound C180: X=Se

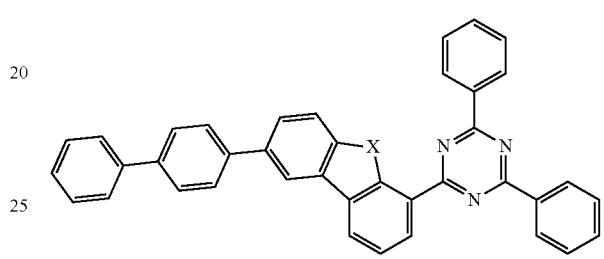

Compound C181 through C183, each represented by the formula
wherein in Compound C181: X=O,
in Compound C182: X=S,
in Compound C183: X=Se

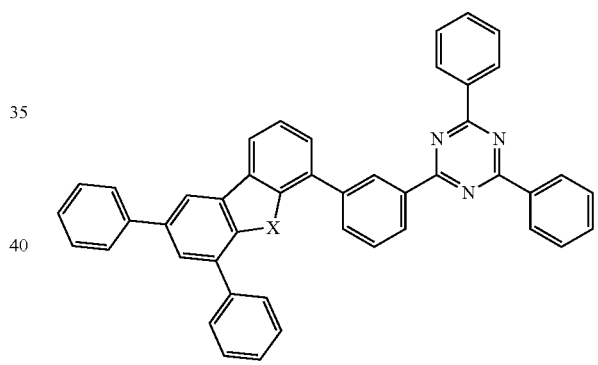

Compound C184 through C186, each represented by the formula
wherein in Compound C184: X=O,
in Compound C185: X=S,
in Compound C186: X=Se

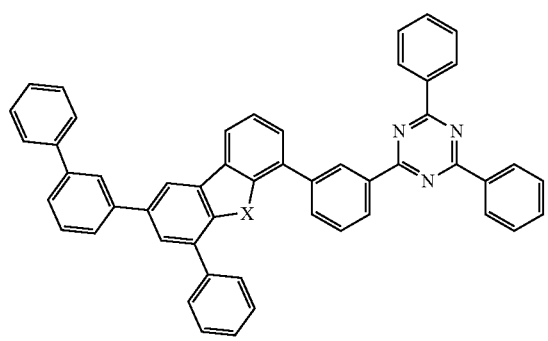

Compound C187 through C189, each represented by the formula
wherein in Compound C187: X=O,
in Compound C188: X=S,
in Compound C189: X=Se

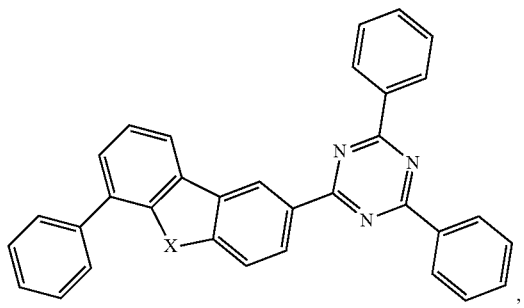

Compound C190 through C192, each represented by the formula
wherein in Compound C190: X=O,
in Compound C191: X=S,
in Compound C192: X=Se

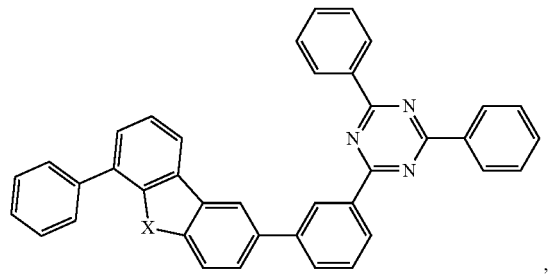

Compound C193 through C195, each represented by the formula
wherein in Compound C193: X=O,
in Compound C194: X=S,
in Compound C195: X=Se

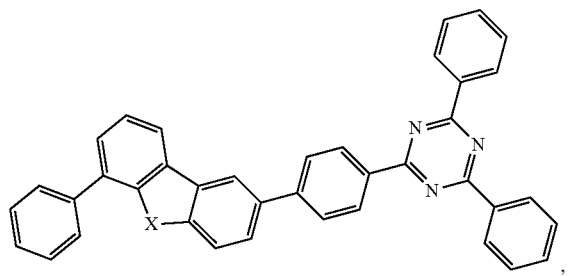

Compound C196 through C198, each represented by the formula
wherein in Compound C196: X=O,
in Compound C197: X=S,
in Compound C198: X=Se

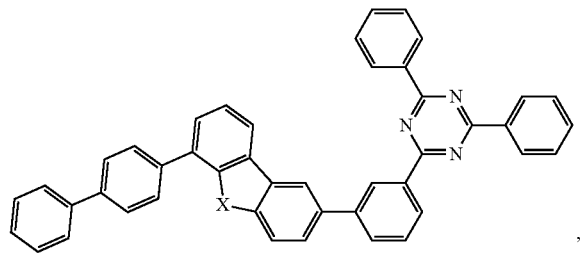

Compound C199 through C201, each represented by the formula
wherein in Compound C199: X=O,
in Compound C200: X=S,
in Compound C201: X=Se

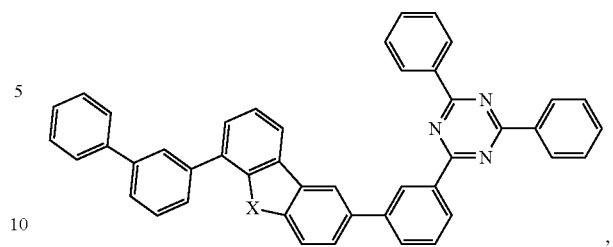

Compound C202 through C204, each represented by the formula
wherein in Compound C202: X=O,
in Compound C203: X=S,
in Compound C204: X=Se

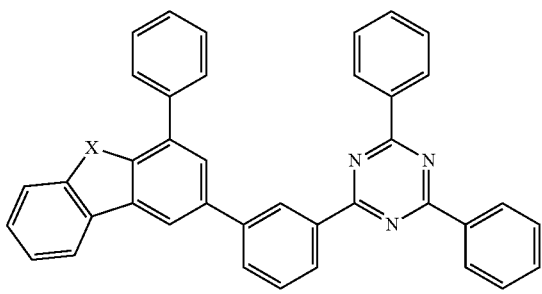

Compound C205 through C207, each represented by the formula
wherein in Compound C205: X=O,
in Compound C206: X=S,
in Compound C207: X=Se

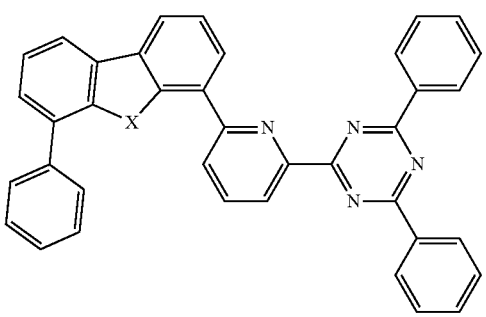

Compound C208 through C210, each represented by the formula
wherein in Compound C208: X=O,
in Compound C209: X=S,
in Compound C210: X=Se

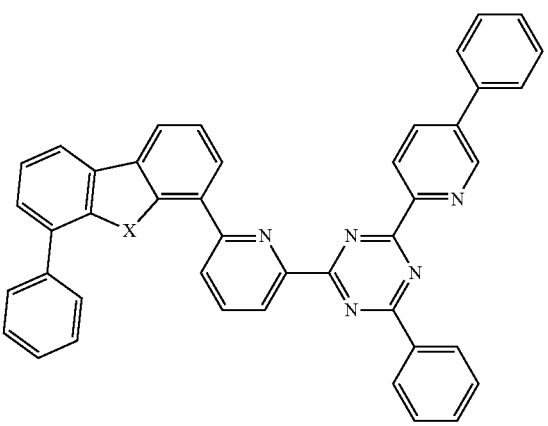

Compound C211 through C213, each represented by the formula
wherein in Compound C211: X=O,
in Compound C212: X=S,
in Compound C213: X=Se -continued

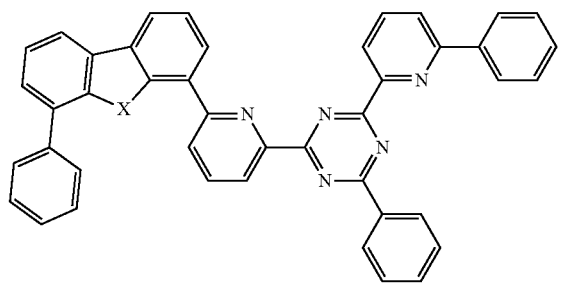

Compound C214 through C216, each represented by the formula
wherein in Compound C214: X=O,
in Compound C215: X=S,
in Compound C216: X=Se

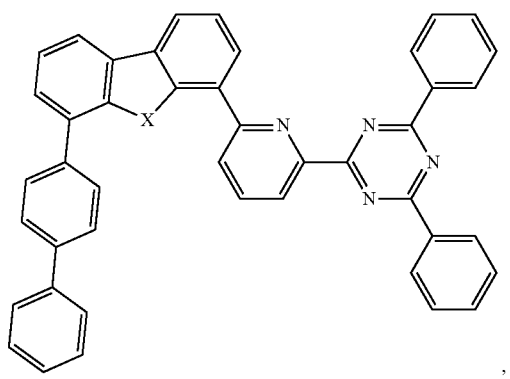

Compound C217 through C219, each represented by the formula
wherein in Compound C217: X=O,
in Compound C218: X=S,
in Compound C219: X=Se

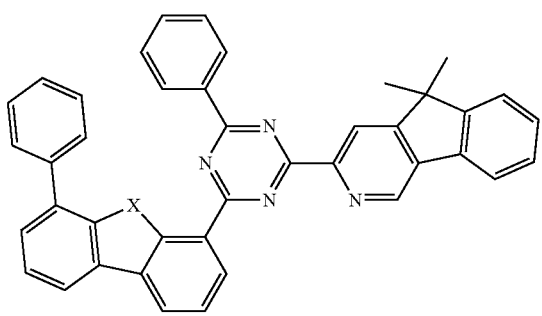

Compound C220 through C222, each represented by the formula
wherein in Compound C220: X=O,
in Compound C221: X=S,
in Compound C222: X=Se -continued

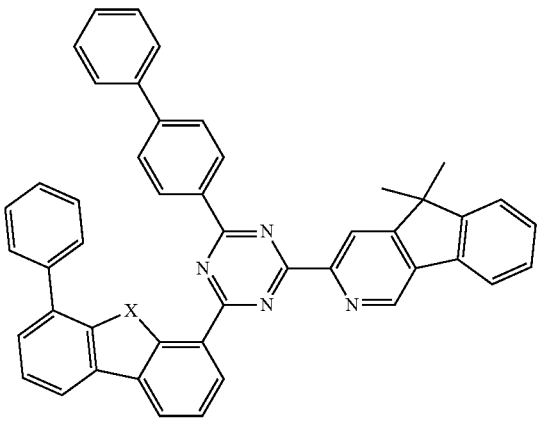

Compound C223 through C225, each represented by the formula
wherein in Compound C223: X=O,
in Compound C224: X=S,
in Compound C225: X=Se

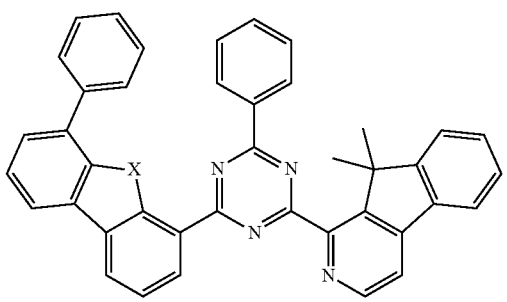

Compound C226 through C228, each represented by the formula
wherein in Compound C226: X=O,
in Compound C227: X=S,
in Compound C228: X=Se

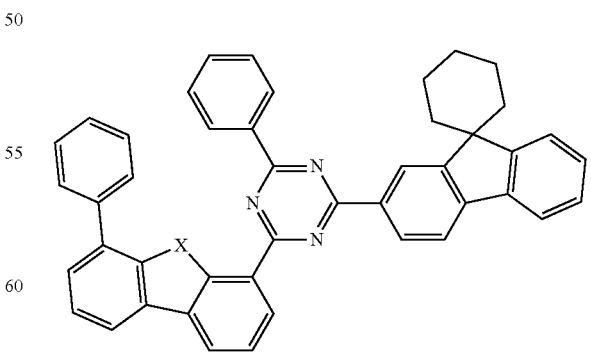

Compound C229 through C231, each represented by the formula
wherein in Compound C229: X=O,
in Compound C230: X=S,
in Compound C231: X=Se

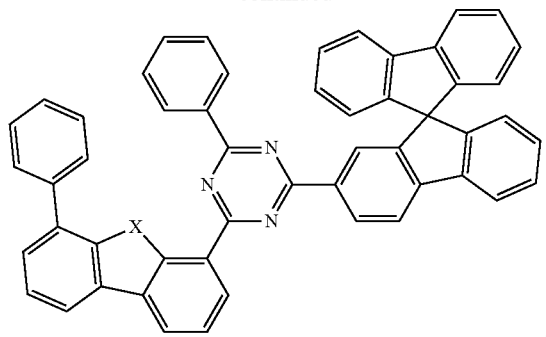

Compound C232 through C234, each represented by the formula
wherein in Compound C232: X=O,
in Compound C233: X=S,
in Compound C234: X=Se

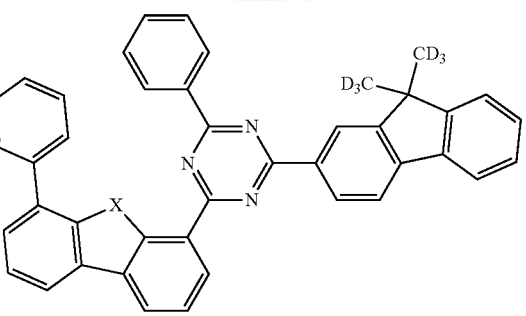

Compound C241 through C243, each represented by the formula
wherein in Compound C241: X=O,
in Compound C242: X=S,
in Compound C243: X=Se

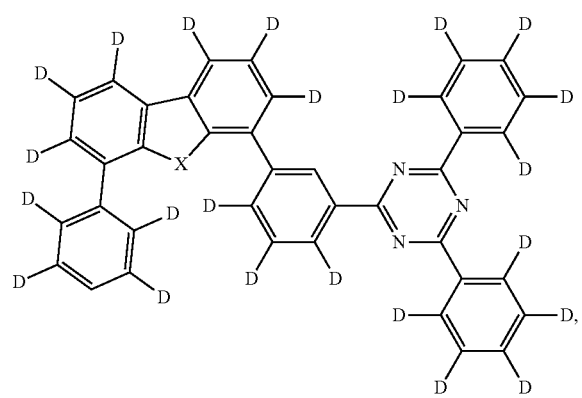

Compound C235 through C237, each represented by the formula
wherein in Compound C235: X=O,
in Compound C236: X=S,
in Compound C237: X=Se

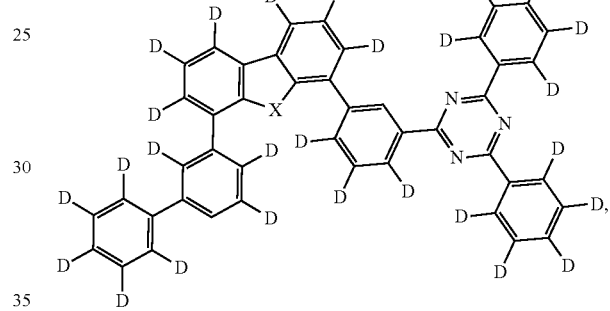

Compound C244 through C246, each represented by the formula
wherein in Compound C244: X=O,
in Compound C245: X=S,
in Compound C246: X=Se

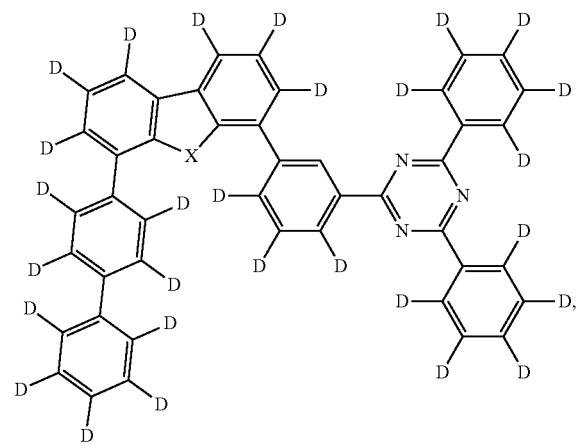

Compound C238 through C240, each represented by the formula
wherein in Compound C238: X=O,
in Compound C239: X=S,
in Compound C240: X=Se

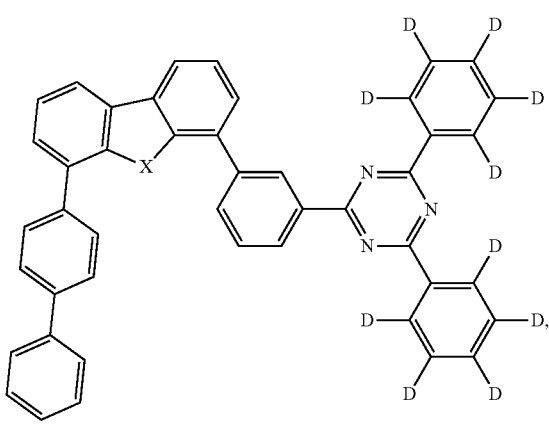

Compound C247 through C249, each represented by the formula
wherein in Compound C247: X=O,
in Compound C248: X=S,
in Compound C249: X=Se

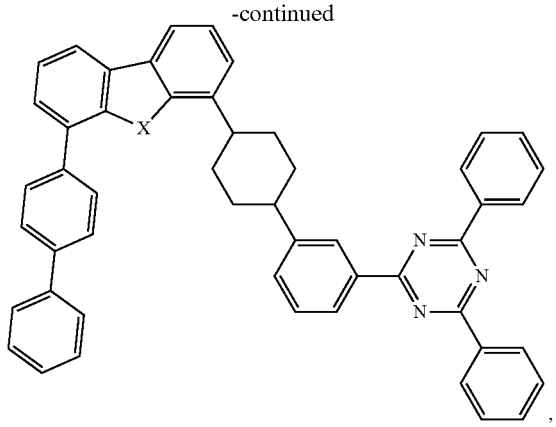

Compound C250 through C252, each represented by the formula
wherein in Compound C250: X=O,
in Compound C251: X=S,
in Compound C252: X=Se

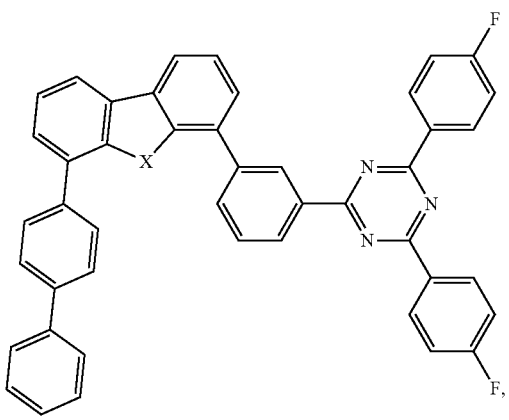

Compound C253 through C255, each represented by the formula
wherein in Compound C253: X=O,
in Compound C254: X=S,
in Compound C255: X=Se Compound D1

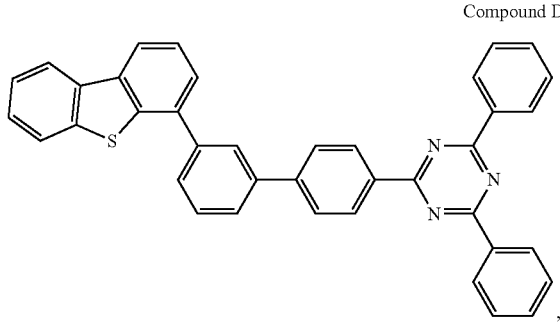

Compound D2

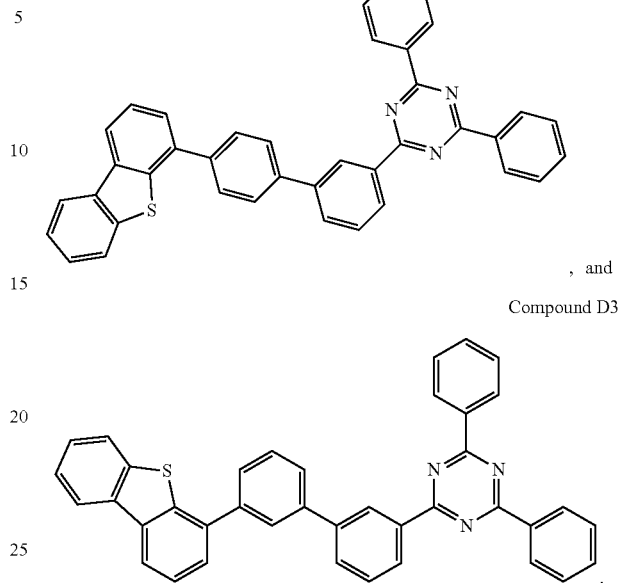

, and

Compound D3

The phosphorescent dopant may emit light from a triplet excited state to a ground singlet state in the device at room temperature. The phosphorescent dopant may be a metal coordination complex having a metal-carbon bond. The metal may be Ir, Os, Pt, Pd, Ag, Au, or Cu. The metal coordination complex may include a ligand having a chemical moiety of pyridazine, pyrimidine, pyrazine, and/or triazine. The metal coordination complex may have the formula of $M(L^1)_x(L^2)_y(L^3)_z$, where $L^1$, $L^2$ and $L^3$ may be the same or different, where x is 1, 2, or 3, where y is 0, 1, or 2, where z is 0, 1, or 2, where x+y+z is the oxidation state of the metal M, where $L^1$, $L^2$ and $L^3$ may each independently selected from:

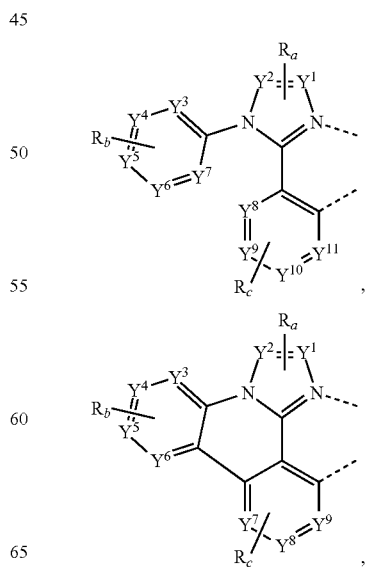

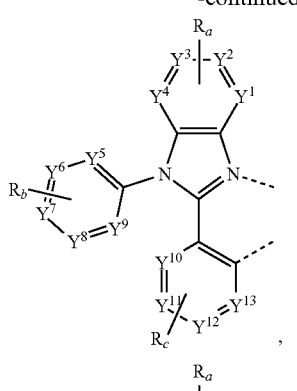,
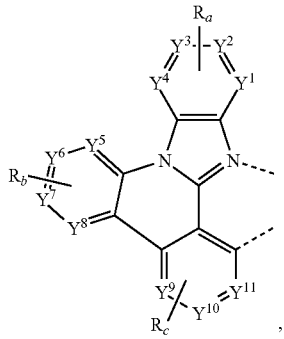,
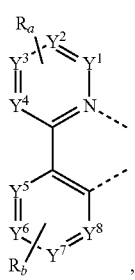,
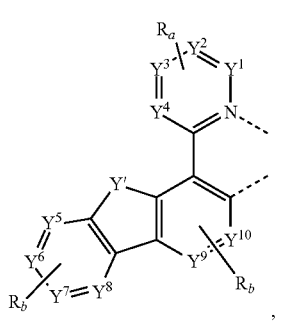,
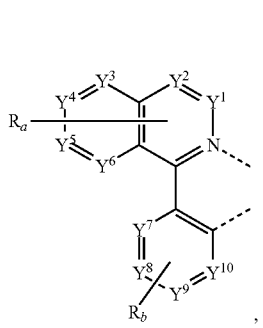,
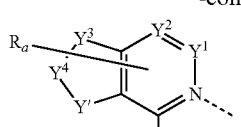,
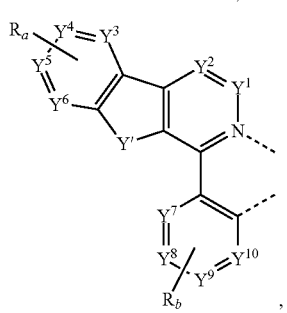,
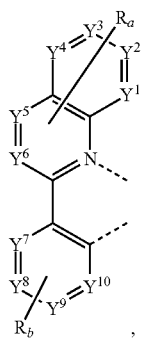,
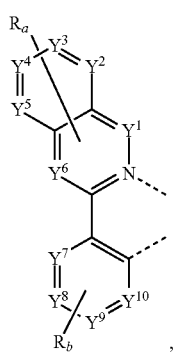,
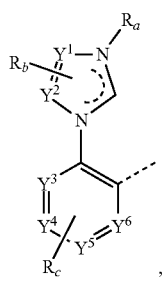, -continued

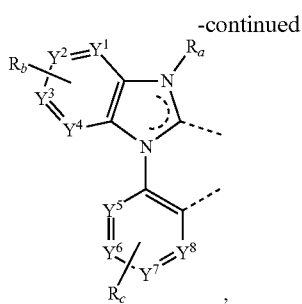

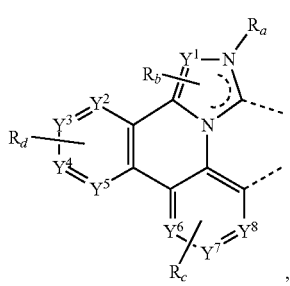

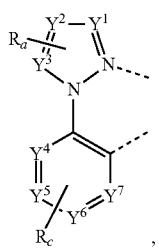

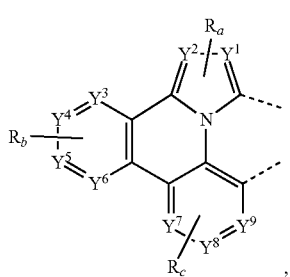

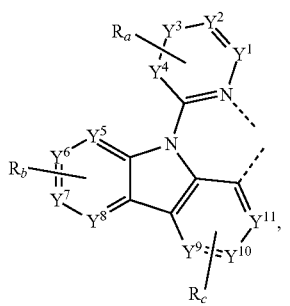

-continued

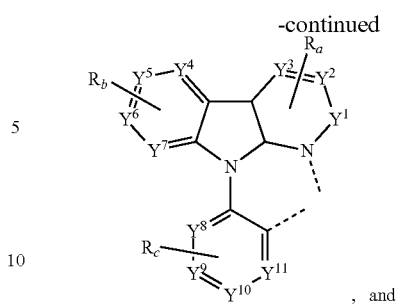
, and

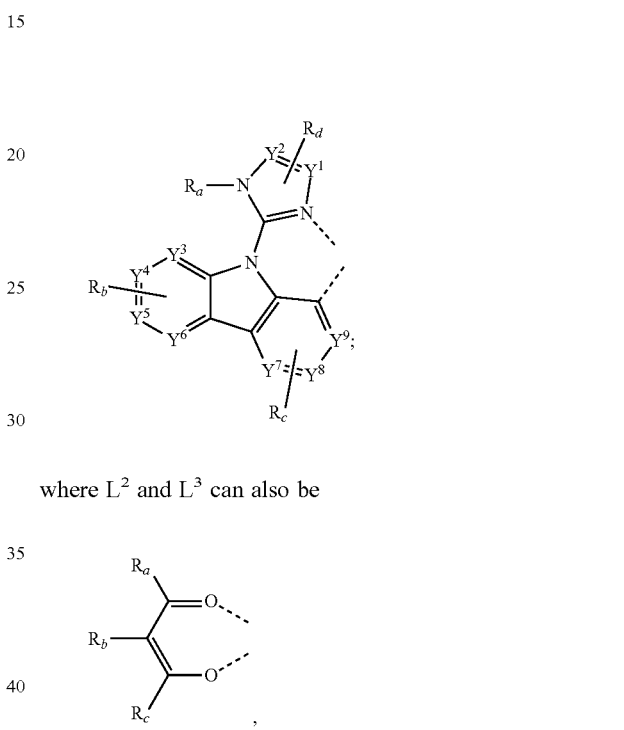

where $L^2$ and $L^3$ can also be where each $Y^1$ to $Y^{13}$ are independently selected from carbon and nitrogen, where Y' may be at least one of $BR_e$, $NR_e$, $PR_e$, O, S, Se, C=O, S=O, $SO_2$, $CR_eR_f$, $SiR_eR_f$, and $GeR_eR_f$, where $R_e$ and $R_f$ may be optionally fused or joined to form a ring, where each $R_a$, $R_b$, $R_c$, and $R_d$ may independently represent from mono substitution to the maximum possible number of substitution, or no substitution, where each $R_a$, $R_b$, $R_c$, $R_d$, $R_e$ and $R_f$ is independently selected from hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, and where any two adjacent substituents of $R_a$, $R_b$, $R_c$, and $R_d$ are optionally fused or joined to form a ring or form a multidentate ligand.

The metal coordination complex may have the formula of $Ir(L_A)_3$, $Ir(L_A)(L_B)_2$, $Ir(L_A)_2(L_B)$, $Ir(L_A)_2(L_C)$, or $Ir(L_A)(L_B)(L_C)$, where $L_A$, $L_B$, and $L_C$ are different from each other. The metal coordination complex may have a formula of $Pt(L_A)(L_B)$, where $L_A$, and $L_B$ can be same or different, and where $L_A$, and $L_B$ may be optionally connected to form a tetradentate ligand.

The metal coordination complex may have a formula of Ir(L$_A$)$_2$(L$_C$), where L$_A$ is selected from:

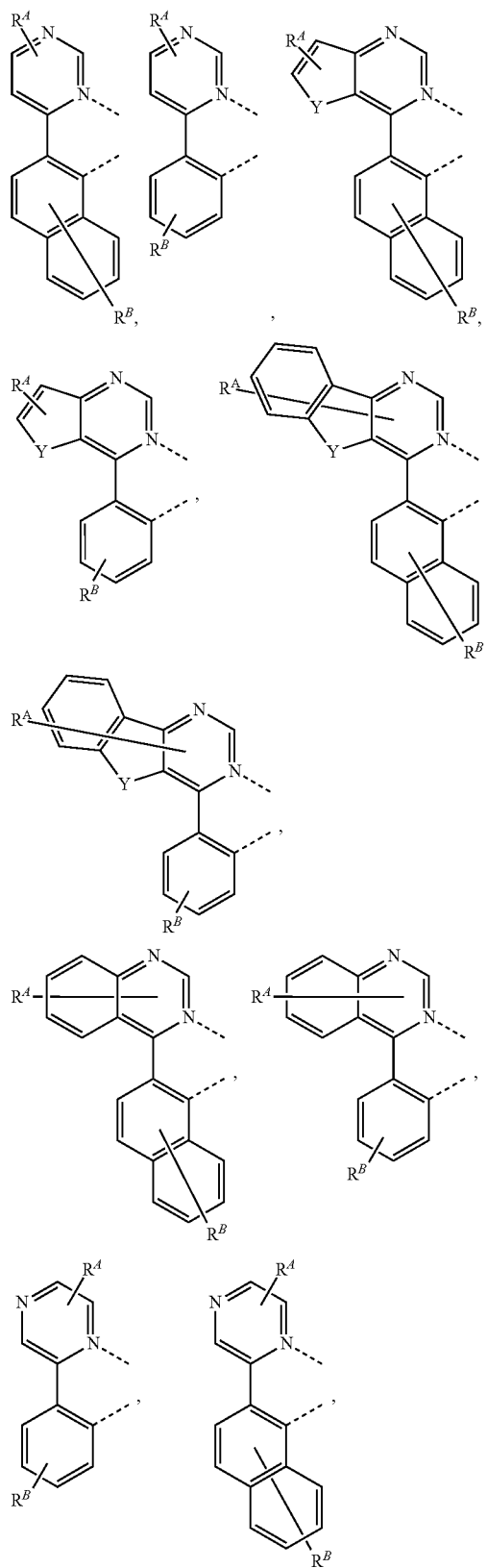

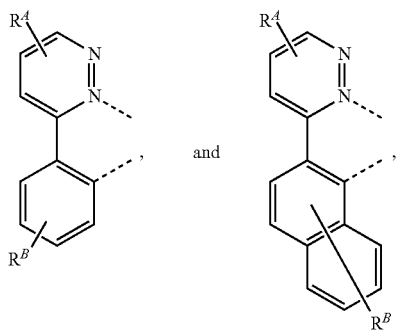

where L$_C$ is

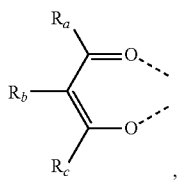

and where each R$^A$, and R$^B$ may independently represent from mono substitution to the maximum possible number of substitution, or no substitution. Each R$^A$, and R$^B$ may be independently selected from: hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof. Any two adjacent substituents of R$^A$, and R$^B$ may be optionally fused or joined to form a ring or form a multidentate ligand.

In some embodiments, the metal coordination complex may be selected from:

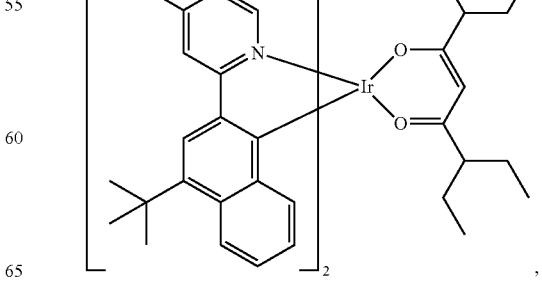

73
-continued
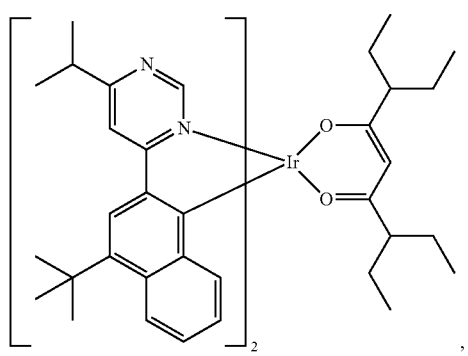
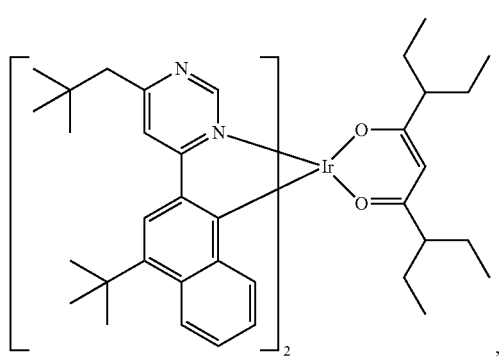
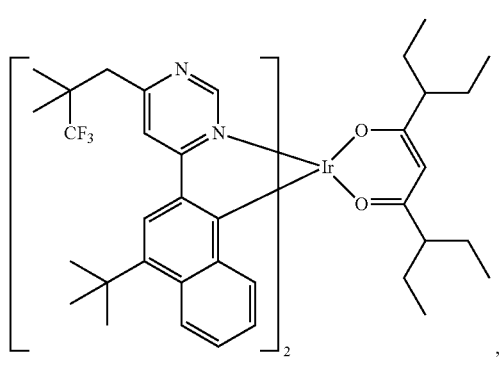
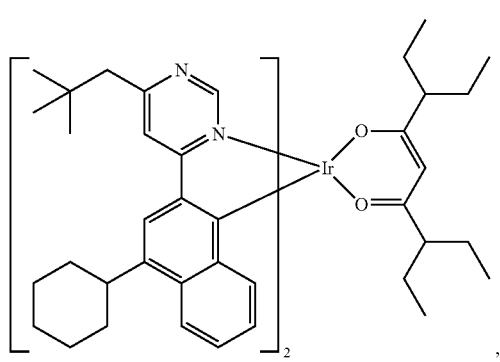
74
-continued
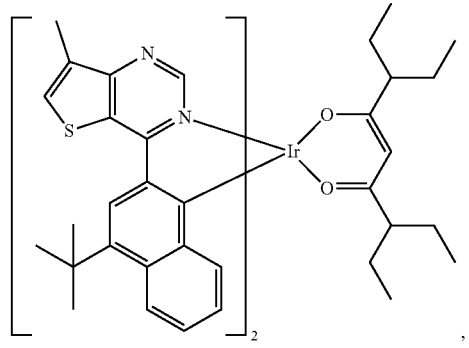
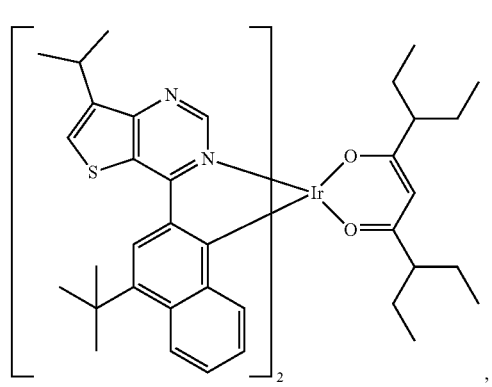
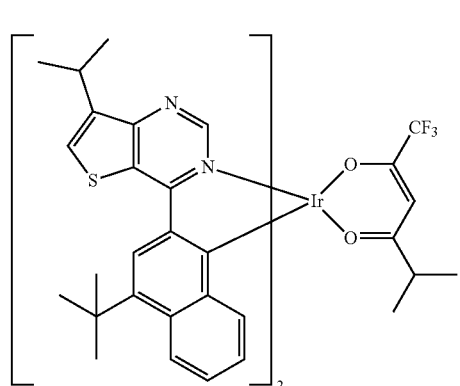
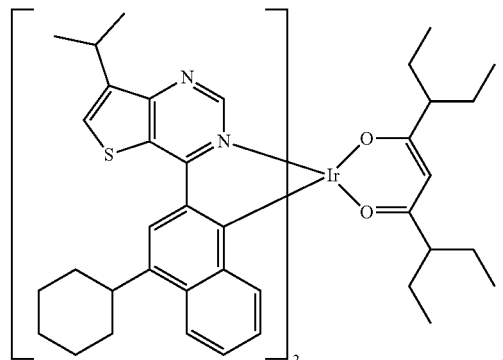

75
-continued
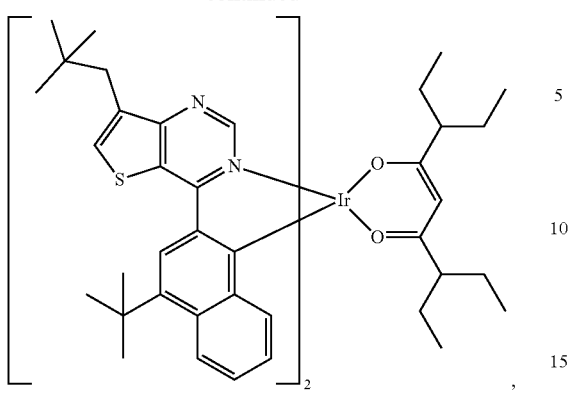
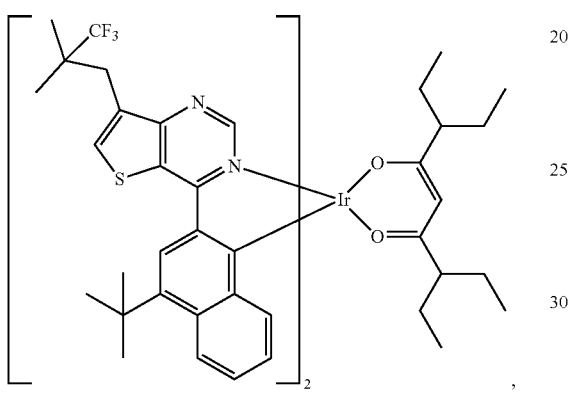
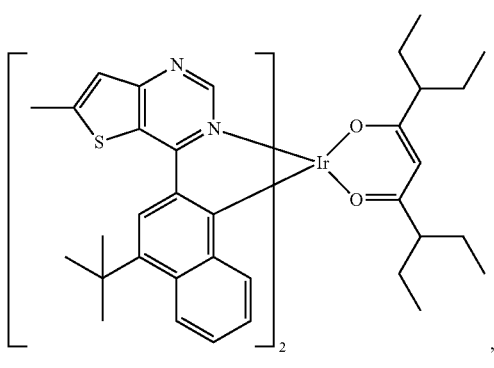
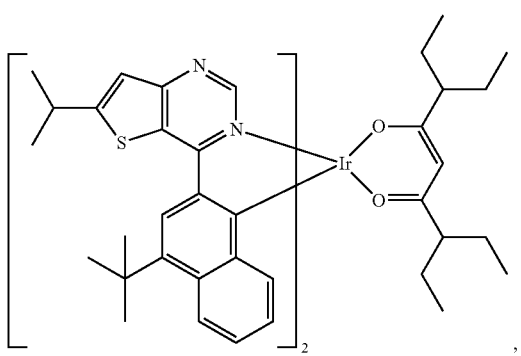
76
-continued
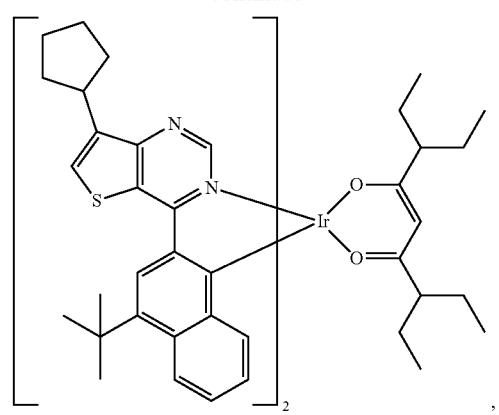
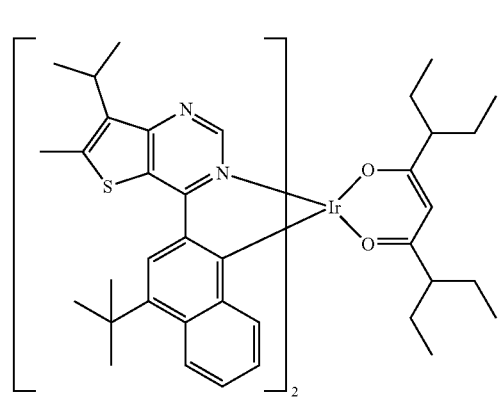
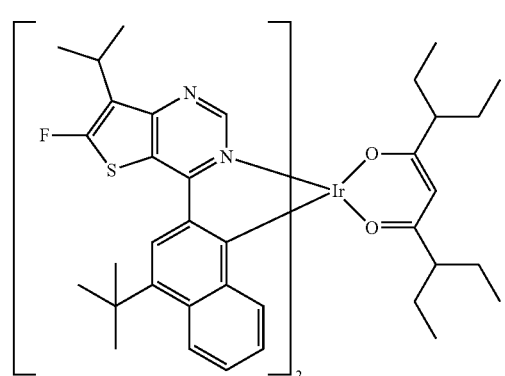
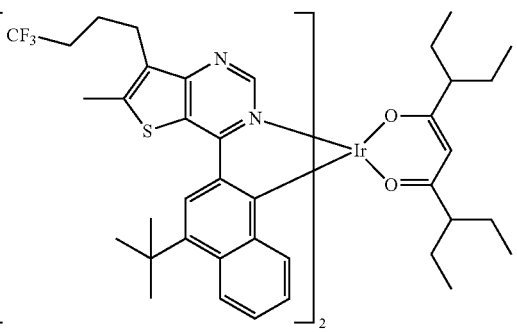

77
-continued
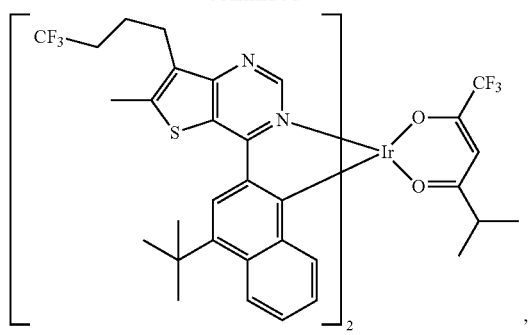
,
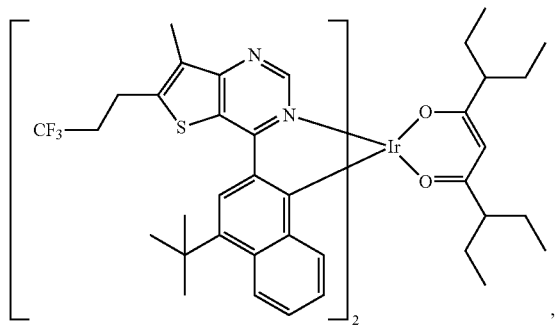
,
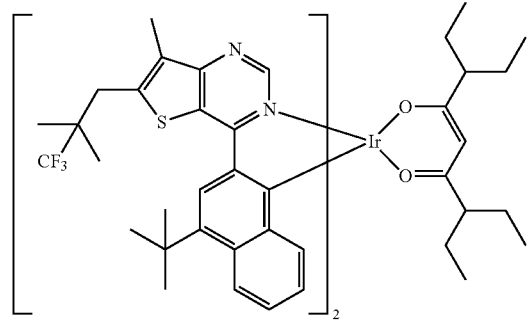
,
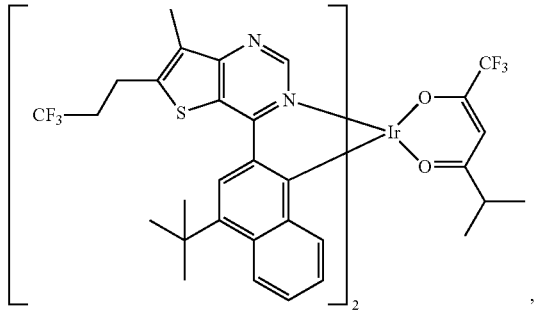
,
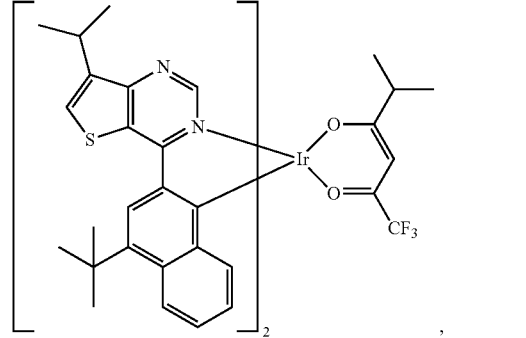
,
78
-continued
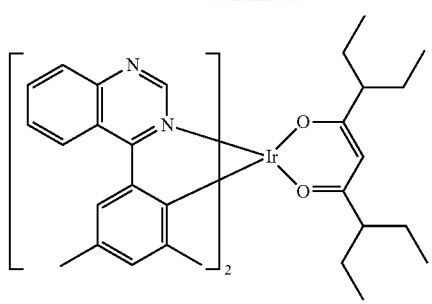
,
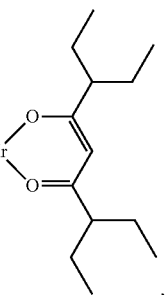
,
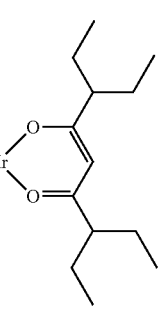
,
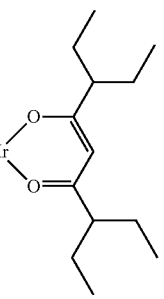
,
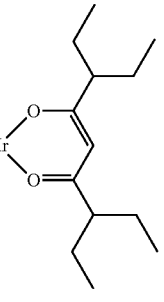
,

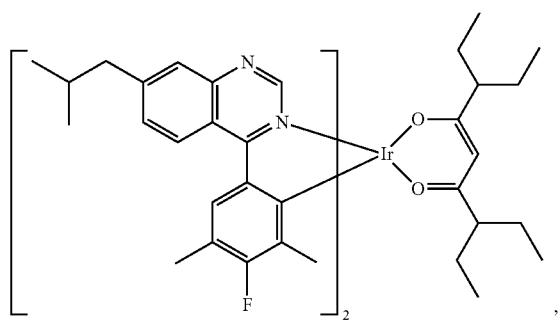
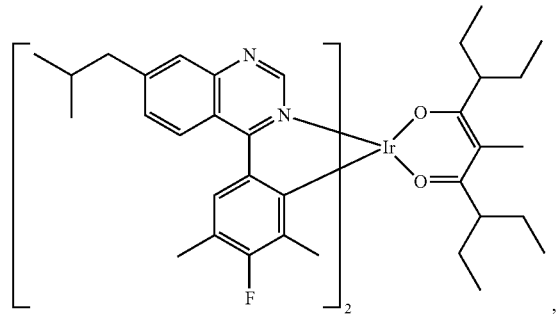
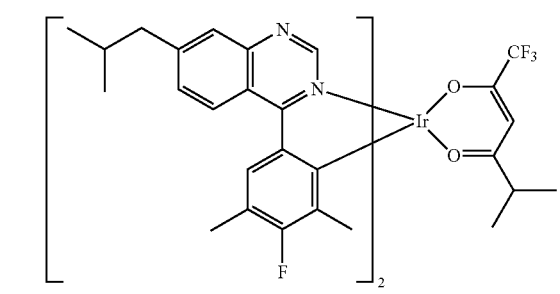
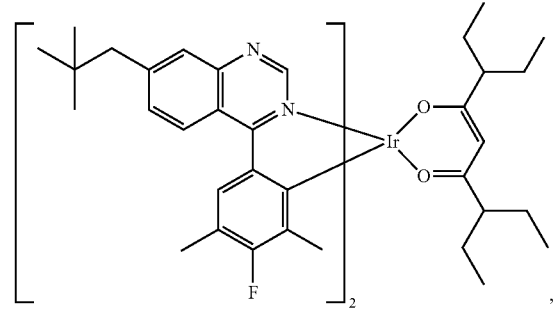
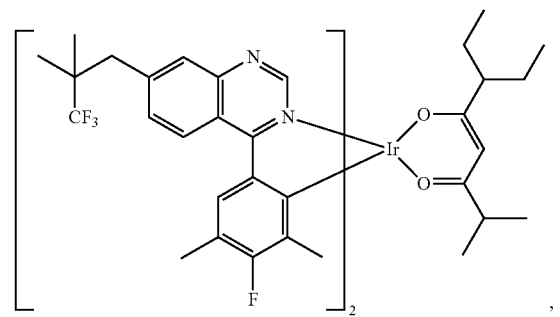
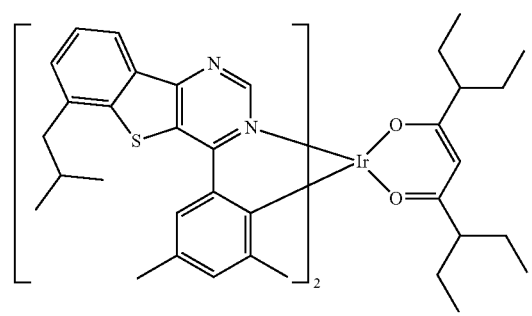
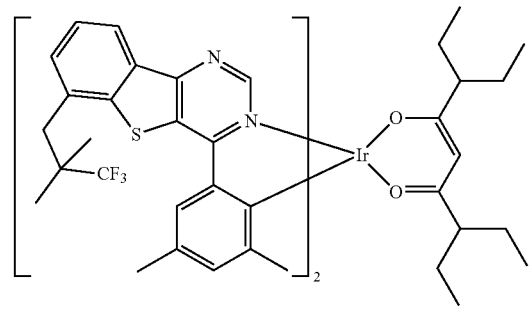
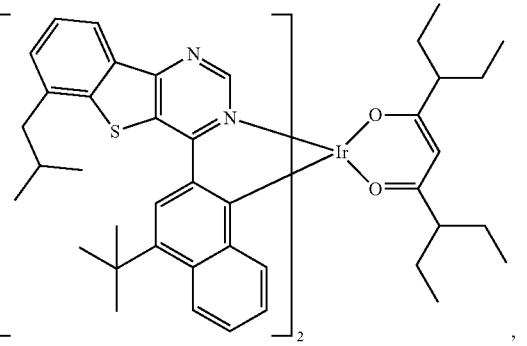
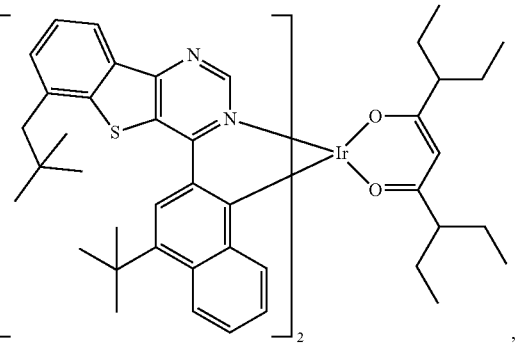
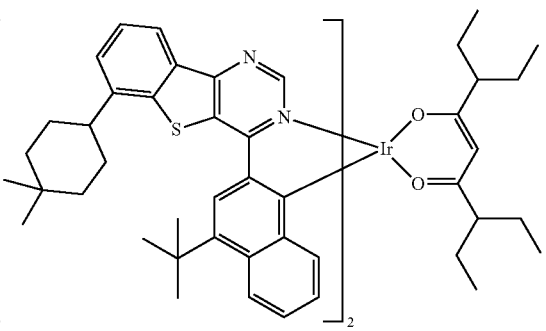

-continued

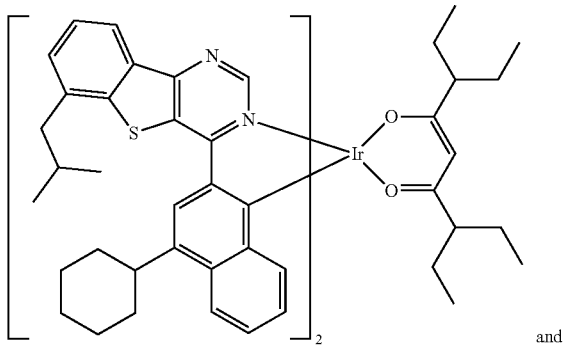

and

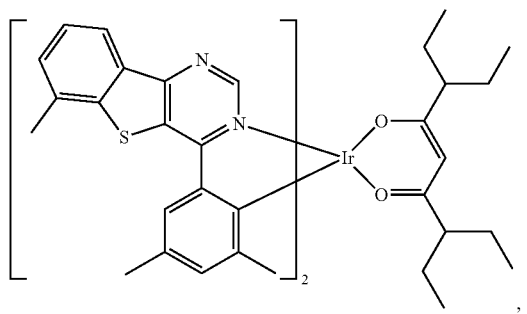

,

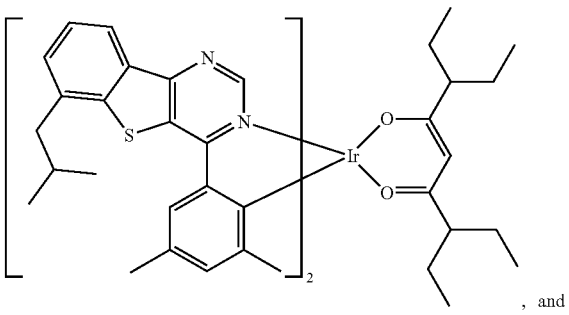

, and

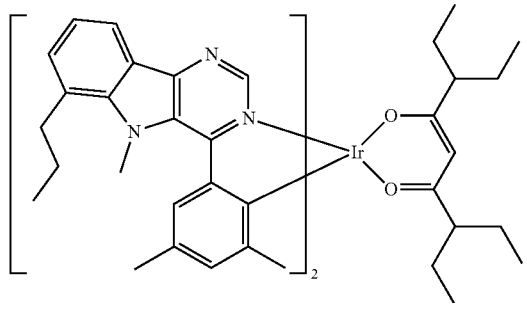

The metal coordination complex may be a Pt complex having a tetradentate ligand. The tetradentate ligand may have four coordination atoms selected from: (two anionic C, two neutral N); (one anionic C, one carbene C, one neutral N, and one anionic N); (two anionic C, one carbene C, one neutral N); (one anionic C, one anionic N, two neutral N); (one anionic C, one anionic O, two neutral N); (two carbene C, two anionic N.

The electron blocking layer may include the compound of Formula II:

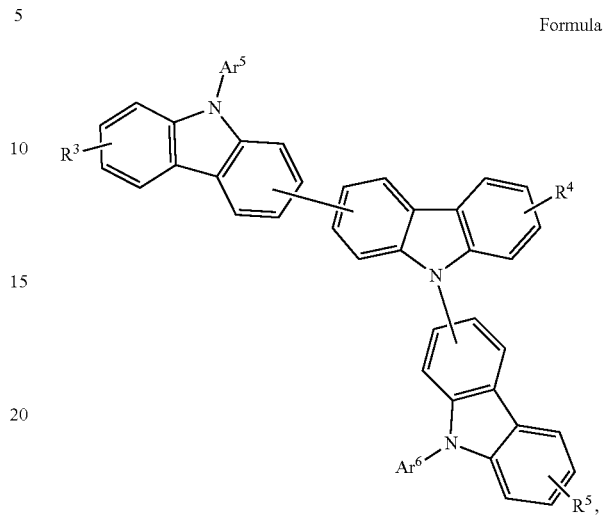

Formula II where $R^3$, $R^4$, and $R^5$ may each independently represent mono to the maximum allowable substitution, or no substitution, where each $R^3$, $R^4$, and $R^5$ may be independently a hydrogen or a substituent selected from deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and/or combinations thereof, and where each $Ar^5$ and $Ar^6$ may be independently selected from aryl, heteroaryl, and/or combination thereof. Each $R^3$, $R^4$, and $R^5$ may independently be a hydrogen or a substituent selected from aryl, heteroaryl, and/or combination thereof.

The electron blocking layer may include a compound selected from:

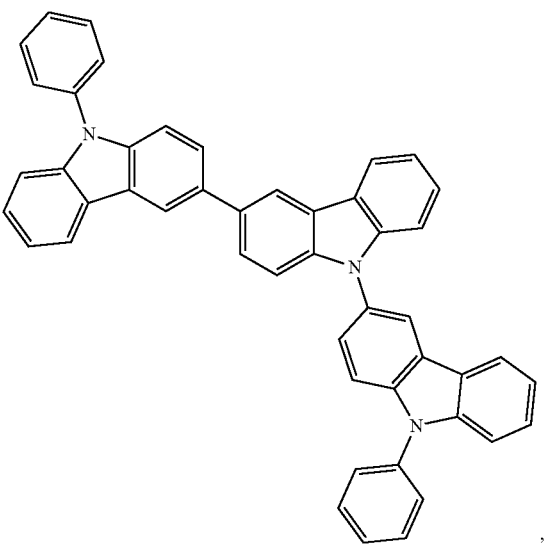

,

83
-continued
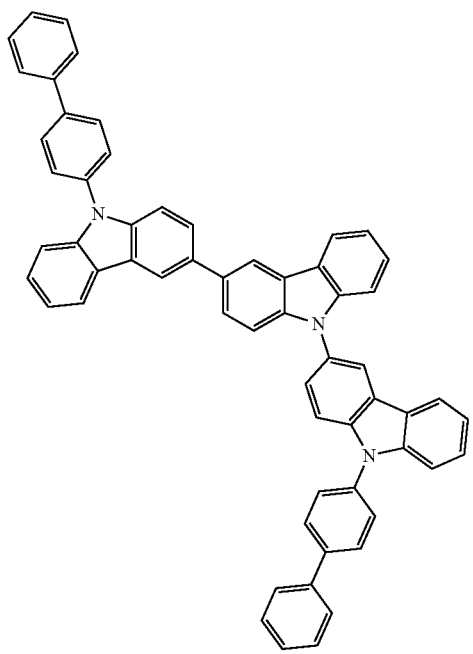
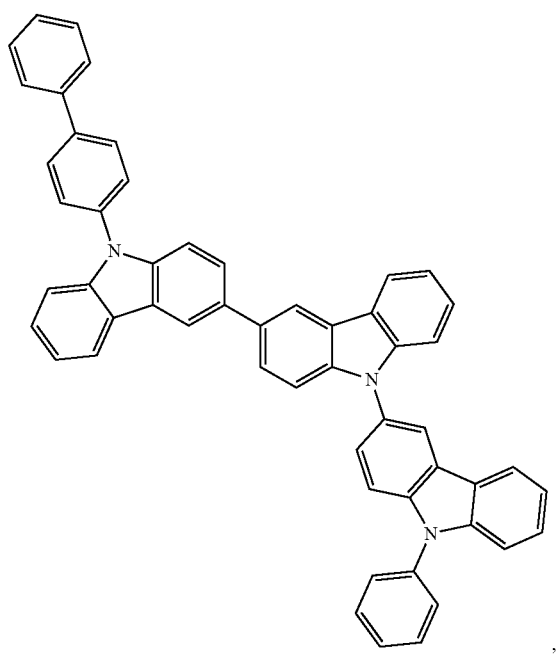
84
-continued
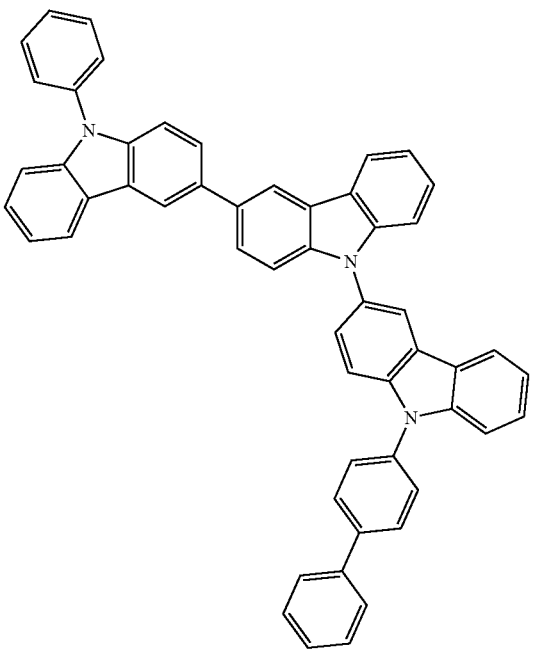
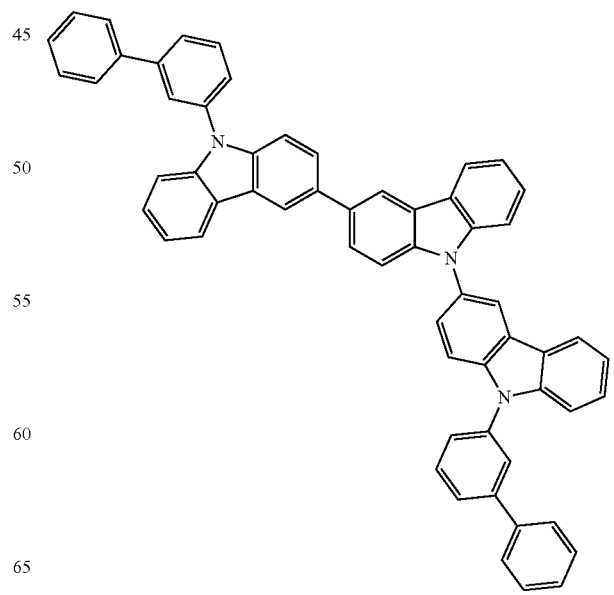

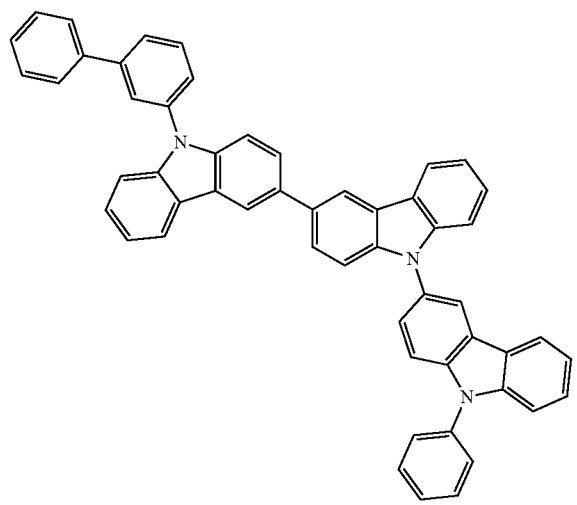
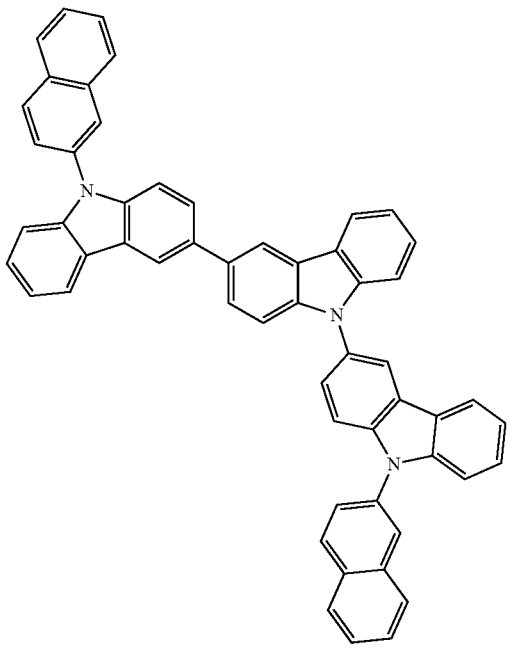
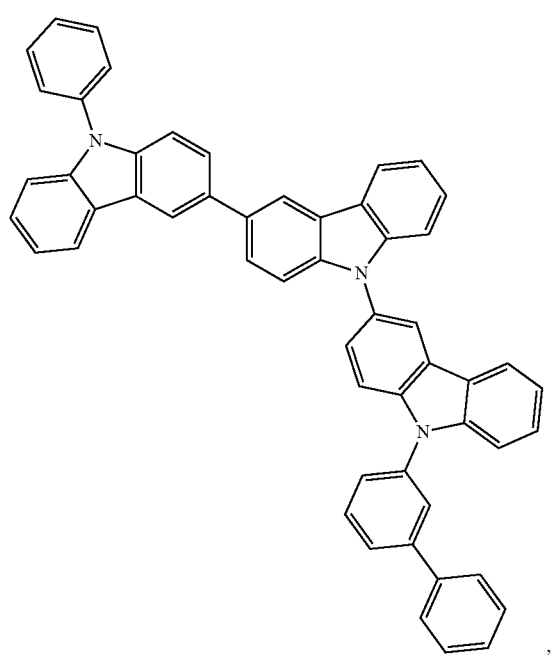
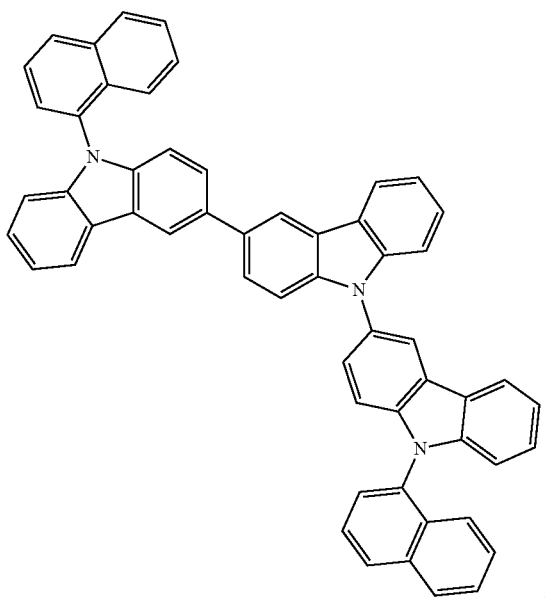

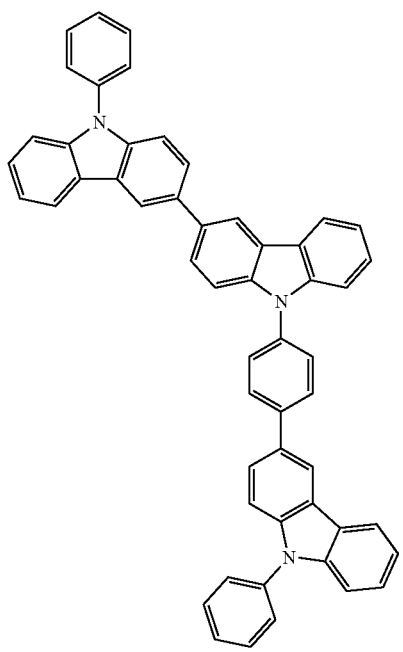

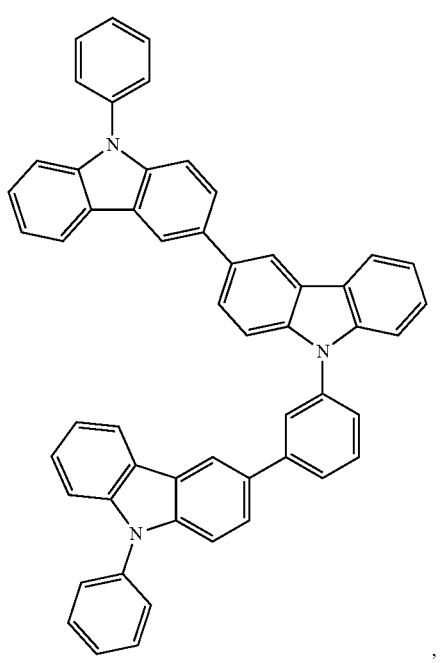
, and

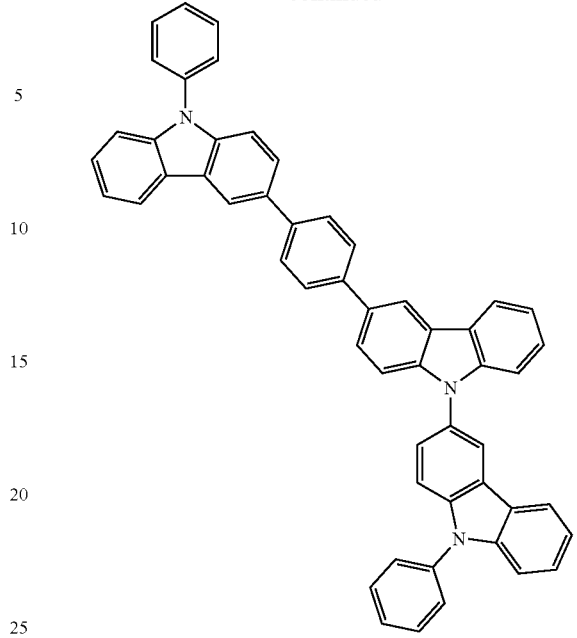

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

EXPERIMENTAL

Deep HOMO emitters may be PHOLED (phosphorescent organic light emitting diode) emitters with narrow spectrum, high LE/EQE (luminous efficacy/external quantum efficiency) ratio, long lifetime, and an EQE value above a predetermined amount. For example, the narrow spectrum of the deep HOMO emitters may have full width at half maximum (FHWM) values of less than 50 nm, less than 45 nm, less than 40 nm, or the like. Due to narrow electroluminescent (EL) spectrum, the amount of photon emitting in invisible range over 670 nm may be minimized compared to conventional broad red emitters, and thus less photons losses may occur. Most of the emitted photons may be in the visible range, which may provide for higher luminance efficiency at the same EQE for the narrow EL emitters.

Many narrow EL emitters may have deeper HOMO levels (e.g., ~−5.3 eV) when compared to the HOMO levels for broad emitters (e.g., ~−5.1 eV). This may cause different behavior of the emitter in the device. Embodiments of the disclosed subject matter may provide a different approach for the efficient device structure architecture for deep HOMO emitters, such as for deep HOMO red emitters.

Many families of deep HOMO emitters may have desirable PHOLED performance with narrow spectrum, high LE/EQE ratio, long lifetime, and potentially very high EQE. Due to narrow EL spectrum, the amount of photon emitting in invisible range over 670 nm may be minimized, compared to conventional broad red emitters and thus less photons losses occur. Most of the emitted photons may be in the visible range, so as to provide higher luminance efficiency at the same EQE for the narrow EL emitters.

Many narrow EL emitters may have deeper HOMO level (e.g., ~5.3 eV) when compared to the HOMO level for broad emitters (e.g., ~5.1 eV). This may cause different behavior of the emitter in the device, and different device structure architecture for deep HOMO emitters may be used.

In addition to narrow red emitters, there may be families of green emitters with desired performance and deep HOMO (e.g., >5.2 eV), and similar device structure architectures may be used.

Figure 6:
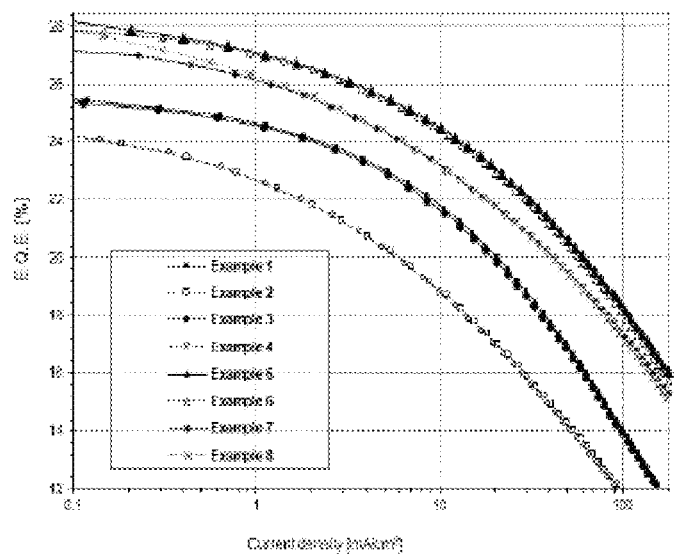
FIG. 6 shows a graph of external quantum efficiency (EQE) vs. current density for devices with RD1 and RD2 emitters according to embodiments of the disclosed subject matter.

Embodiments of the disclosed subject matter provide designs for an efficient device structure for deep HOMO emitters. There may be differences in the device properties between the emitters RD1 and RD2 in the same device structure (e.g., as shown in FIG. 6 and Table 2). The differences may be attributed to a recombination zone (RZ) location in the EML. A hole blocking layer (HBL) may affect the efficiency of deep HOMO RD1 emitter device, whereas an electron blocking layer (EBL) may not affect efficiency (e.g., as shown in examples 1, 2, 3, 4 of Table 2). For the emitter RD2, there may be no difference in device efficiency due to HBL, but there may be differences due to EBL (see, e.g., examples 5, 6, 7, 8 of Table 2).

The RD1 device may have a recombination zone close to the HBL side of EML (emissive layer). The HBL may improve RD1 device efficiency by preventing exciton quenching and electron leakage to the ETL (electron transport layer). For the same reason, the RD2 device may have a recombination zone (RZ) close to the EBL, and the EBL may improve device efficiency by prevention of exciton quenching and hole leakage to the HTL (hole transport layer). Deep HOMO RD1 may provide improved hole transport to the HBL side of EML, as there may be less hole trapping. In contrast, the reference shallow HOMO RD2 may not provide enough hole transport through the EML, as there may be more hole trapping. The RZ may be localized so as to be in the proximity of EBL.

Embodiments of the disclosed subject matter may provide for the combination of the deep HOMO emitter and HBL to provide improved device efficiency. Efficiency roll off with luminance increase may be a problem for phosphorescent devices, and reduction of efficiency roll-off may be important in order to provide increased device efficiency at higher luminances. EQE roll off may be calculated as ratio of EQE at 10 mA/cm$^2$ to EQE of 1 ma/cm$^2$ for the same device (see, e.g., last column in Table 2). Data in Table 2 and FIG. 6 shows that HBL may provide efficiency roll-off reduction for the RD1 deep HOMO emitter (see, e.g., Example 1 vs. Example 2 and Example 3 vs. Example 4 in Table 2) and may have no or minimal roll off effect on a device with an RD2 emitter (see, e.g., Example 6 vs. Example 5 and Example 7 vs. Example 8 in Table 2).

All example devices were fabricated by high vacuum (<10$^{-7}$ Torr) thermal evaporation. The anode electrode was 1,150 Å of indium tin oxide (ITO). The cathode was comprised of 10 Å of Liq (8-hydroxyquinoline lithium) followed by 1,000 Å of Al. All devices were encapsulated with a glass lid sealed with an epoxy resin in a nitrogen glove box (<1 ppm of $H_2O$ and $O_2$) immediately after fabrication, and a moisture getter was incorporated inside the package. The organic stack of the device examples sequentially included, from the ITO surface, 100 Å of HAT-CN (Hexaazatriphenylenehexacarbonitrile) as the hole injection layer (HIL); 400 or 450 Å of HTM (hole transport material) as a hole transporting layer (HTL); 50 Å of EBM (electron blocking material) (if any) as an electron blocking layer (EBL); 400 Å of an emissive layer (EML) containing from red host H1 and 3% of RD1 or RD2 red emitters, 50 Å of HBM as hole blocking layer (HBL) (if any) and 300 (with HBL) or 350 Å (no HBL) of Liq (8-hydroxyquinoline lithium) doped with 35% of ETM as the ETL.

Figure 3:
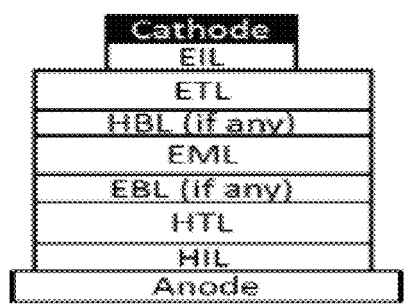
FIG. 3 shows an example device structure according to an embodiment of the disclosed subject matter.

FIG. 3 shows a device structure according to an embodiments of the disclosed subject matter. The device may include a cathode, an electron ejection layer (EIL), an electron transport layer (ETL), an optional a hole blocking layer (HBL), an emissive layer (EML), an optional electron blocking layer (EBL), a hole transport layer (HTL) a hole injection layer (HIL), and an anode.

When not including the using EBL, the HTL thickness was 50 Å thicker, and when the HBL is not includes, the ETL thickness was 50 Å thicker, so total device thickness remained the same to prevent possible device performance distortion due to different layer thicknesses.

Figure 4:
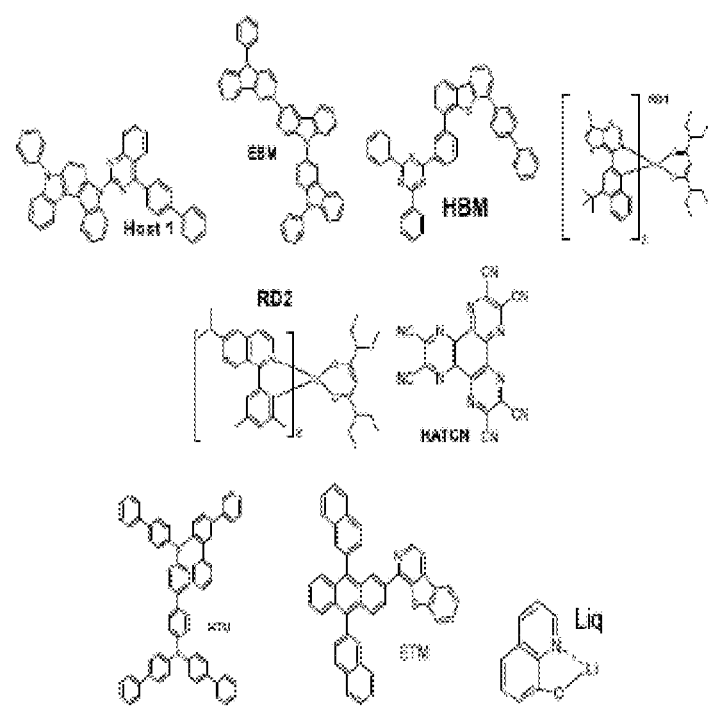
FIG. 4 shows example materials used in OLED (organic light emitting diode) devices according to embodiments of the disclosed subject matter.

Table 1 shows the device layer thickness and materials. The chemical structures of the device materials are shown in FIG. 4.

TABLE 1

Device layer materials and thicknesses

| Layer | Material | Thickness [Å] |
|---|---|---|
| Anode | ITO | 1,150 |
| HIL | HAT-CN | 100 |
| HTL | HTM | 400-450 |
| EBL | EBM | 50 (if any) |
| EML | Host: RD 3% | 400 |
| HBL | HBM | 50 (if any) |
| ETL | Liq: ETM 35% | 300-350 |
| EIL | Liq | 10 |
| Cathode | Al | 1000 |

Upon fabrication, the devices have been EL and JVL (current density, voltage, luminance) tested. The device performance data are summarized in Table 2.

TABLE 2

Device structures and performance of the device examples with various red emitters and blocking layers.

| Device Example | EBL | Host | Emitter 3% | HBL | 1931 CIE x | y | At 1 mA/cm$^2$ Voltage [v] | LE [cd/A] | EQE [%] | At 10 mA/cm$^2$ Voltage [v] | LE [cd/A] | EQE [%] | EQE roll-off 10/1 mA/cm$^2$ |
|---|---|---|---|---|---|---|---|---|---|---|---|---|---|
| Example 1 | EBM | Host 1 | RD1 | HBM | 0.686 | 0.313 | 2.9 | 23.5 | 24.7 | 3.8 | 20.8 | 21.8 | 0.89 |
| Example 2 | EBM | Host 1 | RD1 | | 0.686 | 0.313 | 2.8 | 21.6 | 22.7 | 3.7 | 18.0 | 18.9 | 0.83 |
| Example 3 | | Host 1 | RD1 | HBM | 0.686 | 0.313 | 2.9 | 23.4 | 24.6 | 3.8 | 20.7 | 21.7 | 0.88 |
| Example 4 | | Host 1 | RD1 | | 0.686 | 0.313 | 2.8 | 21.7 | 22.7 | 3.7 | 17.9 | 18.8 | 0.83 |
| Example 5 | EBM | Host 1 | RD2 | HBM | 0.683 | 0.316 | 3.1 | 23.2 | 27.1 | 4.3 | 21.0 | 24.5 | 0.90 |
| Example 6 | EBM | Host 1 | RD2 | | 0.683 | 0.316 | 3.0 | 23.2 | 27.0 | 4.1 | 21.0 | 24.4 | 0.90 |
| Example 7 | | Host 1 | RD2 | HBM | 0.683 | 0.317 | 3.0 | 22.5 | 26.1 | 4.2 | 20.0 | 23.2 | 0.89 |
| Example 8 | | Host 1 | RD2 | | 0.682 | 0.317 | 2.9 | 22.7 | 26.3 | 4.1 | 20.1 | 23.2 | 0.88 |

To understand the device performance, HOMO-LUMO and T1 energy levels of the materials have been used. Energy Levels were determined by solution cyclic voltammetry and differential pulsed voltammetry. Measurements were performed using a CH Instruments model 6201B potentiostat using anhydrous dimethylformamide solvent and tetrabutylammonium hexafluorophosphate as the supporting electrolyte. Glassy carbon, and platinum and silver wires were used as the working, counter and reference electrodes, respectively. Electrochemical potentials were referenced to an internal ferrocene-ferroceniumredox couple (Fc/Fc+) by measuring the peak potential differences from differential pulsed voltammetry. The corresponding highest occupied molecular orbital (HOMO) energy and the lowest unoccupied molecular orbital (LUMO) energy were determined by referencing the cationic and anionic redox potentials to ferrocene (4.8 eV vs. vacuum). That is:

HOMO=-(CV ox)-4.8 (eV)

LUMO=-(CV red)-4.8 (eV)

To determine the T1 level, less than 1 mg of material was dissolved by ultrasonication in 2 mL of 2-methyltetrahydrofuran solvent. The solution was filtered through a 2 micron filter into a quartz tube. The tube was sealed with a rubber septum and bubble degassed with nitrogen in order to prevent oxygen quenching. The phosphorescence spectrum was carried out on a Horiba Jobin Yvon Fluorolog-3 system equipped with a xenon lamp at low temperature close to 77 K. The T1 is determined using PL at 77K. That is:

T1 (eV)=1240/triplet wavelength [nm]

Figure 5:
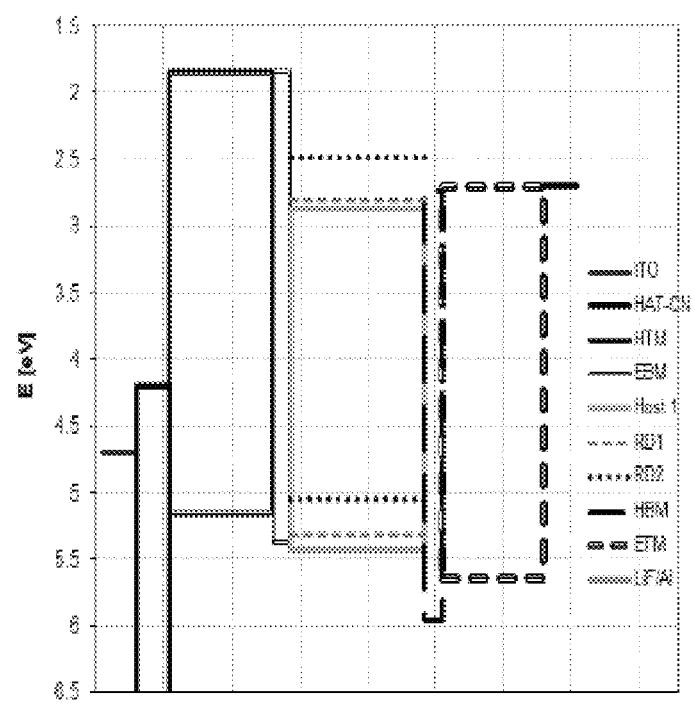
FIG. 5 shows an example PHOLED (phosphorescent organic light emitting diode) structure energy levels according to an embodiment of the disclosed subject matter.

HOMO-LUMO and T1 levels are listed in Table 3 below, and FIG. 5 shows the HOMO-LUMO levels of a device materials according to embodiments of the disclosed subject matter.

Energy levels and T1 for the materials used in the device examples

| Material | HOMO [eV] | LUMO [eV] | T1 [nm] |
| --- | --- | --- | --- |
| ITO | 4.70 | | |
| HAT-CN | 9.70 | 4.20 | |
| HTM | 5.16 | 1.85 | 523 |
| EBM | 5.38 | 1.84 | 452 |
| Host 1 | 5.43 | 2.88 | 516 |
| RD1 | 5.32 | 2.81 | 614 |
| RD2 | 5.05 | 2.49 | 606 |
| HBM | 5.96 | 2.74 | 484 |
| ETM | 5.64 | 2.71 | 706 |
| Host 2 | 5.96 | 2.74 | 484 |
| Host 3 | 5.11 | 2.37 | 536 |
| HBL 1 | 5.90 | 2.90 | 569 |
| HBL 2 | 5.64 | 2.73 | 454 |
| HBL 3 | 5.70 | 2.47 | 420 |

The calculated energy levels for HBM are shown below, and may have similarities to compound H:

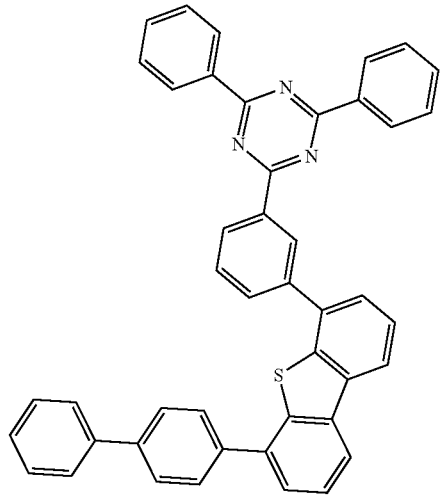 [SMILES: c1ccc(-c2ccc(-c3cccc4c3sc3c(-c5cccc(-c6nc(-c7ccccc7)nc(-c7ccccc7)n6)c5)cccc34)cc2)cc1]

| | DFT (Density Functional Theory) |
| --- | --- |
| Ti | 421 |
| S1 | 370 |
| Gap | 3.804 |
| HOMO | -5.795 |
| LUMO | -1.991 |

There may be differences in the device properties between emitter RD1 and RD2 in the same device structure (see, e.g., FIG. 6 and Table 2), and may be based on the recombination zone (RZ) location in the EML. The HBL may affect the efficiency of deep HOMO RD1 emitter device, whereas the EBL may not affect efficiency (see, e.g., Examples 1, 2, 3, 4 in Table 2).

In contrast, with reference emitter RD2, there may be no difference in device efficiency due to HBL, but there may be a difference due to EBL (see, e.g., examples 5, 6, 7, 8 shown in Table 2). The RD1 device may have a recombination zone close to the HBL side of EML, and the HBL may improve RD1 device efficiency by preventing exciton quenching and electron leakage to the ETL. When the RD2 device may have recombination zone RZ close to EBL, and the EBL may improve device efficiency by prevention of exciton quenching and hole leakage to the HTL.

Deep HOMO RD1 may exhibit less hole trapping and/or improved hole transport, which may provide a higher exciton population near the cathode side of the EML. In contrast, reference shallow HOMO RD2 may hole trap more strongly and/or hole transport less through the EML, which may provide a RZ localized in the proximity of EBL. In embodiments of the disclosed subject matter, the combination of deep HOMO emitter and HBL may provide the desired device efficiency.

Efficiency roll off with luminance increase may be a problem for phosphorescent devices. Reduction of efficiency roll-off may provide a higher device efficiency at a higher luminance. EQE roll off was calculated as ratio of EQE at 10 mA/cm$^2$ to EQE of 1 mA/cm$^2$ for the same device (see, e.g., the last column in the Table 2). Data in Table 2 and FIG. 6 show that HBL provides efficiency roll-off reduction for the RD1 deep HOMO emitter (see, e.g., Example 1 vs. Example 2 and Example 3 vs. Example 4 in Table 2) and has no or minimal roll off effect on device with RD2 emitter (see, e.g., Example 6 vs. Example 5 and Example 7 vs. Example 8 shown in Table 2).

The hole transporting layer (HTM) may have good hole transporting properties (e.g., HOMO 5.16 eV). The electron blocking layer (EBL) may have a shallow LUMO level (e.g., 1.84 eV) to prevent electron leakage to HTL and high T1 energy (e.g., 452 nm) enough to prevent any exciton leakage from EML into HTL and reasonable hole transporting properties (e.g., HOMO 5.38 eV).

In embodiments of the disclosed subject matter, EBL T1 may be higher than T1 of the emitter. Host (Host 1) may provide electron transport through the EML (e.g., LUMO 2.88 eV), as well as hole transport (e.g., HOMO 5.43 eV), in the absence of emitters with shallower HOMO levels. Embodiments of the disclosed subject matter may include one or more hosts (e.g., single host dual host, or the like).

Shallow HOMO emitters e.g., RD2-(HOMO 5.05 eV), may provide more hole trap and deep HOMO emitters e.g. RD1 (HOMO 5.32 eV) may provide more hole transport through the EML. This may shift the recombination zone in the EML depending on the emitter. In case with deep HOMO emitters, the recombination zone may be shifted toward HBL. The HBL effect on the device efficiency may be more pronounced with RD1 deep HOMO emitter. RD2 may provide more hole trapping, resulting in less hole transport through the EML, so RZ may be shifted toward the EBL interface. The EBL may affect the efficiency of the RD2 emitter device.

The HOMO for deep HOMO emitters may be in the range of 5.1-5.6 eV, more preferable 5.15-5.55 eV, even more preferable 5.2-5.5 eV.

Hole trapping may be a function of the emitter-host HOMO energy gap. The HBL for emitter-host energy gap may be less than 0.15 eV. The hole blocking material (HBM) may have a deep HOMO (5.96 eV), which may block holes from leaking into ETL, and may have high T1 energy (e.g., 484 nm) to prevent exciton leakage into ETL. In embodiments of the disclosed subject matter, the HBL may have a HOMO level deeper than 5.5 eV.

The ETM may provide electron transport through the ETL toward the EML (e.g., LUMO 2.71 eV).

The combination of the deep HOMO emitter R1 and the HBL in the devices and/or structures of the disclosed subject matter may provide increased efficiency, minimal efficiency roll off, and increased power efficiency.

Embodiments of the disclosed subject matter may provide the following types of red emitters with deep HOMO:

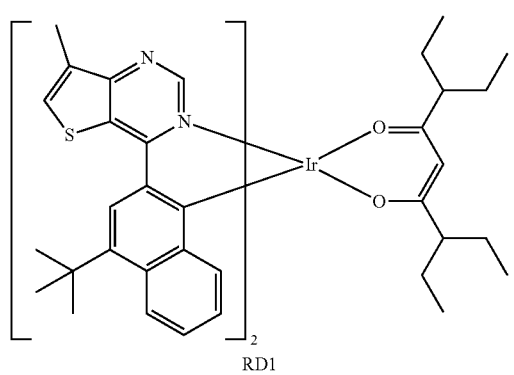

RD1
HOMO 5.32 eV

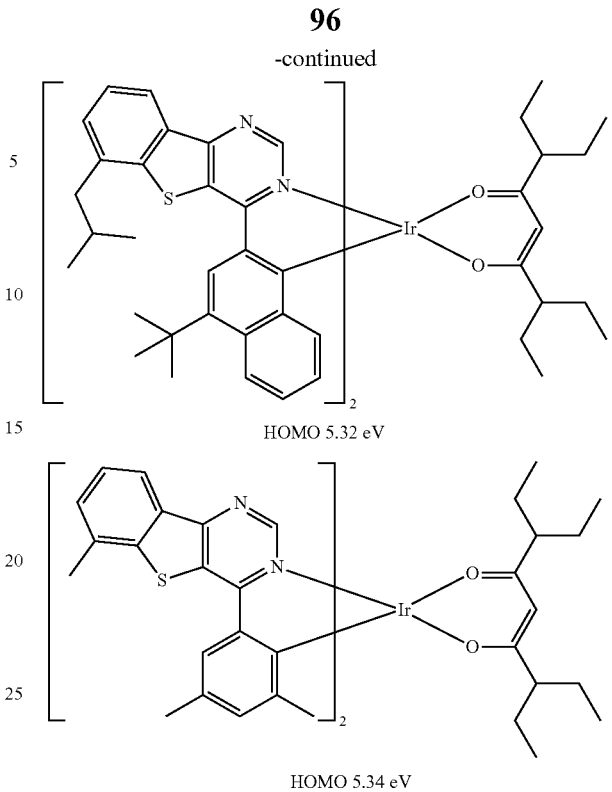

HOMO 5.32 eV

HOMO 5.34 eV

Embodiments of the disclosed subject matter may provide deep HOMO red ligand structures for emissive ligand:

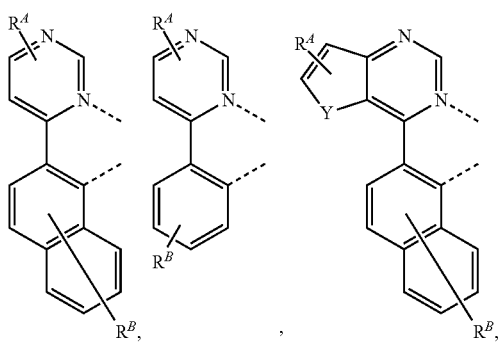

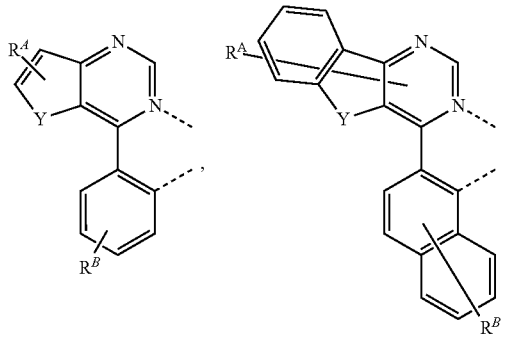

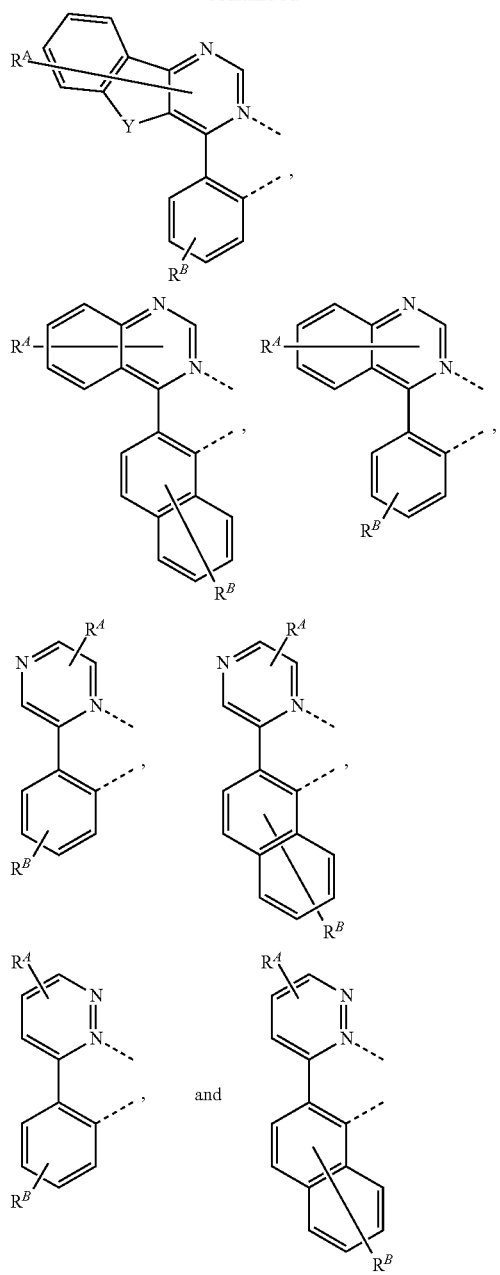
CF3 containing ancillary ligand may provide deeper HOMO:
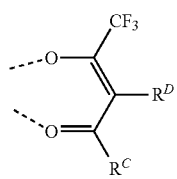
The above may be combined with one or more other emissive ligands to shift the HOMO by 0.1 to 0.15 eV (or more, there are a plurality of CF3 groups).
In some embodiments, the OLED may include at least one emitter selected from the group of emitters shown below.
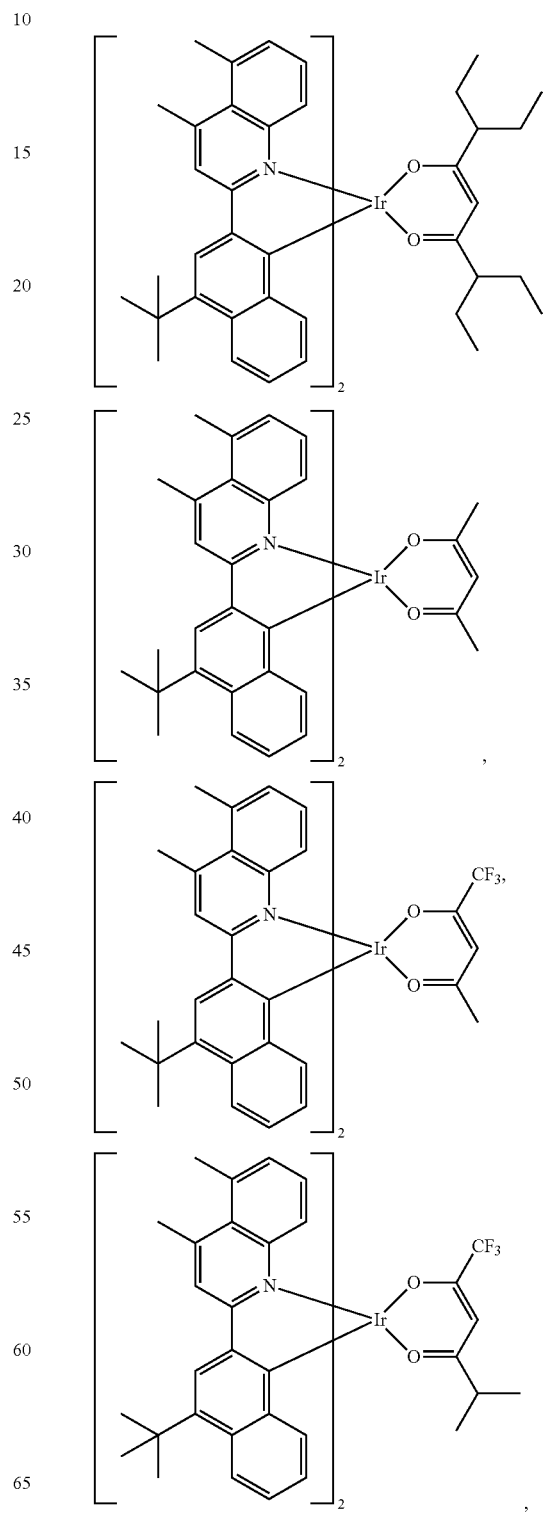

99
-continued
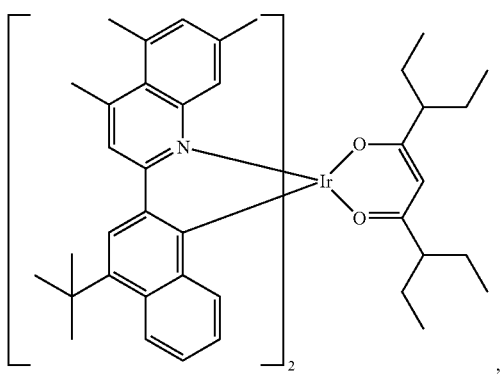
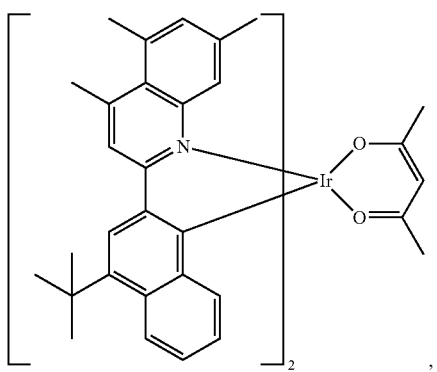
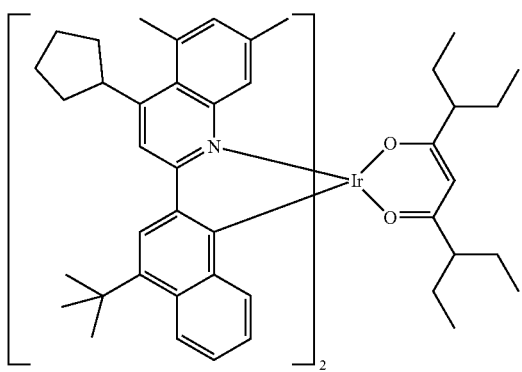
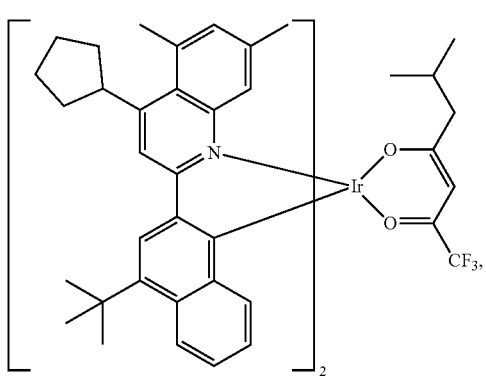
100
-continued
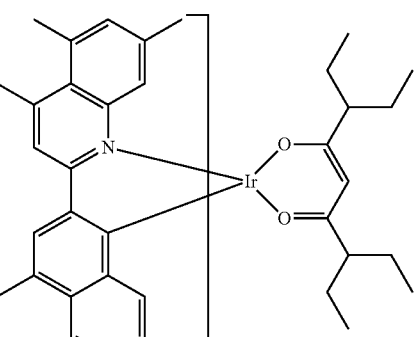
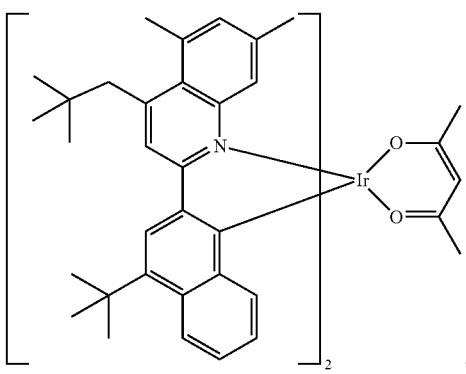
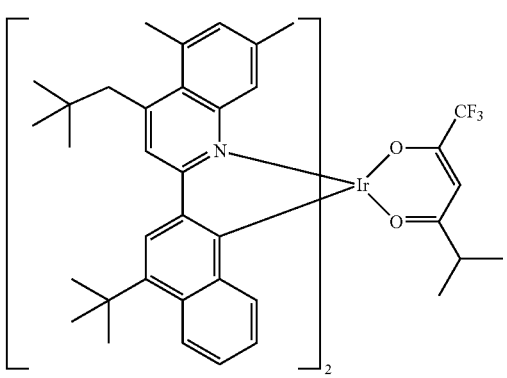
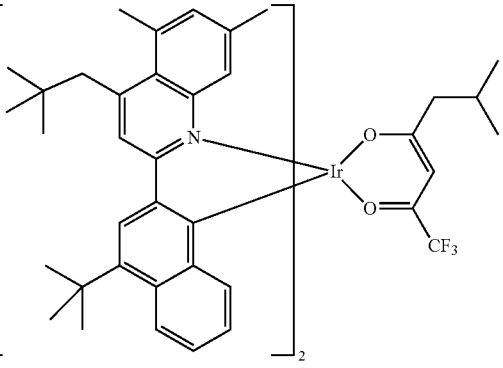

101
-continued
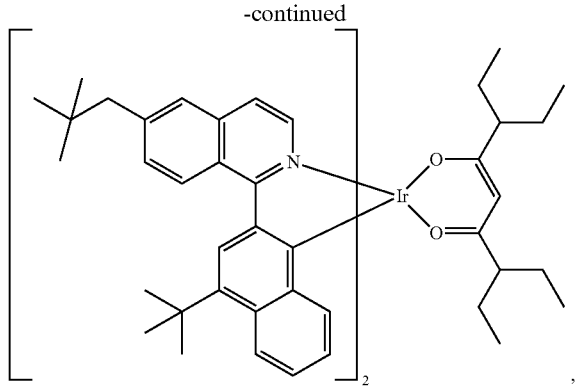
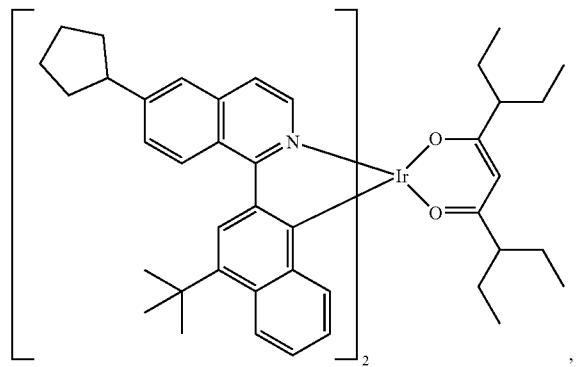
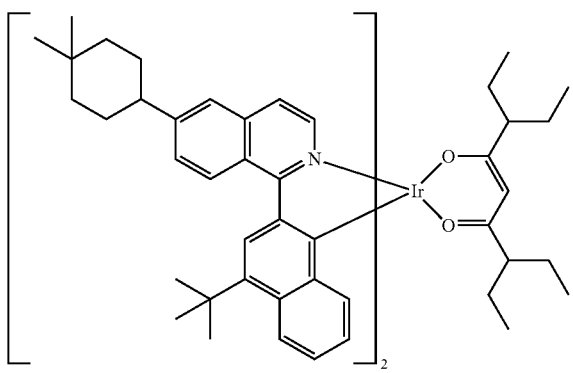
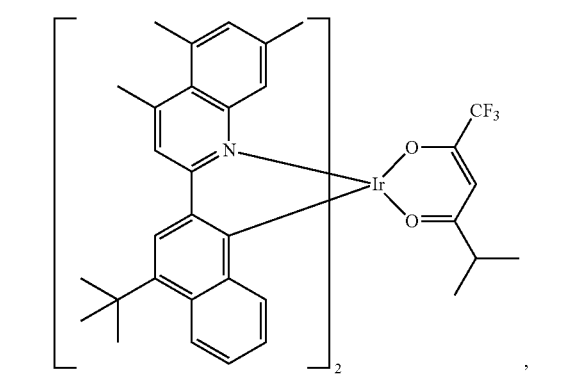
102
-continued
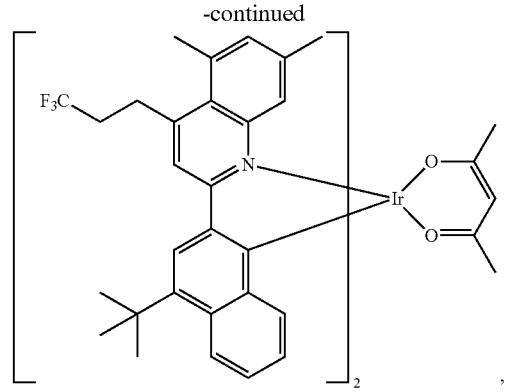
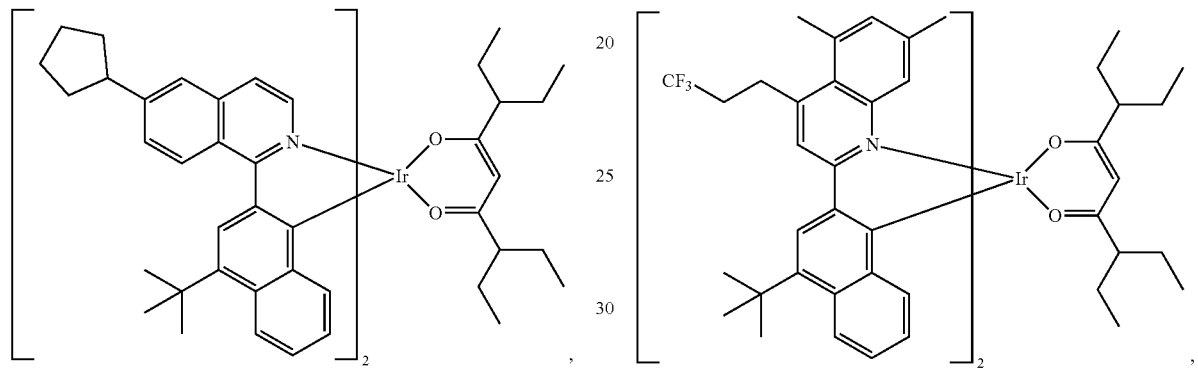
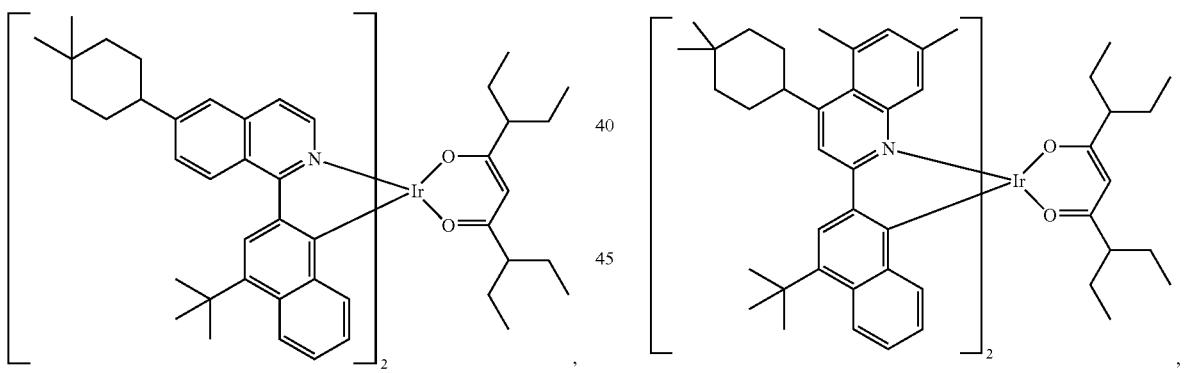
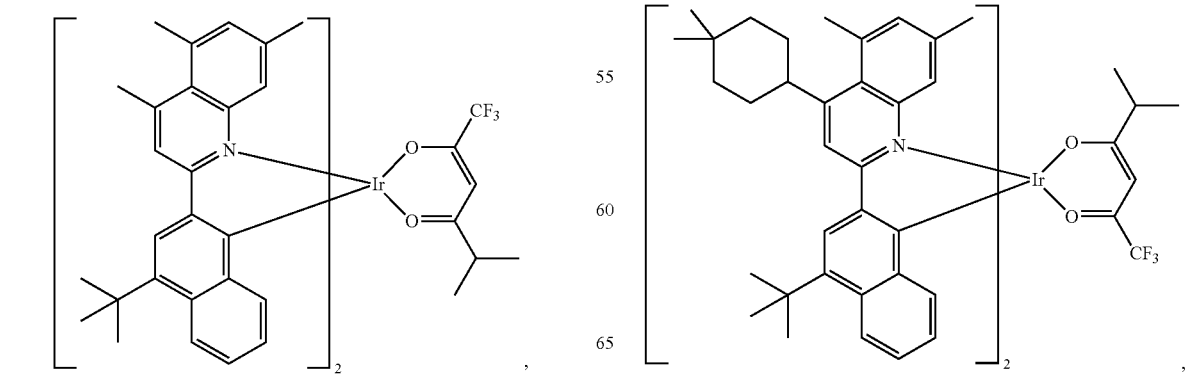

103
-continued
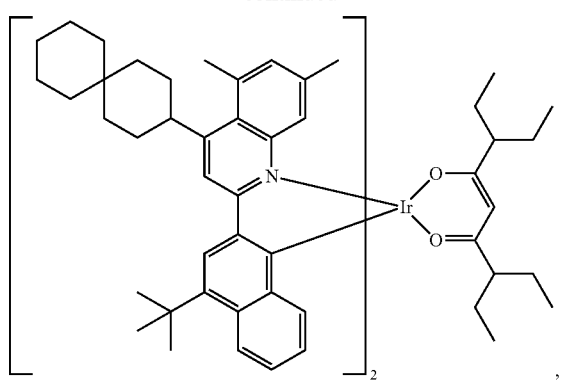
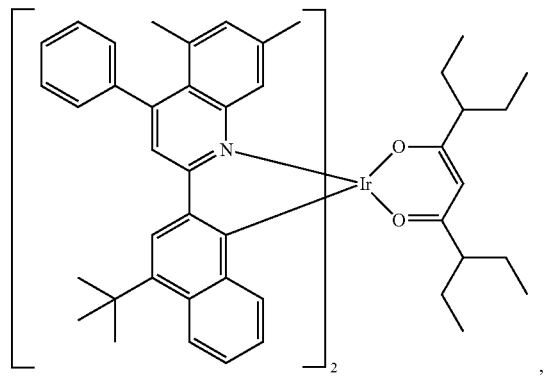
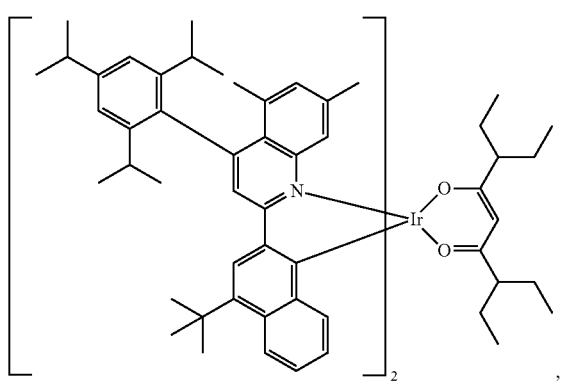
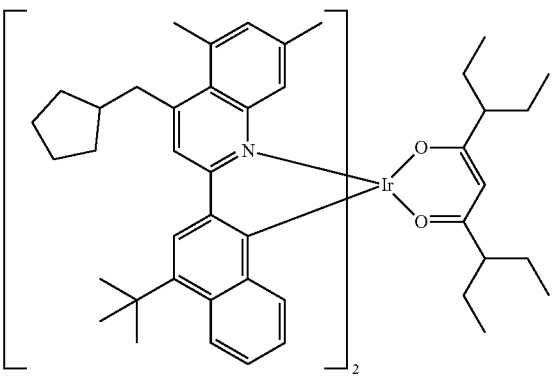
104
-continued
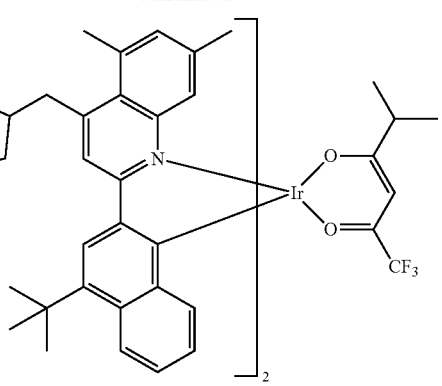
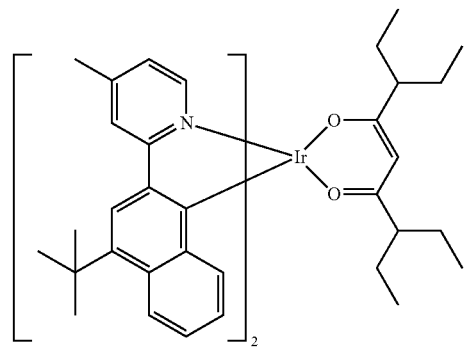
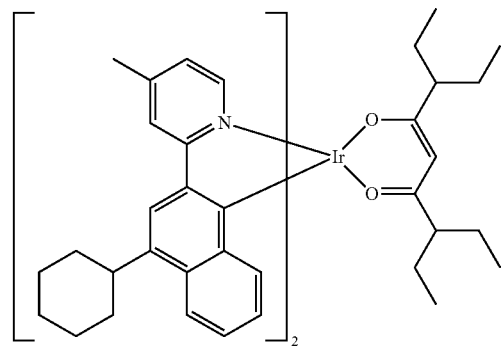
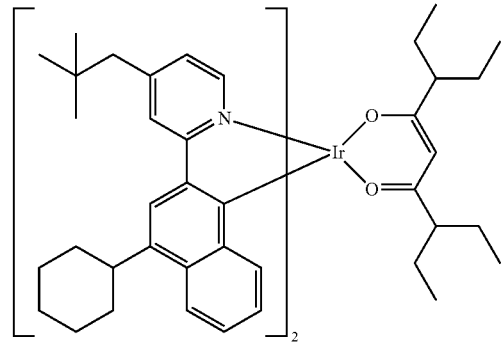

105
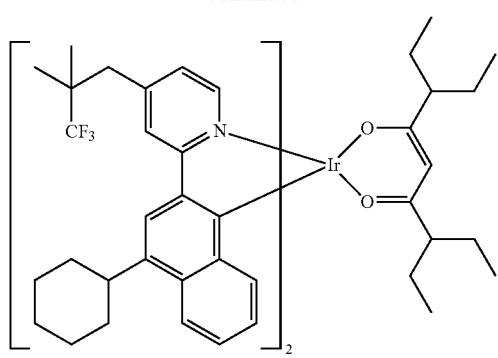
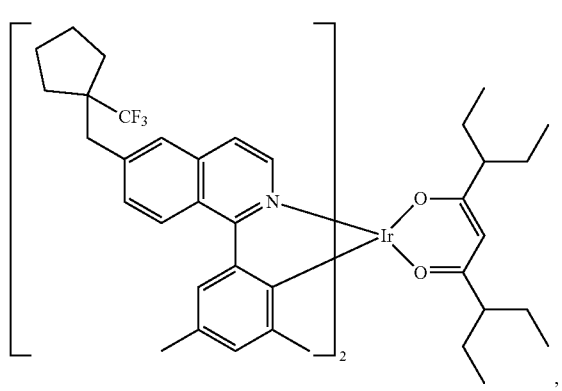
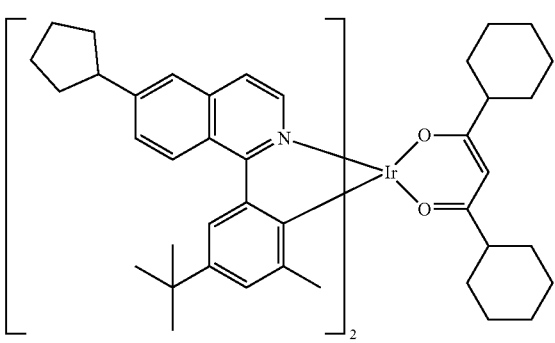
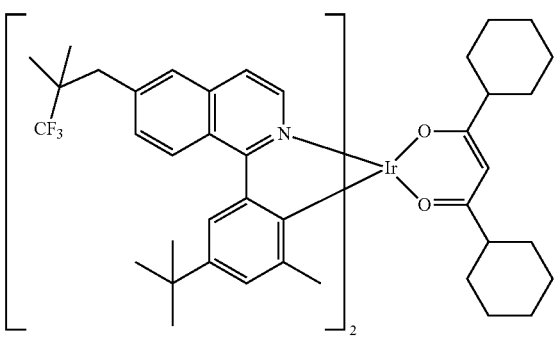
106
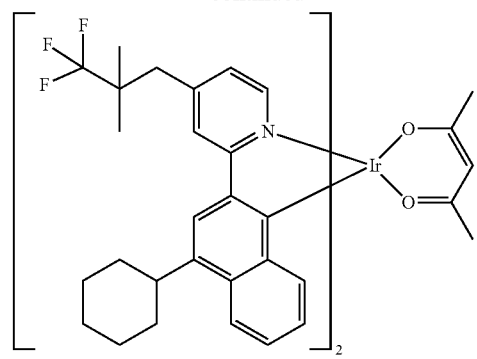
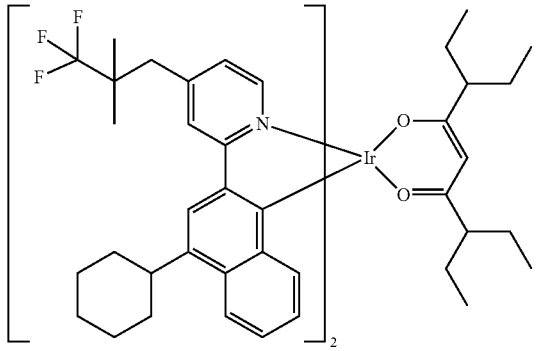
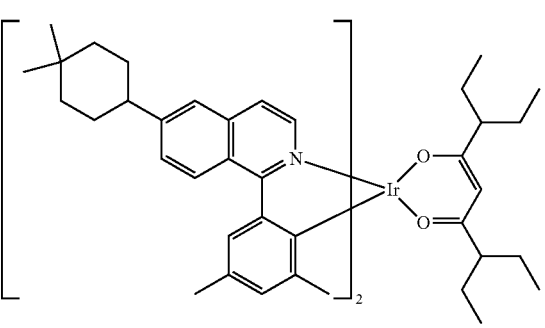
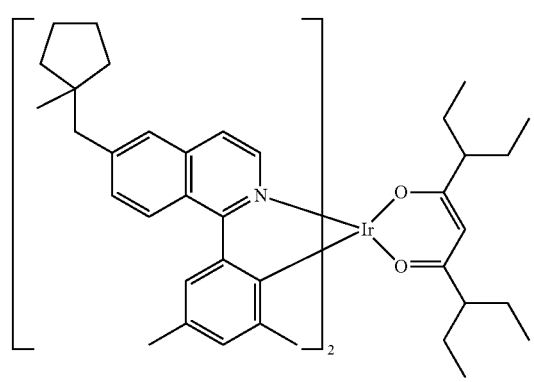

107

-continued

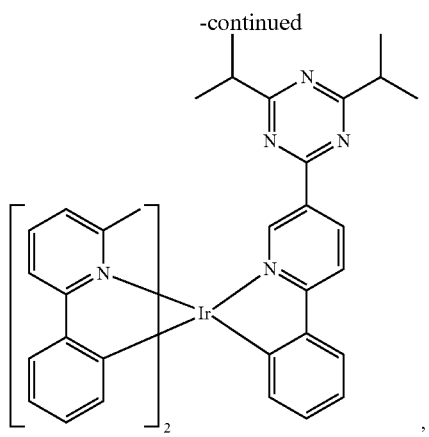

,

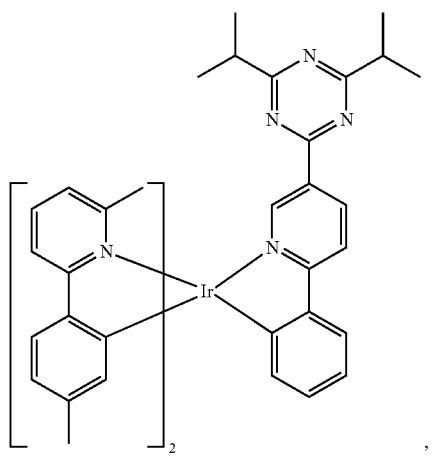

,

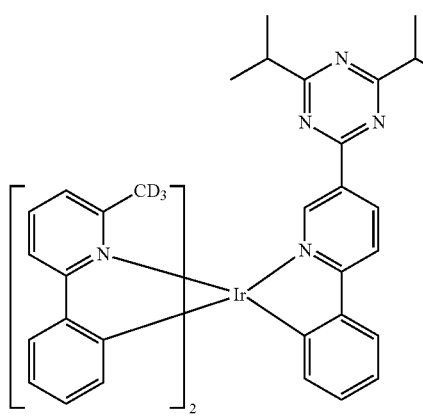

,

108

-continued

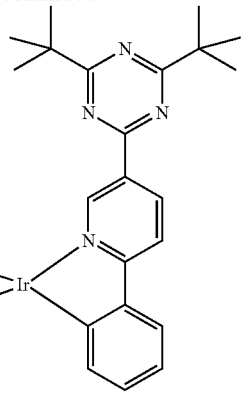

, and

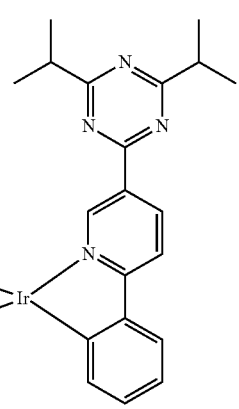

.

Additional device data was obtained to show the blocking layer material and hosts classes of the compounds that may provide improvement of the performance of deep HOMO red emitter devices with a blocking layer. Two hosts, single Host 1 and dual Host 2:Host 3 (4:1), and three blocking layer materials (e.g., HBL1, HBL2, HBL3) were used in the devices with deep HOMO emitter RD1 and shallow HOMO emitter RD2. Both emitters have approximately same color saturation, but different type of energy levels.

Figure 7:
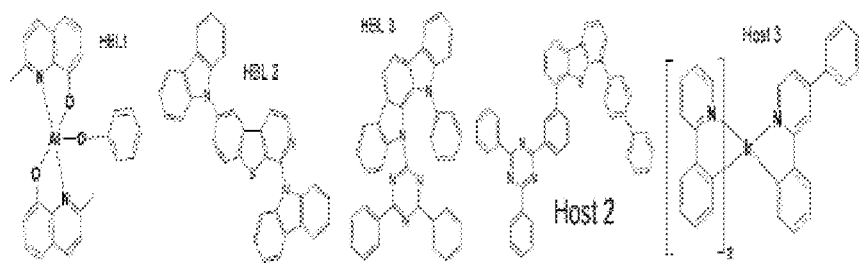
FIG. 7 shows device materials according to embodiments of the disclosed subject matter.

The device fabrication is the same as described above, and FIG. 7 shows device materials according to embodiments of the disclosed subject matter.

Experimental data are summarized below in Table 4, which shows the correlation of the device EQE and the blocking layer in the device.

TABLE 4

Device performance of additional experiments. HBL effect on EQE of deep HOMO red emitter structures.

| Device Example | EBL | Host | Emitter 3% | HBL | 1931 CIE x | 1931 CIE y | EQE at 10 mA/cm$^2$ [%] |
|---|---|---|---|---|---|---|---|
| Example 9 | EBM | Host 1 | RD1 | HBL1 | 0.685 | 0.315 | 20.1 |
| Example 10 | EBM | Host 1 | RD1 | HBL2 | 0.685 | 0.315 | 20.1 |
| Example 11 | EBM | Host 1 | RD1 | HBL3 | 0.684 | 0.315 | 19.5 |
| Example 12 | EBM | Host 1 | RD1 | | 0.685 | 0.314 | 18.2 |
| Example 13 | EBM | Host 2: Host 3 (4:1) | RD1 | HBL1 | 0.674 | 0.325 | 23.7 |
| Example 14 | EBM | Host 2: Host 3 (4:1) | RD1 | HBL2 | 0.673 | 0.326 | 24.3 |
| Example 15 | EBM | Host 2: Host 3 (4:1) | RD1 | HBL3 | 0.673 | 0.326 | 24.1 |
| Example 16 | EBM | Host 2: Host 3 (4:1) | RD1 | | 0.674 | 0.325 | 22.2 |
| Example 17 | EBM | Host 1 | RD2 | HBL1 | 0.683 | 0.316 | 24.0 |
| Example 18 | EBM | Host 1 | RD2 | HBL2 | 0.683 | 0.316 | 23.5 |
| Example 19 | EBM | Host 1 | RD2 | HBL3 | 0.683 | 0.316 | 24.1 |
| Example 20 | EBM | Host 1 | RD2 | | 0.683 | 0.316 | 24.0 |
| Example 21 | EBM | Host 2: Host 3 (4:1) | RD2 | HBL1 | 0.671 | 0.328 | 24.8 |
| Example 22 | EBM | Host 2: Host 3 (4:1) | RD2 | HBL2 | 0.672 | 0.327 | 25.4 |
| Example 23 | EBM | Host 2: Host 3 (4:1) | RD2 | HBL3 | 0.672 | 0.327 | 25.2 |
| Example 24 | EBM | Host 2: Host 3 (4:1) | RD2 | | 0.669 | 0.330 | 24.9 |

The EQE of the devices with deep HOMO RD1 emitter may be affected by a BL (blocking layer), which may be about 10% higher, versus the EQE of a device without a BL. For a single host, as shown in examples 9, 10, and 11, the EQE with the blocking layer structures may be about 20%. In contrast, Example 12 shows that reference structure without a BL may have an EQE about 18%.

Dual host devices with the RD1 deep HOMO emitter may be similarly affected by the BL. In examples 13, 14, and 15, the BL structures have an EQE about 24%. In example 16, devices with no BL structures may have an EQE-22%.

The EQE of the device with the RD2 shallow HOMO emitter may not be affected by HBL. In single host examples 17, 18, and 19, BL devices may have similar EQE to the EQE of devices without the BL (e.g., Example 20, where the EQE is about 24%). The EQE of the dual host devices including BL, such as in examples 21, 22, and 23, may be similar to the EQE of the devices without the BL of Example 24 (e.g., about 25%).

Different classes of BL materials may be used with the HOMO emitters. Examples BL1, BL2, BL3, and/or HBM may belong to the following classes of the materials: Aluminum Quinoline complexes, Aza-dibenzothiopene derivatives, Indolo[2,3-a] carbazole derivatives, 4,6-disubstituted Dibenzothiophenes. These different classes may work as BL materials for deep HOMO red emitter PHOLED devices.

The energy levels of additional hosts and blocking layers are shown above in Table 3. Table 3 shows the energy levels of all the materials used in the device examples.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

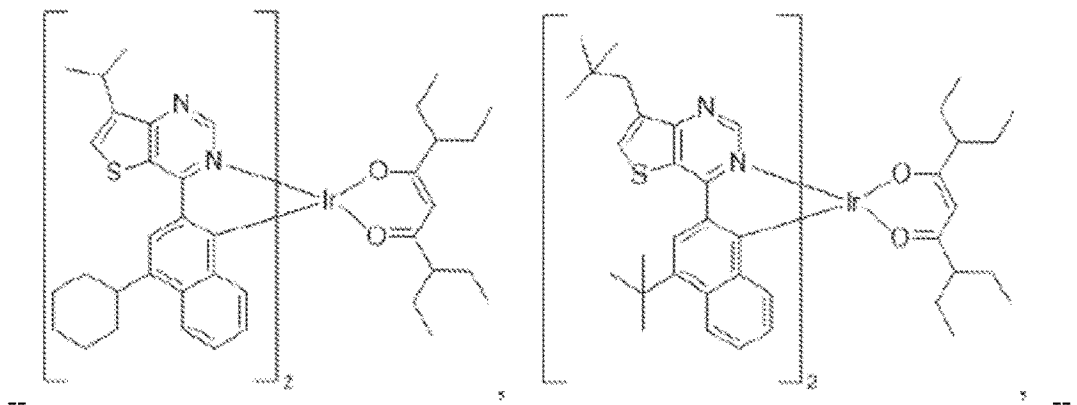
In Claim 16, Column 164, after Line 12, insert the following structures:
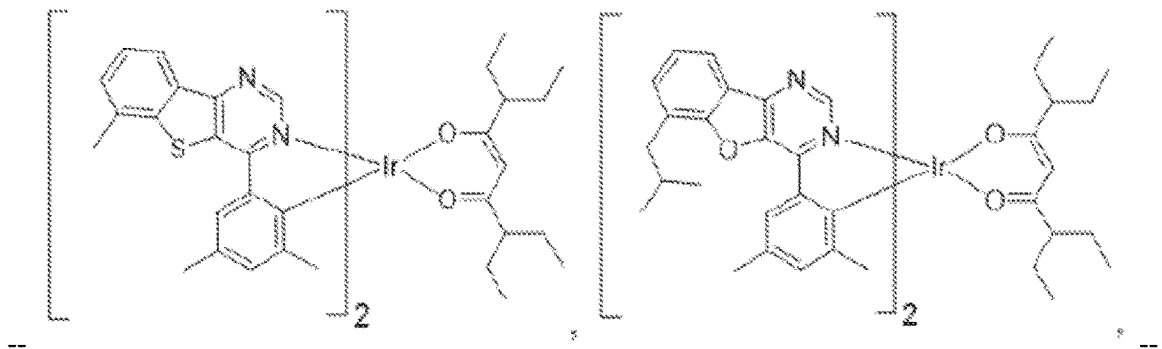

We claim:

1. An organic light emitting diode (OLED) comprising:
   an anode;
   a cathode;
   an emissive layer disposed between the anode and the cathode; and
   a hole blocking layer disposed between the emissive layer and the cathode,
   wherein the emissive layer comprises a phosphorescent dopant,
   wherein the phosphorescent dopant has an emission with a peak maximum wavelength greater than or equal to 600 nm when measured at room temperature in 0.5% doped PMMA (Poly(methyl methacrylate)) thin film,
   wherein the energy of a highest occupied molecular orbital (HOMO) of the phosphorescent dopant is lower than or equal to −5.1 eV, and
   wherein the energy of the HOMO of the hole blocking layer is at least 0.1 eV lower than the energy of the HOMO of the phosphorescent dopant.

2. The OLED of claim 1, wherein the peak maximum wavelength of the phosphorescent dopant is selected from the group consisting of: greater than or equal to 610 nm, greater than or equal to 620 nm, greater than or equal to 630 nm, greater than or equal to 650 nm, greater than or equal to 700 nm, greater than or equal to 750 nm, and greater than or equal to 800 nm.

3. The OLED of claim 1, wherein the energy of the HOMO of the phosphorescent dopant is selected from the group consisting of: lower than or equal to −5.2 eV, lower than or equal to −5.3 eV, and lower than or equal to −5.4 eV.

4. The OLED of claim 1, wherein the energy of the HOMO of the hole blocking layer is selected from the group consisting of: at least 0.2 eV lower than the energy of the HOMO of the phosphorescent dopant, at least 0.3 eV lower than the energy of the HOMO of the phosphorescent dopant, and at least 0.4 eV lower than the energy of the HOMO of the phosphorescent dopant.

5. The OLED of claim 1, wherein the hole blocking layer comprises a compound of Formula I, which is at least one selected from the group consisting of:

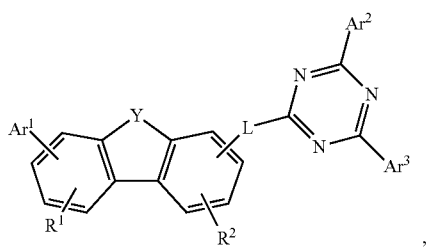

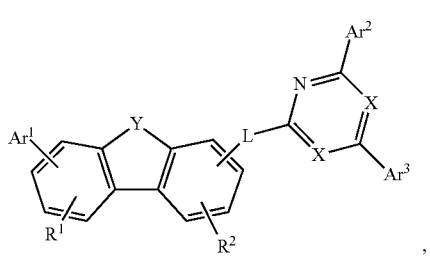

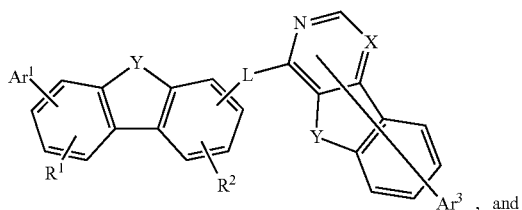

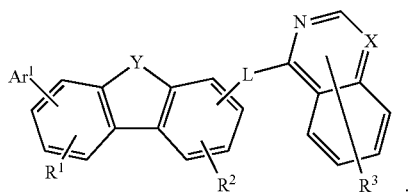

wherein $R^1$ and $R^2$ each independently represent mono to the maximum allowable substitution, or no substitution, wherein each $R^1$ and $R^2$ is independently a hydrogen or a substituent selected from the group consisting of: deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, wherein Y is selected from the group consisting of: O, S, Se, $NAr^4$, $CAr^4Ar^5$, $SiAr^4Ar^5$, Fluorene ($C-Ar^1Ar^2$), and Silicon ($Si-Ar^1Ar^2$), and wherein $Ar^1$ and $Ar^2$ are the same or different aryl groups, wherein each $Ar^1$-$Ar^5$ is independently selected from the group consisting of: aryl, heteroaryl, and a combination thereof, and wherein L is a direct bond or a linker comprising at least one aromatic ring.

6. The OLED of claim 5, wherein each $R^1$ and $R^2$ is independently a hydrogen or a substituent selected from the group consisting of: aryl, heteroaryl, and combinations thereof.

7. The OLED of claim 5, wherein Y is selected from the group consisting of O, S, and $NAr^4$.

8. The OLED of claim 5, wherein the compound of Formula I is at least one selected from the group consisting of:

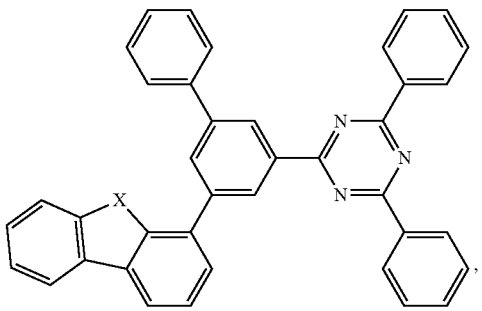

Compound A1 through A3, each represented by the formula
wherein in Compound A1: X = O,
in Compound A2: X = S,
in Compound A3: X = Se

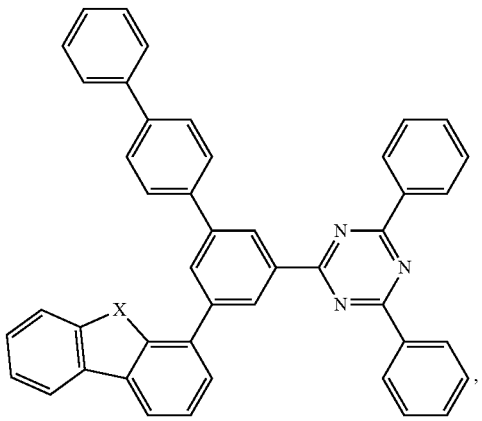

Compound A4 through A6, each represented by the formula
wherein in Compound A4: X = O,
in Compound A5: X = S,
in Compound A6: X = Se

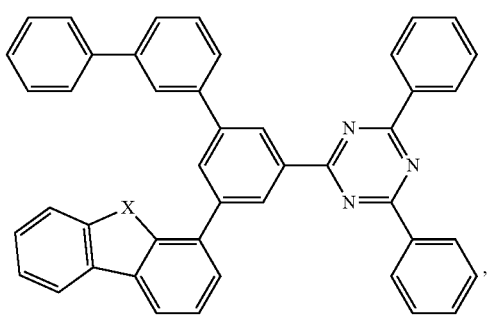

Compound A7 through A9, each represented by the formula
wherein in Compound A7: X = O,
in Compound A8: X = S,
in Compound A9: X = Se -continued

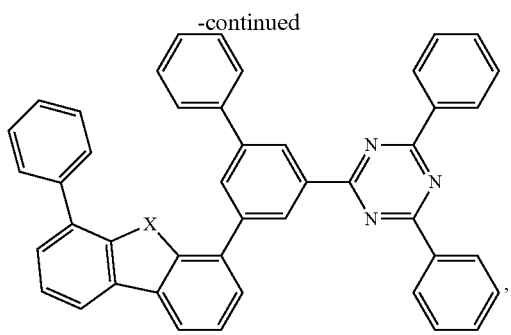

Compound A10 through A12, each represented by the formula
wherein in Compound A10: X = O,
in Compound A11: X = S,
in Compound A12: X = Se

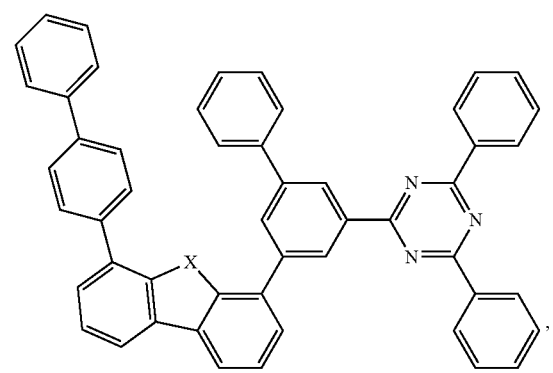

Compound A13 through A15, each represented by the formula
wherein in Compound A13: X = O,
in Compound A14: X = S,
in Compound A15: X = Se

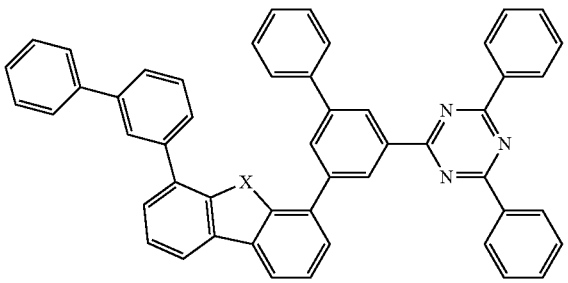

Compound A16 through A18, each represented by the formula
wherein in Compound A16: X = O,
in Compound A17: X = S,
in Compound A18: X = Se -continued

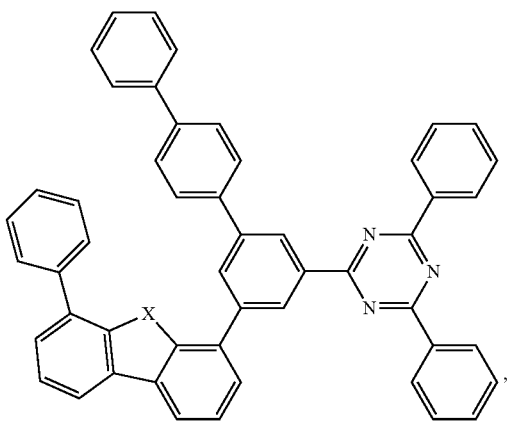

Compound A19 through A21, each represented by the formula
wherein in Compound A19: X = O,
in Compound A20: X = S,
in Compound A21: X = Se

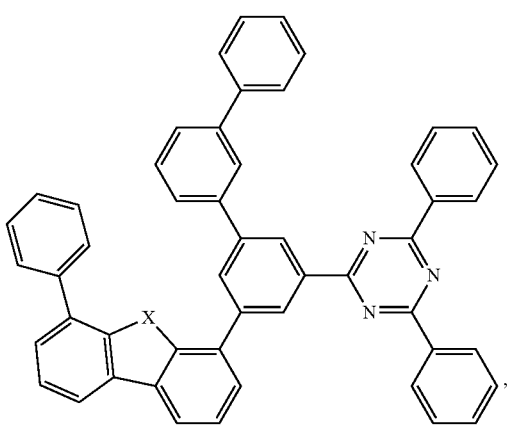

Compound A22 through A24, each represented by the formula
wherein in Compound A22: X = O,
in Compound A23: X = S,
in Compound A24: X = Se

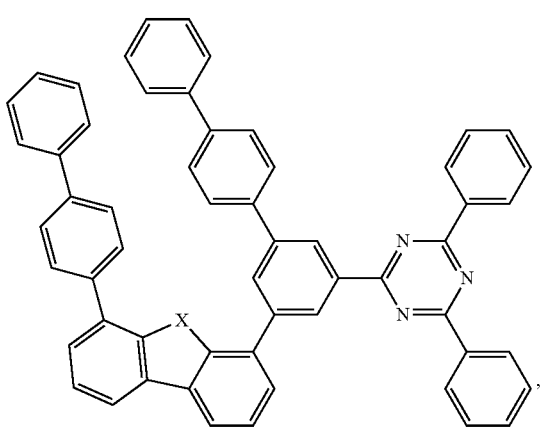

Compound A25 through A27, each represented by the formula
wherein in Compound A25: X = O,
in Compound A26: X = S,
in Compound A27: X = Se

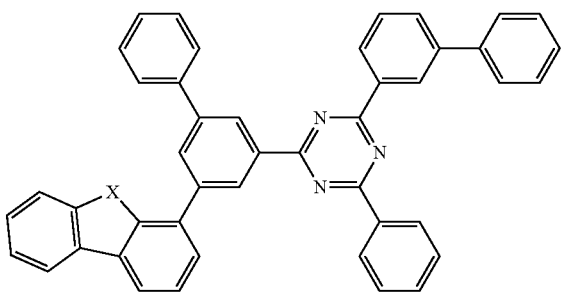

Compound A28 through A30, each represented by the formula
wherein in Compound A28: X = O,
in Compound A29: X = S,
in Compound A30: X = Se

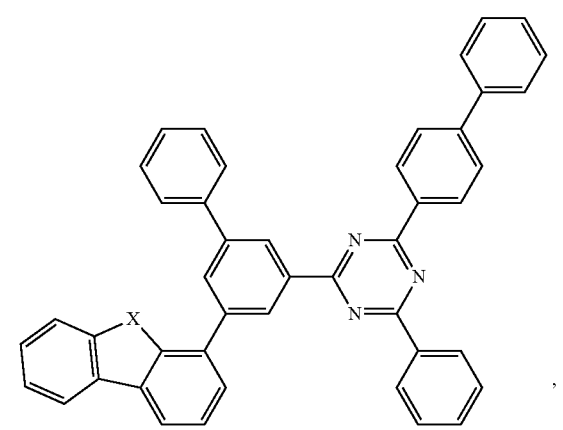

Compound A31 through A33, each represented by the formula
wherein in Compound A31: X = O,
in Compound A32: X = S,
in Compound A33: X = Se

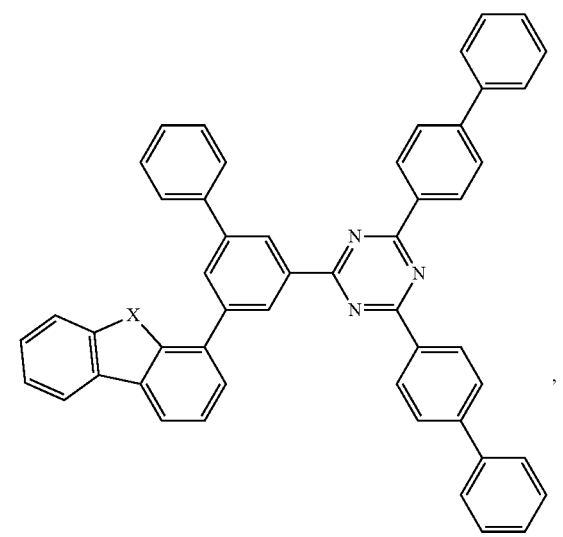

Compound A34 through A36, each represented by the formula
wherein in Compound A34: X = O,
in Compound A35: X = S,
in Compound A36: X = Se

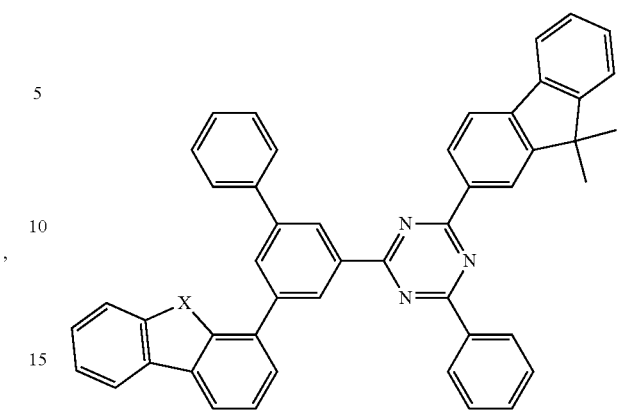

Compound A37 through A39, each represented by the formula
wherein in Compound A37: X = O,
in Compound A38: X = S,
in Compound A39: X = Se

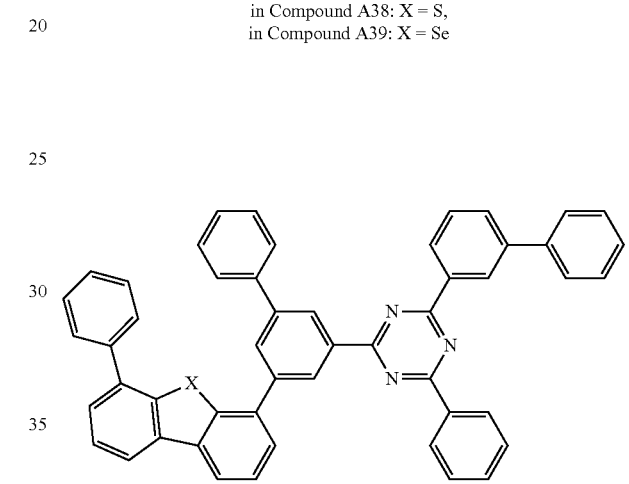

Compound A40 through A42, each represented by the formula
wherein in Compound A40: X = O,
in Compound A41: X = S,
in Compound A42: X = Se

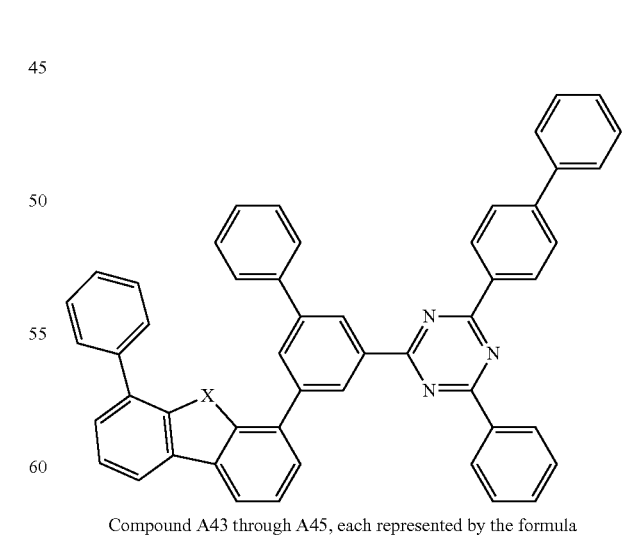

Compound A43 through A45, each represented by the formula
wherein in Compound A43: X = O,
in Compound A44: X = S,
in Compound A45: X = Se

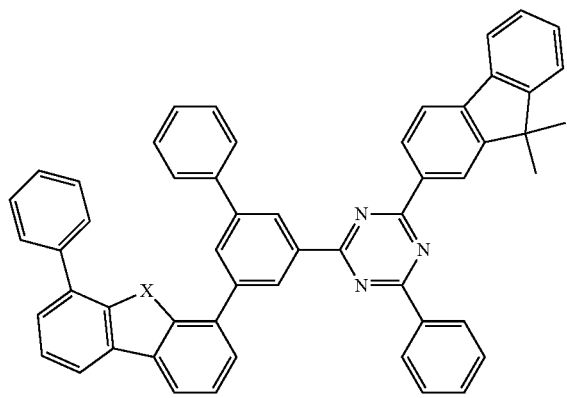

Compound A46 through A48, each represented by the formula
wherein in Compound A46: X = O,
in Compound A47: X = S,
in Compound A48: X = Se

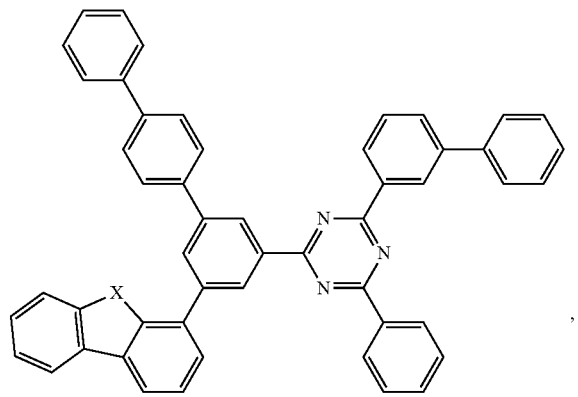

Compound A49 through A51, each represented by the formula
wherein in Compound A49: X = O,
in Compound A50: X = S,
in Compound A51: X = Se

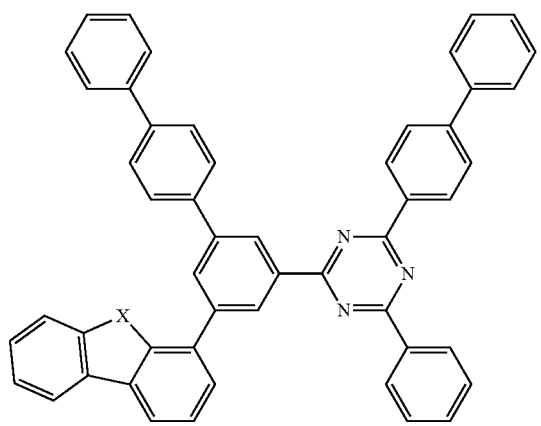

Compound A52 through A54, each represented by the formula
wherein in Compound A52: X = O,
in Compound A53: X = S,
in Compound A54: X = Se

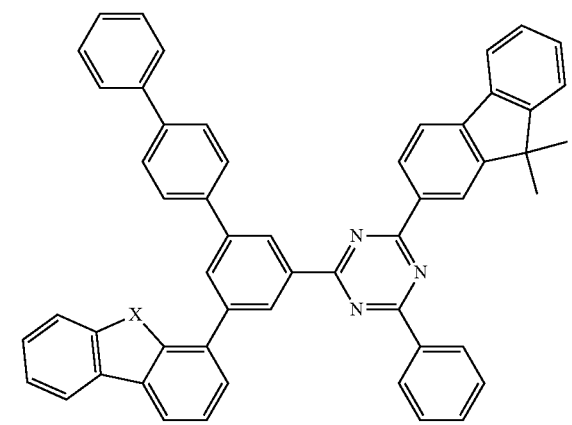

Compound A55 through A57, each represented by the formula
wherein in Compound A55: X = O,
in Compound A56: X = S,
in Compound A57: X = Se

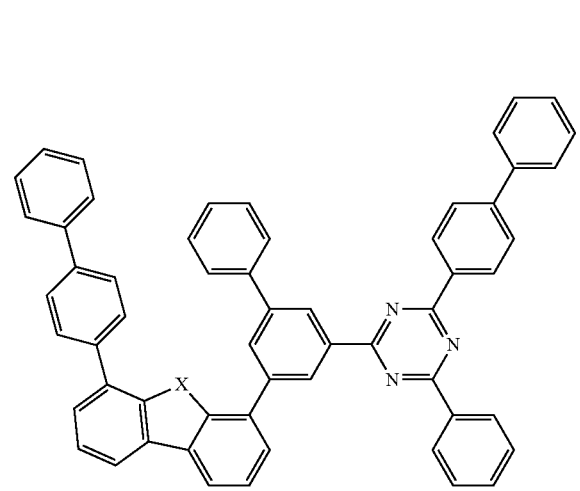

Compound A58 through A60, each represented by the formula
wherein in Compound A58: X = O,
in Compound A59: X = S,
in Compound A60: X = Se Compound A61 through A63, each represented by the formula
wherein in Compound A61: X = O,
in Compound A62: X = S,
in Compound A63: X = Se

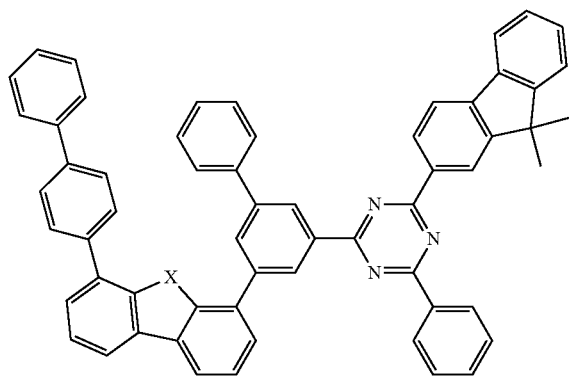

Compound A64 through A66, each represented by the formula
wherein in Compound A64: X = O,
in Compound A65: X = S,
in Compound A66: X = Se

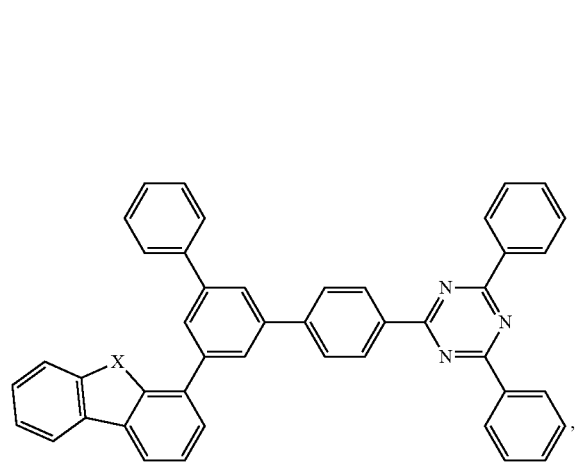

Compound A67 through A69, each represented by the formula
wherein in Compound A67: X = O,
in Compound A68: X = S,
in Compound A69: X = Se

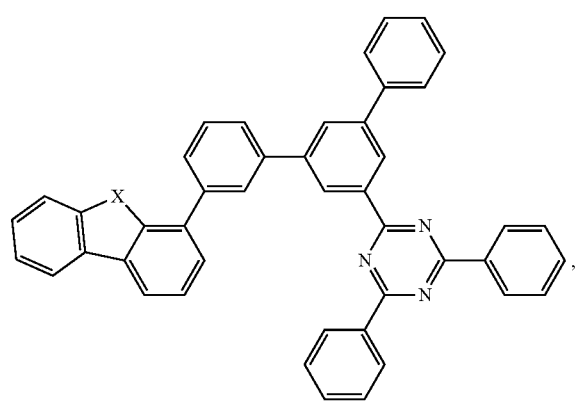

Compound A70 through A72, each represented by the formula
wherein in Compound A70: X = O,
in Compound A71: X = S,
in Compound A72: X = Se

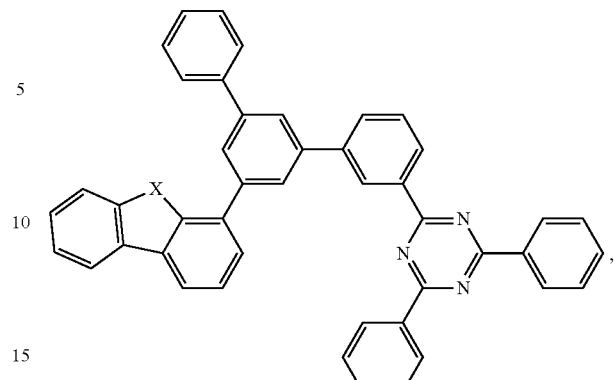

Compound A109 through A111, each represented by the formula
wherein in Compound A109: X = O,
in Compound A110: X = S,
in Compound A11: X = Se

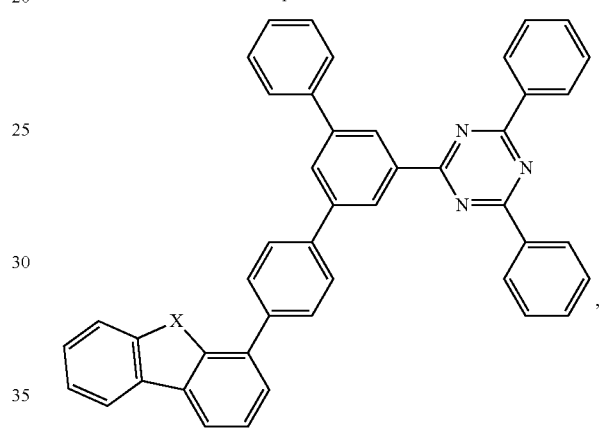

Compound A112 through A114, each represented by the formula
wherein in Compound A112: X = O,
in Compound A113: X = S,
in Compound A114: X = Se

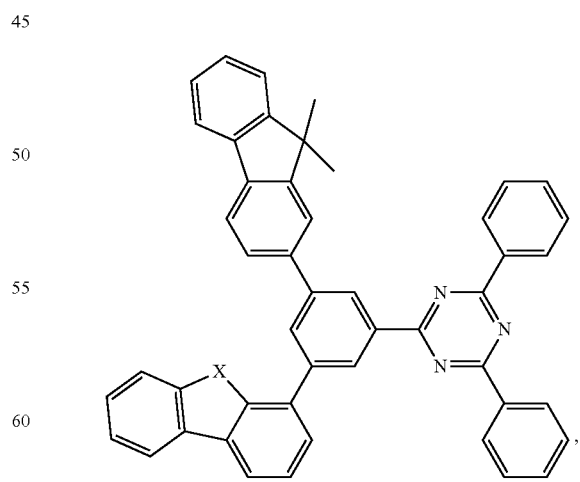

Compound A115 through A117, each represented by the formula
wherein in Compound A115: X = O,
in Compound A116: X = S,
in Compound A117: X = Se Compound B1
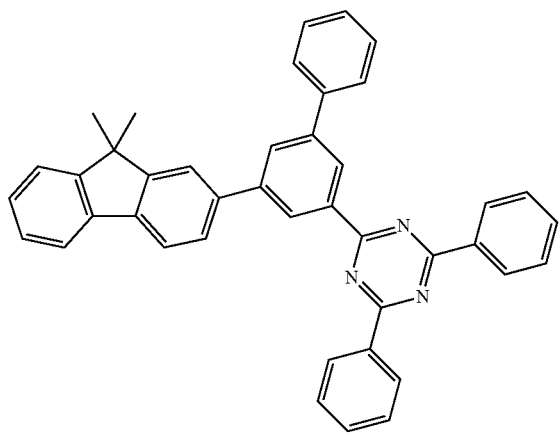
,
Compound B2
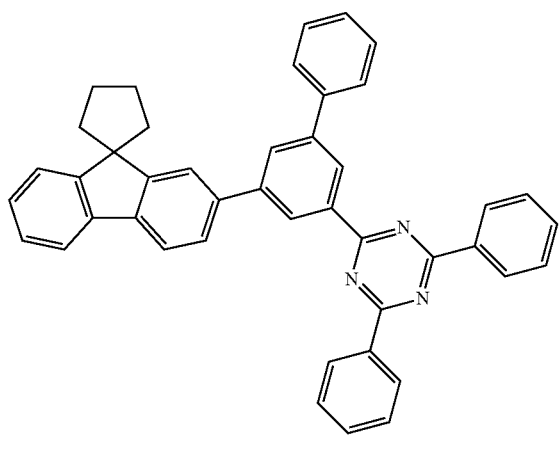
,
Compound B3
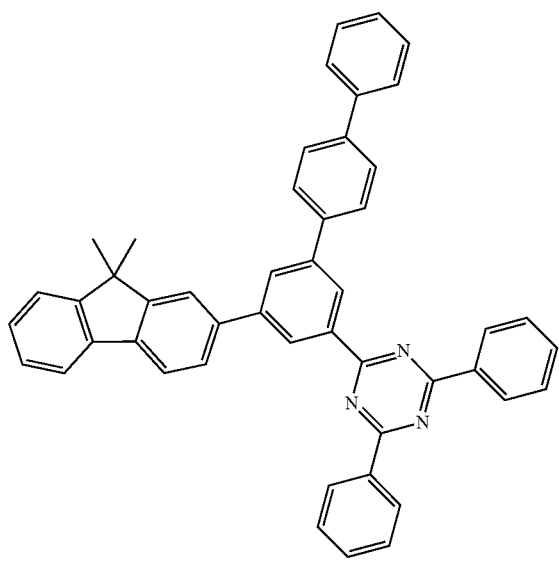
,
Compound B4
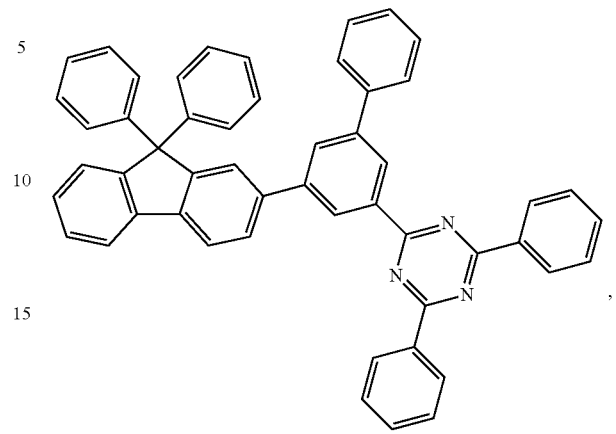
,
Compound B5
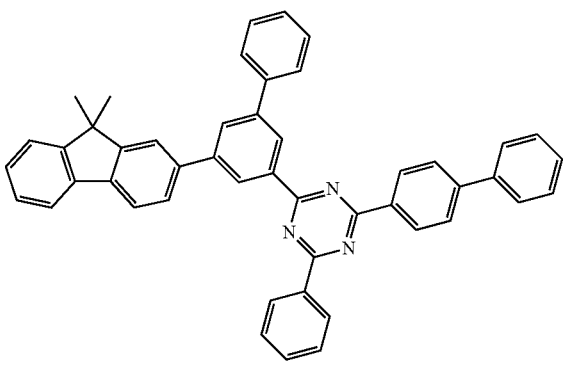
,
Compound B6
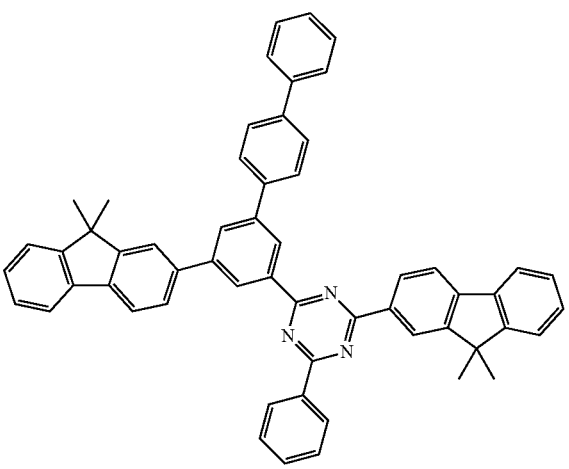
, -continued Compound B7

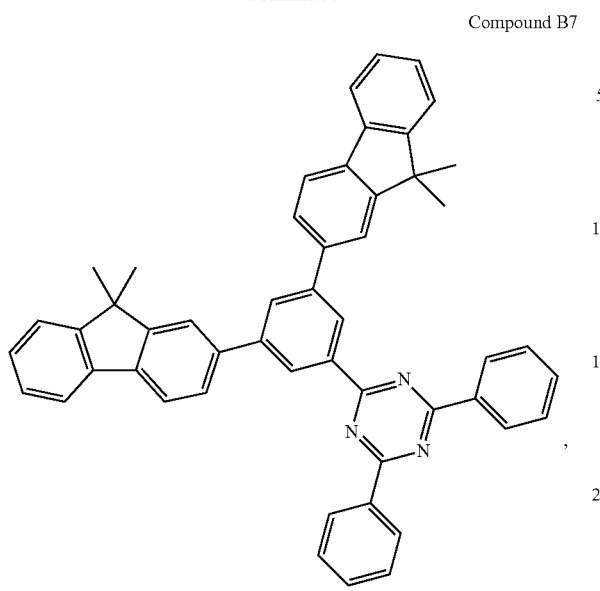

Compound B8

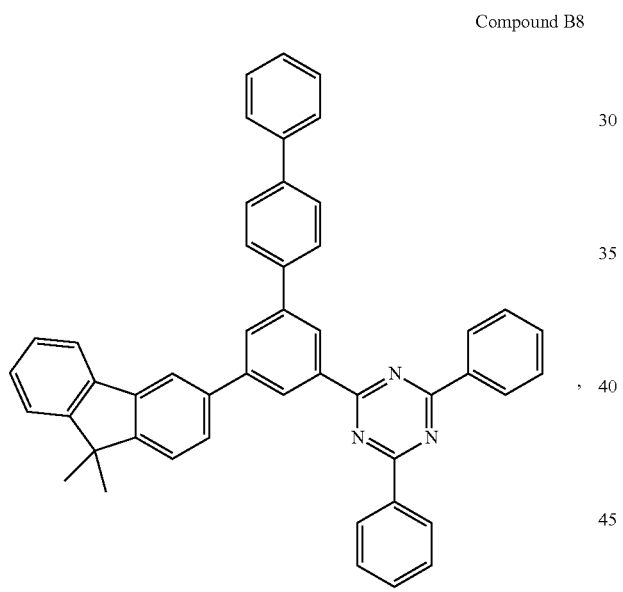

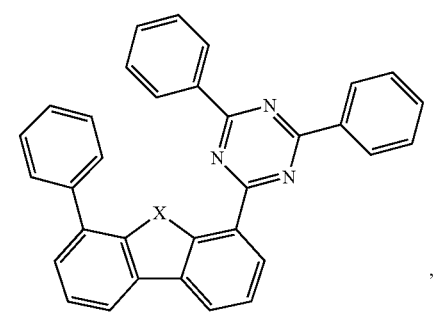

Compound C1 through C3, each represented by the formula
wherein in Compound C1: X = O,
in Compound C2: X = S,
in Compound C3: X = Se -continued

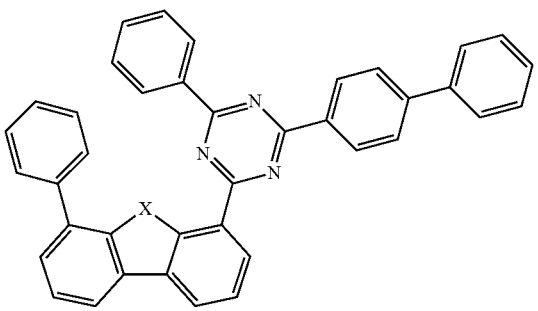

Compound C4 through C6, each represented by the formula
wherein in Compound C4: X = O,
in Compound C5: X = S,
in Compound C6: X = Se

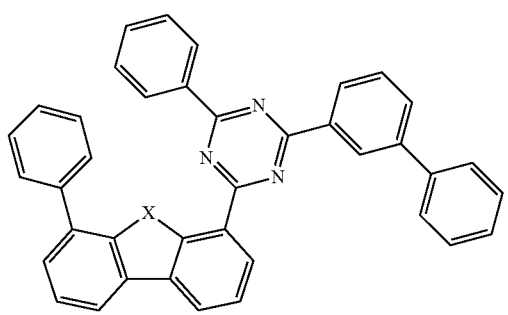

Compound C7 through C9, each represented by the formula
wherein in Compound C7: X = O,
in Compound C8: X = S,
in Compound C9: X = Se

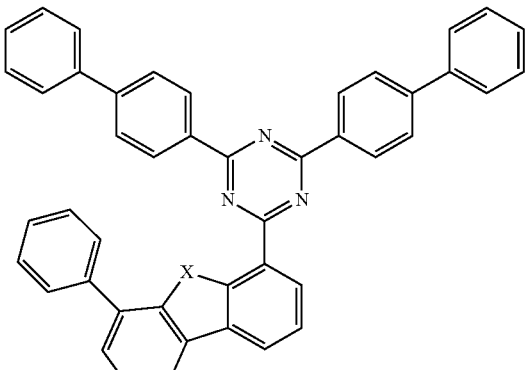

Compound C10 through C12, each represented by the formula
wherein in Compound C10: X = O,
in Compound C11: X = S,
in Compound C12: X = Se -continued

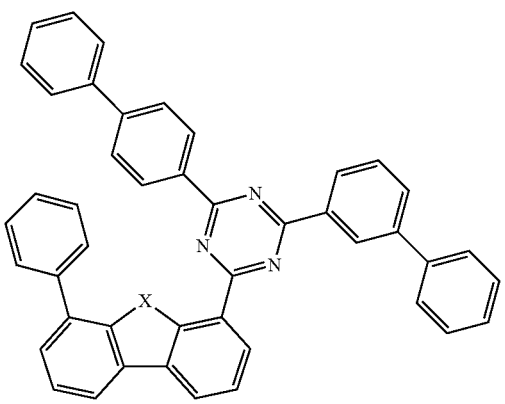

Compound C13 through C15, each represented by the formula
wherein in Compound C13: X = O,
in Compound C14: X = S,
in Compound C15: X = Se

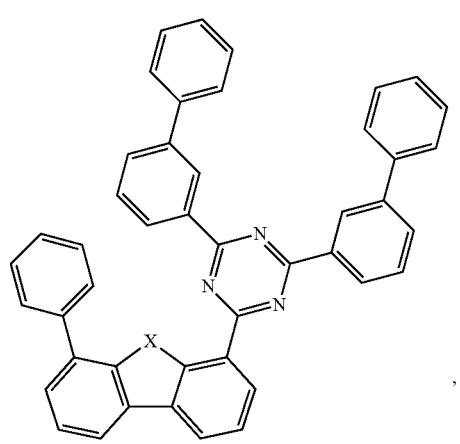

Compound C16 through C18, each represented by the formula
wherein in Compound C16: X = O,
in Compound C17: X = S,
in Compound C18: X = Se

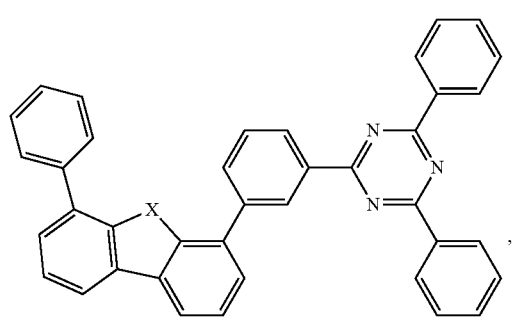

Compound C19 through C21, each represented by the formula
wherein in Compound C19: X = O,
in Compound C20: X = S,
in Compound C21: X = Se -continued

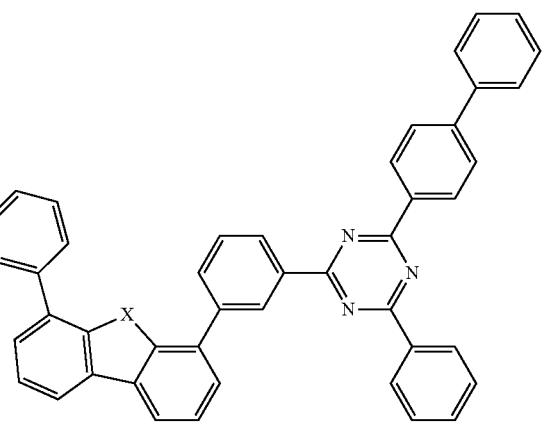

Compound C22 through C24, each represented by the formula
wherein in Compound C22: X = O,
in Compound C23: X = S,
in Compound C24: X = Se

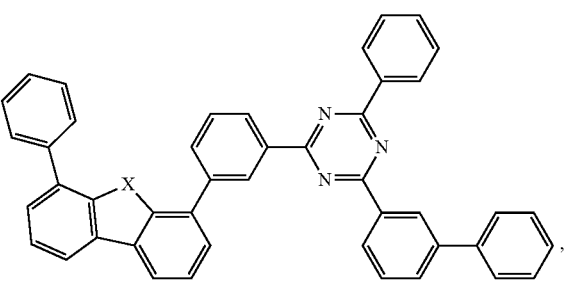

Compound C25 through C27, each represented by the formula
wherein in Compound C25: X = O,
in Compound C26: X = S,
in Compound C27: X = Se

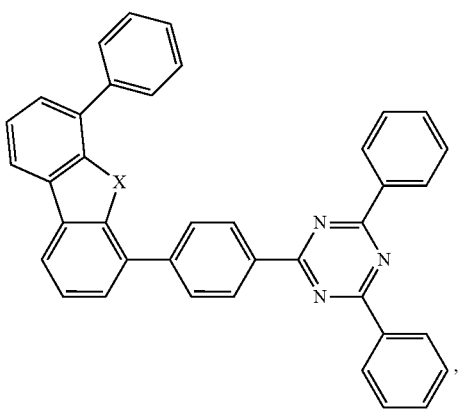

Compound C28 through C30, each represented by the formula
wherein in Compound C28: X = O,
in Compound C29: X = S,
in Compound C30: X = Se

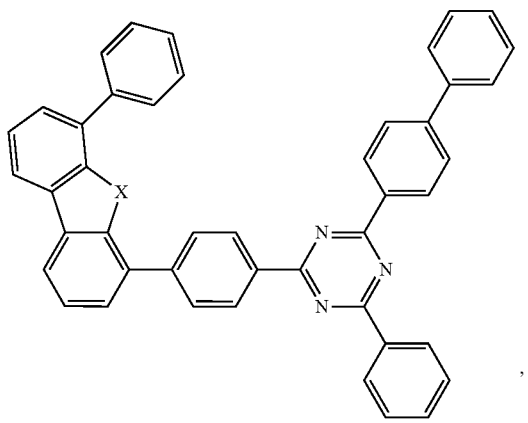

Compound C31 through C33, each represented by the formula
wherein in Compound C31: X = O,
in Compound C32: X = S,
in Compound C33: X = Se

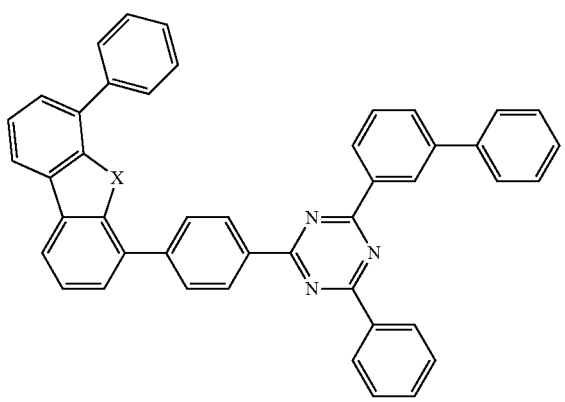

Compound C34 through C36, each represented by the formula
wherein in Compound C34: X = O,
in Compound C35: X = S,
in Compound C36: X = Se

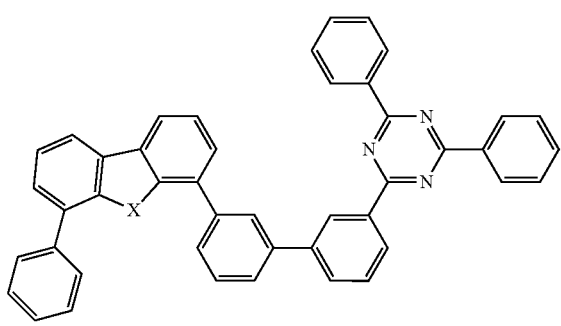

Compound C37 through C39, each represented by the formula
wherein in Compound C37: X = O,
in Compound C38: X = S,
in Compound C39: X = Se

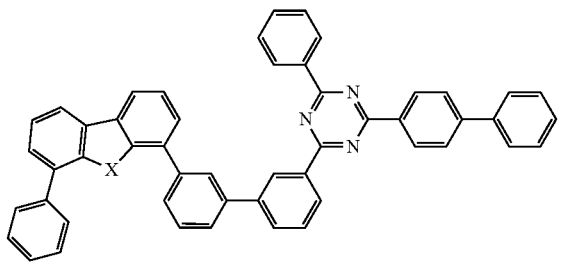

Compound C40 through C42, each represented by the formula
wherein in Compound C40: X = O,
in Compound C41: X = S,
in Compound C42: X = Se

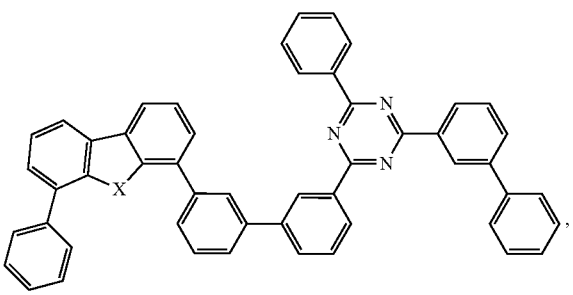

Compound C43 through C45, each represented by the formula
wherein in Compound C43: X = O,
in Compound C44: X = S,
in Compound C45: X = Se

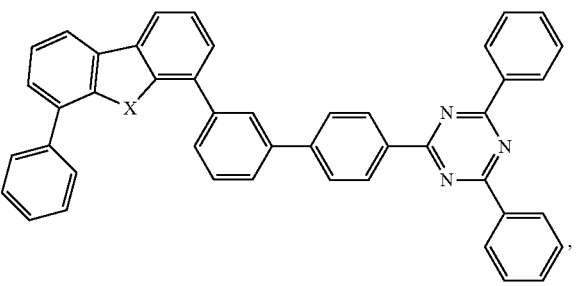

Compound C46 through C48, each represented by the formula
wherein in Compound C46: X = O,
in Compound C47: X = S,
in Compound C48: X = Se

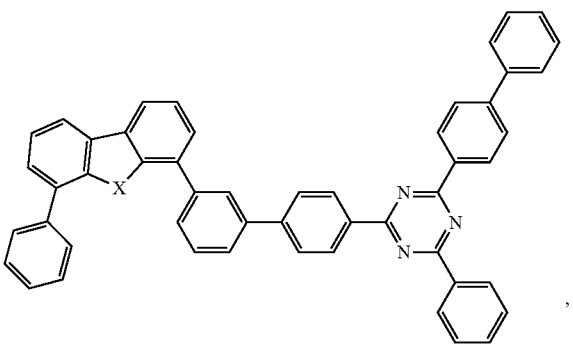

Compound C49 through C51, each represented by the formula
wherein in Compound C49: X = O,
in Compound C50: X = S,
in Compound C51: X = Se

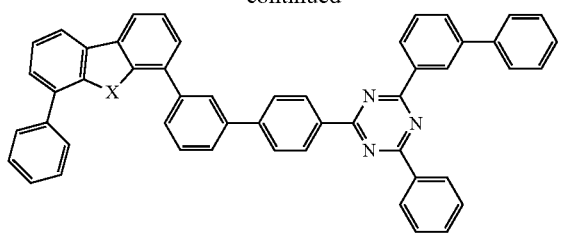

Compound C52 through C54, each represented by the formula
wherein in Compound C52: X = O,
in Compound C53: X = S,
in Compound C54: X = Se

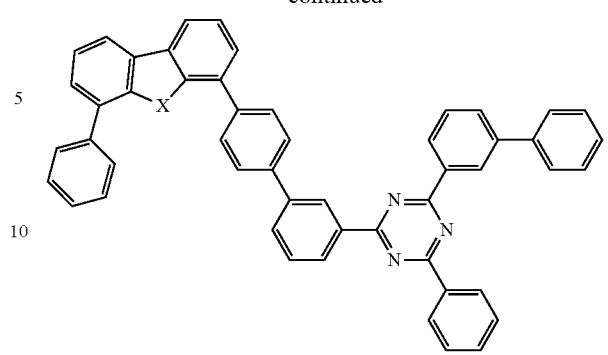

Compound C61 through C63, each represented by the formula
wherein in Compound C61: X = O,
in Compound C62: X = S,
in Compound C63: X = Se

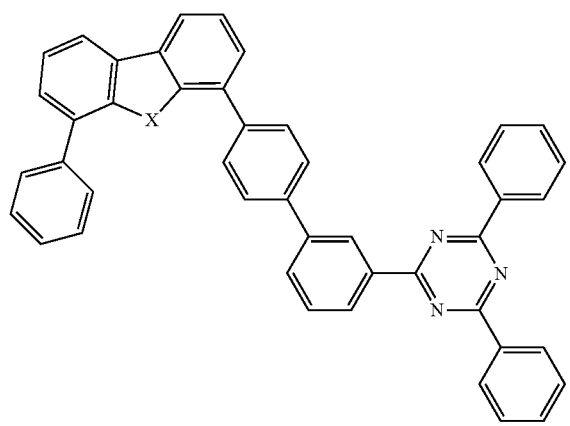

Compound C55 through C57, each represented by the formula
wherein in Compound C55: X = O,
in Compound C56: X = S,
in Compound C57: X = Se

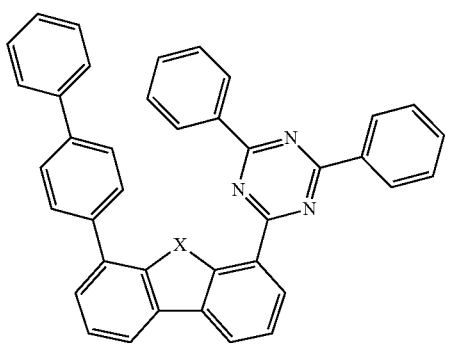

Compound C64 through C66, each represented by the formula
wherein in Compound C64: X = O,
in Compound C65: X = S,
in Compound C66: X = Se

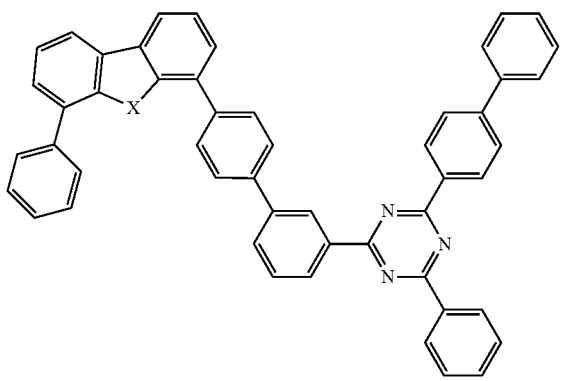

Compound C58 through C60, each represented by the formula
wherein in Compound C58: X = O,
in Compound C59: X = S,
in Compound C60: X = Se

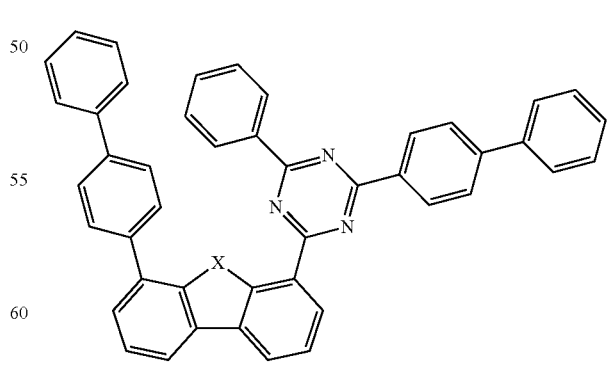

Compound C67 through C69, each represented by the formula
wherein in Compound C67: X = O,
in Compound C68: X = S,
in Compound C69: X = Se

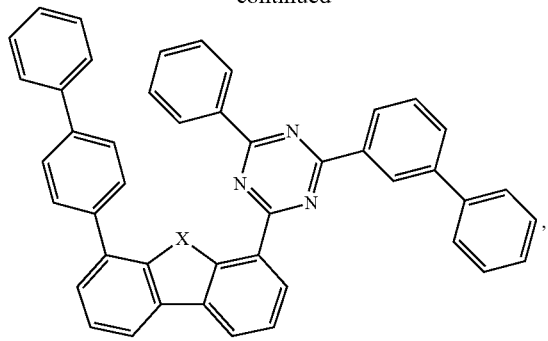

Compound C70 through C72, each represented by the formula
wherein in Compound C70: X = O,
in Compound C71: X = S,
in Compound C72: X = Se

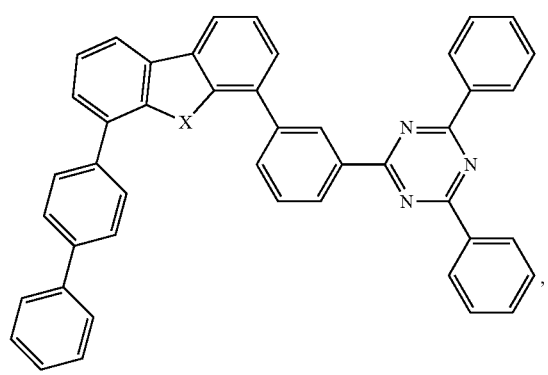

Compound C73 through C75, each represented by the formula
wherein in Compound C73: X = O,
in Compound C74: X = S,
in Compound C75: X = Se

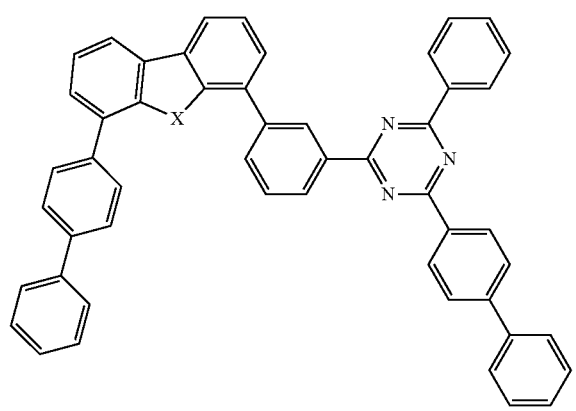

Compound C76 through C78, each represented by the formula
wherein in Compound C76: X = O,
in Compound C77: X = S,
in Compound C78: X = Se

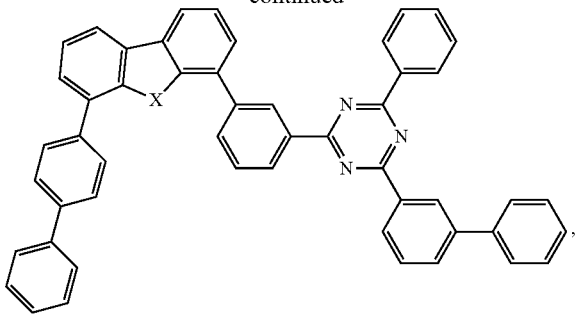

Compound C79 through C81, each represented by the formula
wherein in Compound C79: X = O,
in Compound C80: X = S,
in Compound C81: X = Se

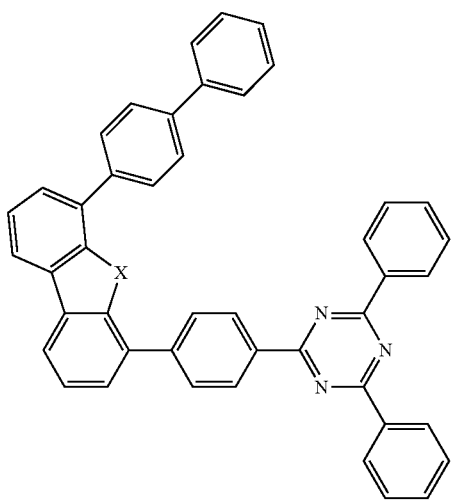

Compound C82 through C84, each represented by the formula
wherein in Compound C82: X = O,
in Compound C83: X = S,
in Compound C84: X = Se

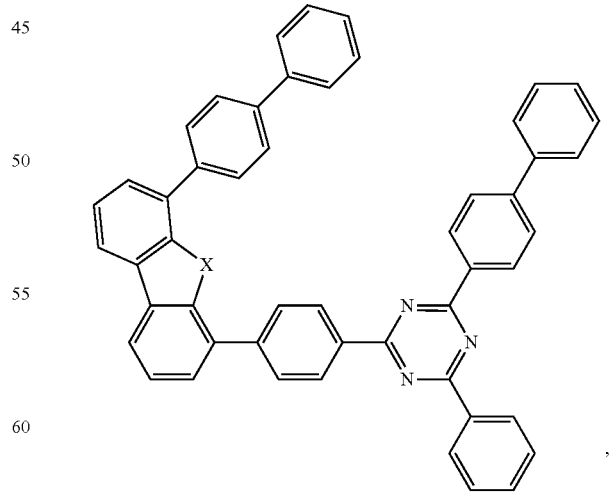

Compound C85 through C87, each represented by the formula
wherein in Compound C85: X = O,
in Compound C86: X = S,
in Compound C87: X = Se

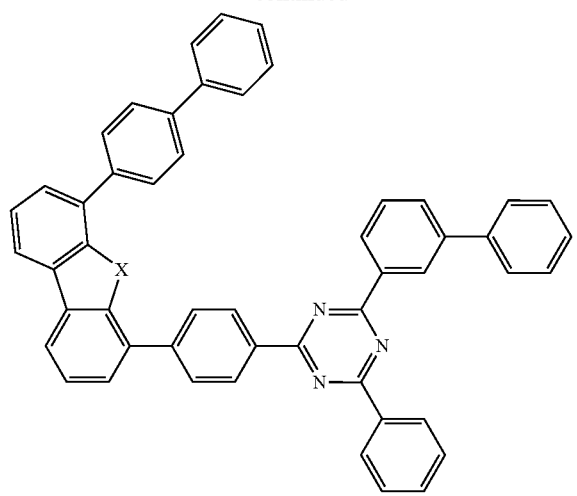

Compound C88 through C90, each represented by the formula
wherein in Compound C88: X = O,
in Compound C89: X = S,
in Compound C90: X = Se

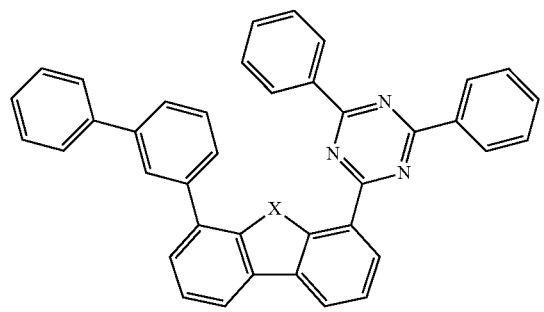

Compound C91 through C93, each represented by the formula
wherein in Compound C91: X = O,
in Compound C92: X = S,
in Compound C93: X = Se

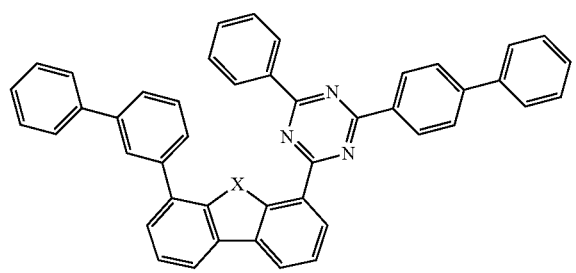

Compound C94 through C96, each represented by the formula
wherein in Compound C94: X = O,
in Compound C95: X = S,
in Compound C96: X = Se

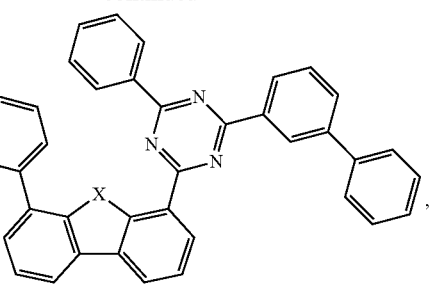

Compound C97 through C99, each represented by the formula
wherein in Compound C97: X = O,
in Compound C98: X = S,
in Compound C99: X = Se

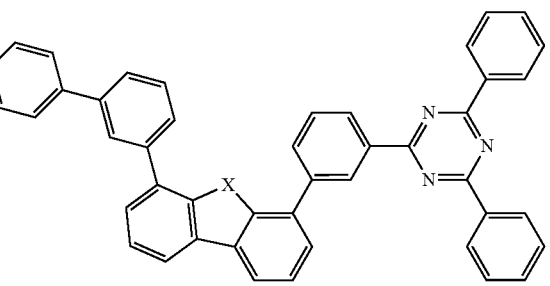

Compound C100 through C102, each represented by the formula
wherein in Compound C100: X = O,
in Compound C101: X = S,
in Compound C102: X = Se

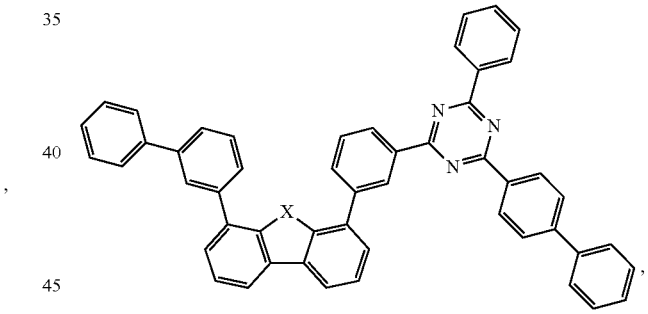

Compound C103 through C105, each represented by the formula
wherein in Compound C103: X = O,
in Compound C104: X = S,
in Compound C105: X = Se

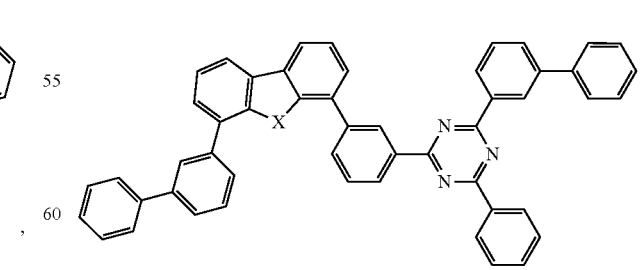

Compound C106 through C108, each represented by the formula
wherein in Compound C106: X = O,
in Compound C107: X = S,
in Compound C108: X = Se -continued

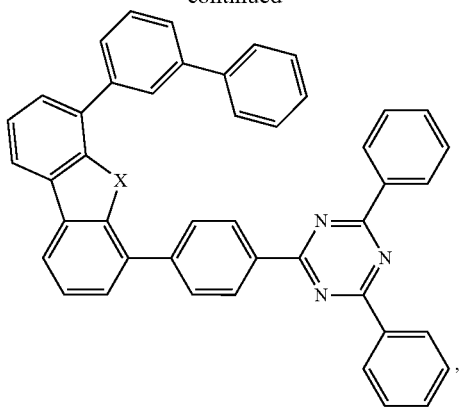

Compound C109 through C111, each represented by the formula
wherein in Compound C109: X = O,
in Compound C110: X = S,
in Compound C111: X = Se

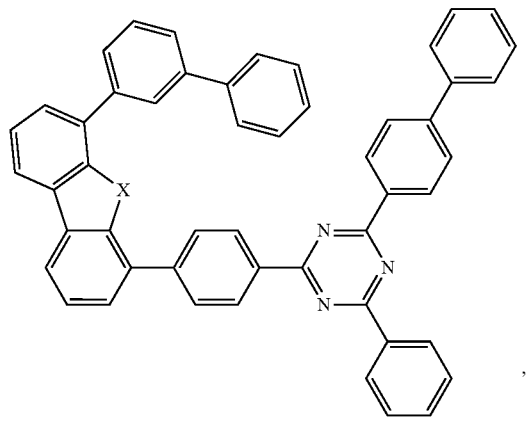

Compound C112 through C114, each represented by the formula
wherein in Compound C112: X = O,
in Compound C113: X = S,
in Compound C114: X = Se

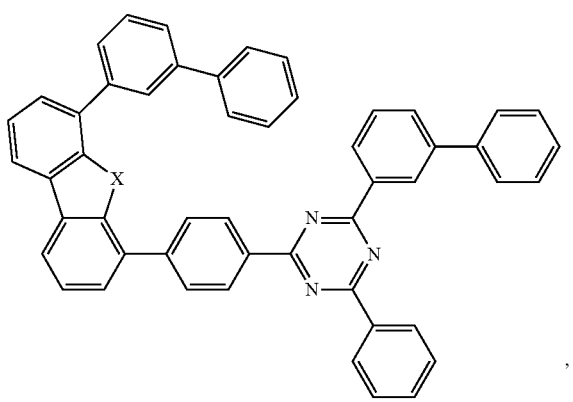

Compound C115 through C117, each represented by the formula
wherein in Compound C115: X = O,
in Compound C116: X = S,
in Compound C117: X = Se -continued

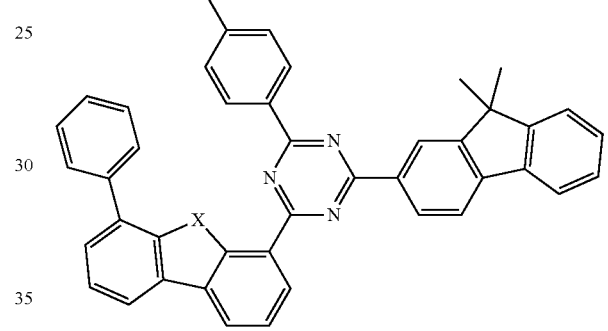

Compound C118 through C120, each represented by the formula
wherein in Compound C118: X = O,
in Compound C119: X = S,
in Compound C120: X = Se Compound C121 through C123, each represented by the formula
wherein in Compound C121: X = O,
in Compound C122: X = S,
in Compound C123: X = Se

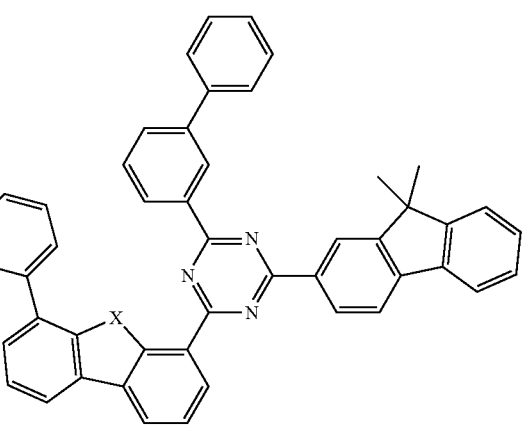

Compound C124 through C126, each represented by the formula
wherein in Compound C124: X = O,
in Compound C125: X = S,
in Compound C126: X = Se

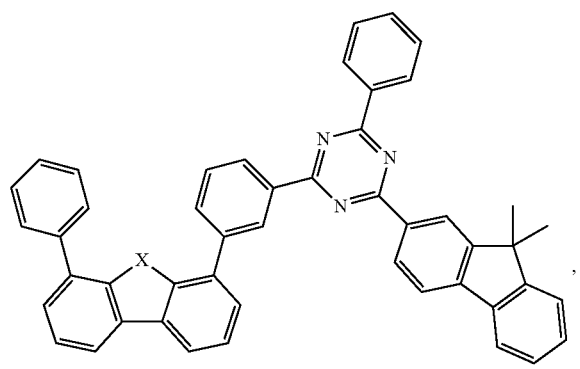

Compound C127 through C129, each represented by the formula
wherein in Compound C127: X = O,
in Compound C128: X = S,
in Compound C129: X = Se

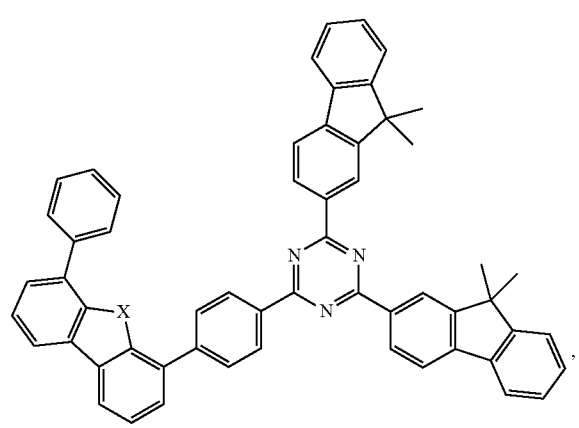

Compound C130 through C132, each represented by the formula
wherein in Compound C130: X = O,
in Compound C131: X = S,
in Compound C132: X = Se

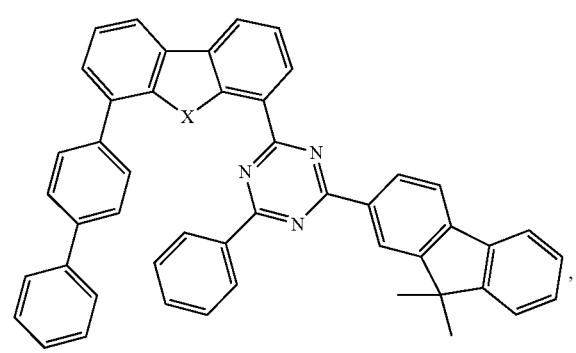

Compound C133 through C135, each represented by the formula
wherein in Compound C133: X = O,
in Compound C134: X = S,
in Compound C135: X = Se

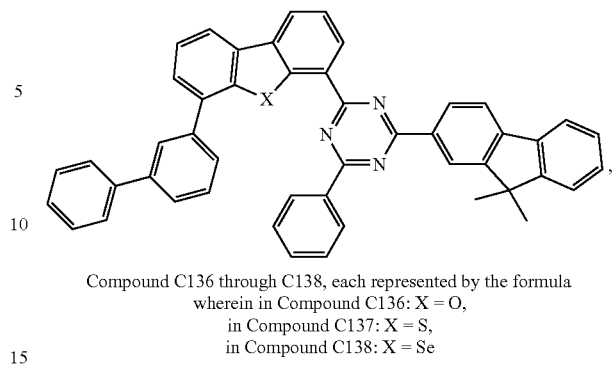

Compound C136 through C138, each represented by the formula
wherein in Compound C136: X = O,
in Compound C137: X = S,
in Compound C138: X = Se

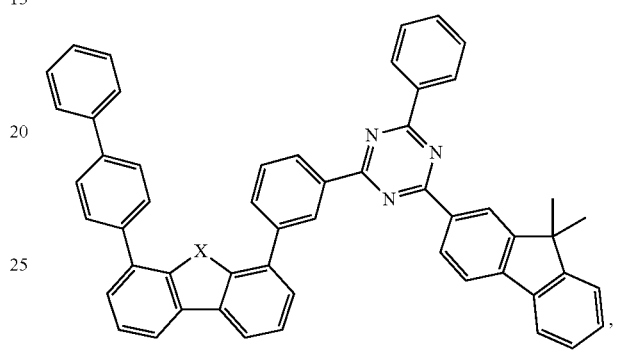

Compound C139 through C141, each represented by the formula
wherein in Compound C139: X = O,
in Compound C140: X = S,
in Compound C141: X = Se

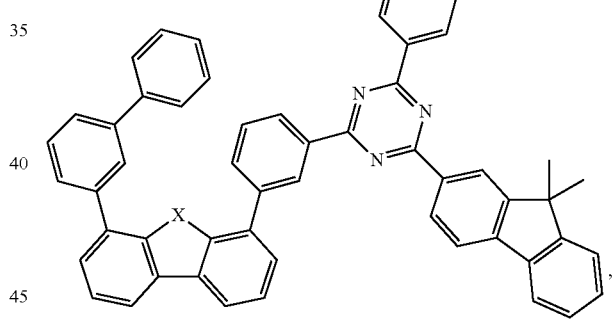

Compound C142 through C144, each represented by the formula
wherein in Compound C142: X = O,
in Compound C143: X = S,
in Compound C144: X = Se

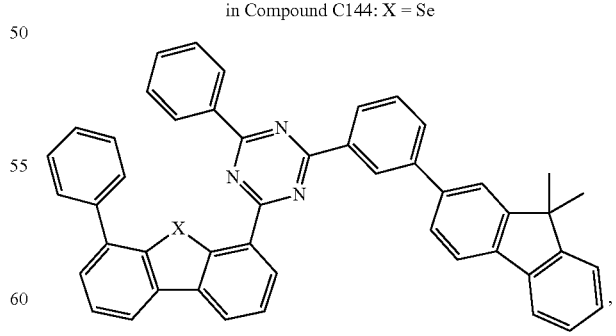

Compound C145 through C147, each represented by the formula
wherein in Compound C145: X = O,
in Compound C146: X = S,
in Compound C147: X = Se

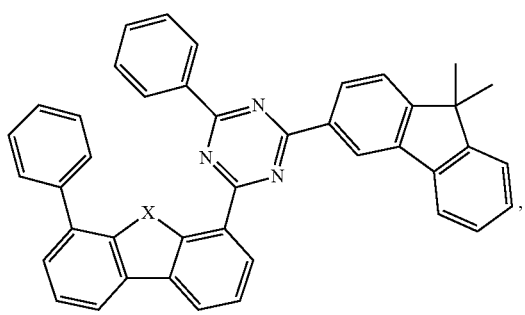

Compound C148 through C150, each represented by the formula
wherein in Compound C148: X = O,
in Compound C149: X = S,
in Compound C150: X = Se

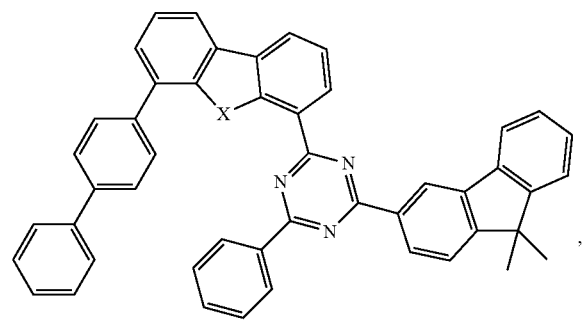

Compound C151 through C153, each represented by the formula
wherein in Compound C151: X = O,
in Compound C152: X = S,
in Compound C153: X = Se

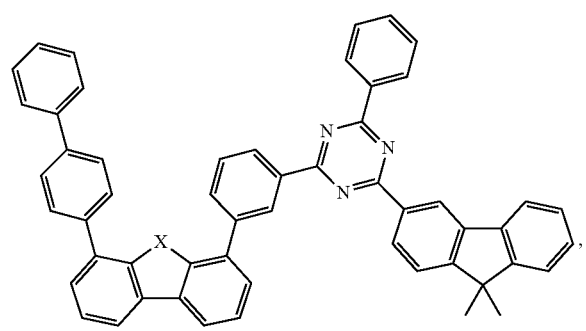

Compound C154 through C156, each represented by the formula
wherein in Compound C154: X = O,
in Compound C155: X = S,
in Compound C156: X = Se

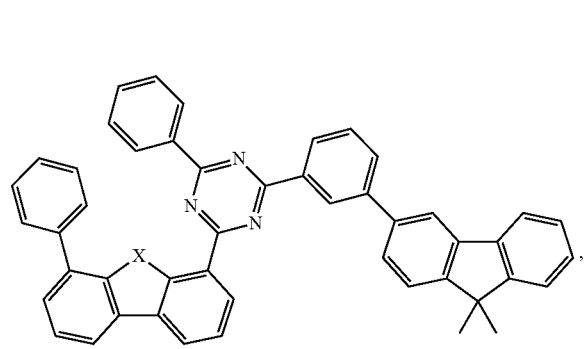

Compound C157 through C159, each represented by the formula
wherein in Compound C157: X = O,
in Compound C158: X = S,
in Compound C159: X = Se

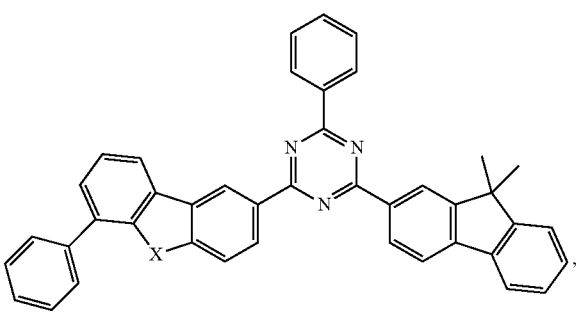

Compound C160 through C162, each represented by the formula
wherein in Compound C160: X = O,
in Compound C161: X = S,
in Compound C162: X = Se

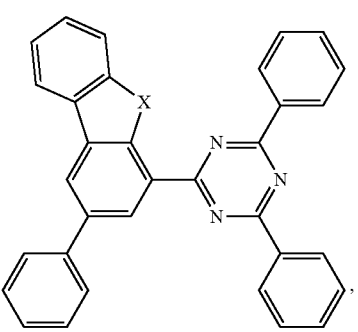

Compound C163 through C165 each represented by the formula
wherein in Compound C163: X = O,
in Compound C164: X = S,
in Compound C165: X = Se

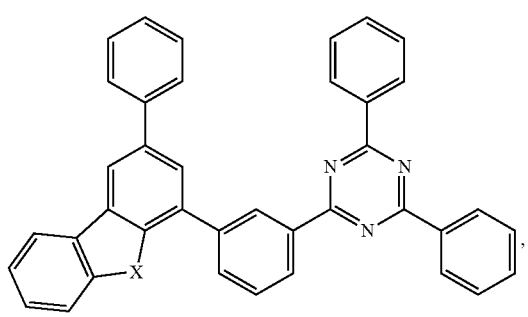

Compound C166 through C168 each represented by the formula
wherein in Compound C166: X = O,
in Compound C167: X = S,
in Compound C168: X = Se

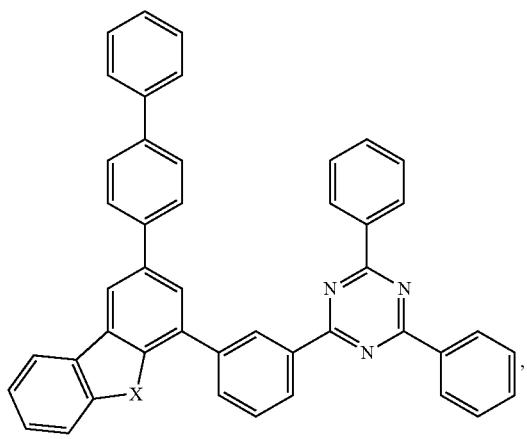

Compound C169 through C171 each represented by the formula
wherein in Compound C169: X = O,
in Compound C170: X = S,
in Compound C171: X = Se

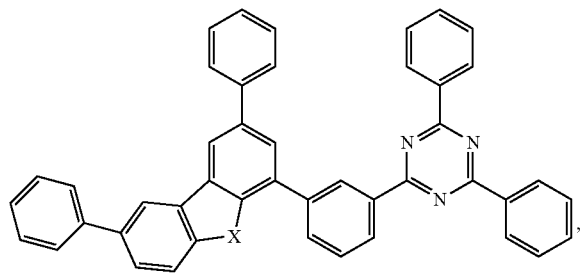

Compound C172 through C174 each represented by the formula
wherein in Compound C172: X = O,
in Compound C173: X = S,
in Compound C174: X = Se

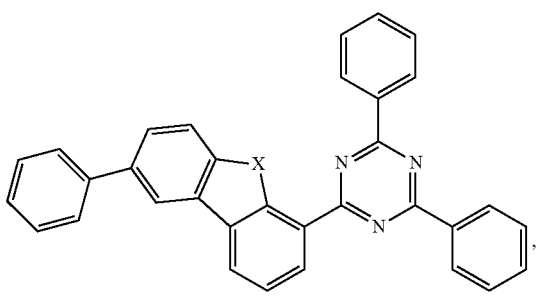

Compound C175 through C177 each represented by the formula
wherein in Compound C175: X = O,
in Compound C176: X = S,
in Compound C177: X = Se

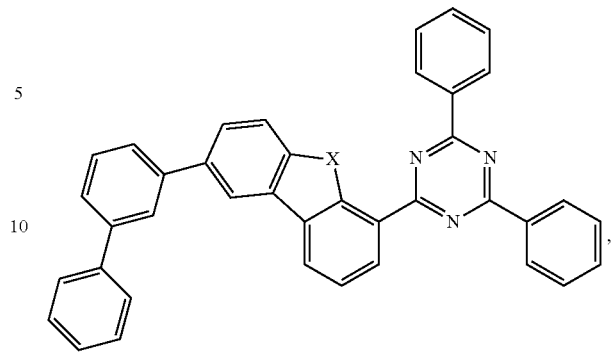

Compound C178 through C180 each represented by the formula
wherein in Compound C178: X = O,
in Compound C179: X = S,
in Compound C180: X = Se

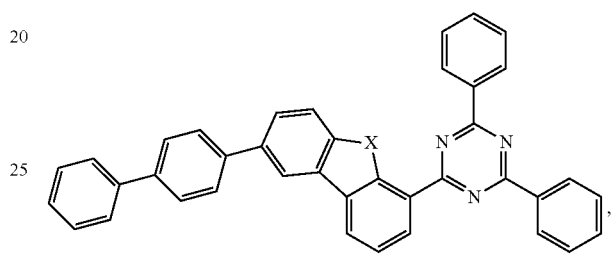

Compound C181 through C183 each represented by the formula
wherein in Compound C181: X = O,
in Compound C182: X = S,
in Compound C183: X = Se

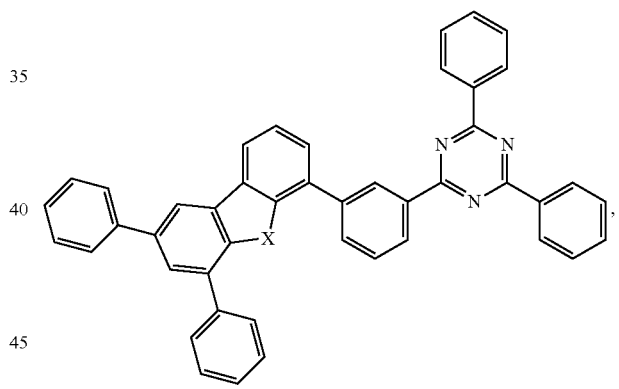

Compound C184 through C186 each represented by the formula
wherein in Compound C184: X = O,
in Compound C185: X = S,
in Compound C186: X = Se

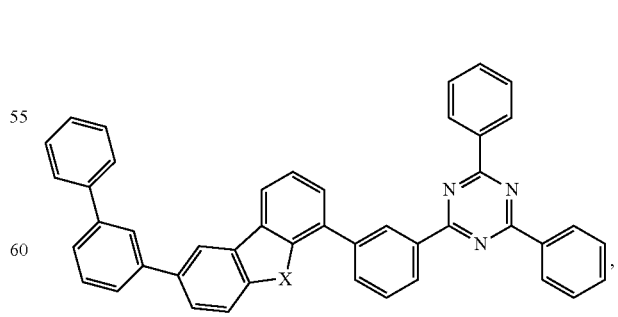

Compound C187 through C189 each represented by the formula
wherein in Compound C187: X = O,
in Compound C188: X = S,
in Compound C189: X = Se

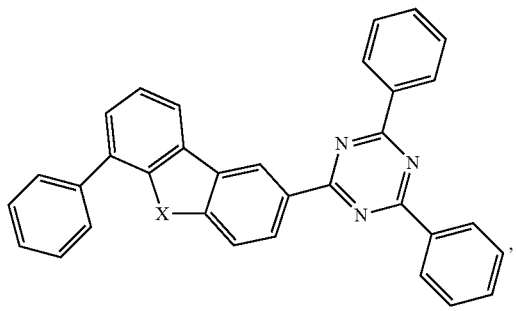

Compound C190 through C192 each represented by the formula
wherein in Compound C190: X = O,
in Compound C191: X = S,
in Compound C192: X = Se

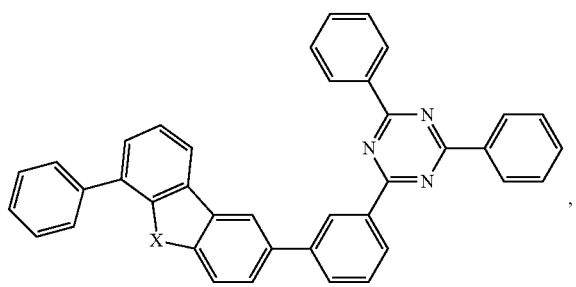

Compound C193 through C195 each represented by the formula
wherein in Compound C193: X = O,
in Compound C194: X = S,
in Compound C195: X = Se

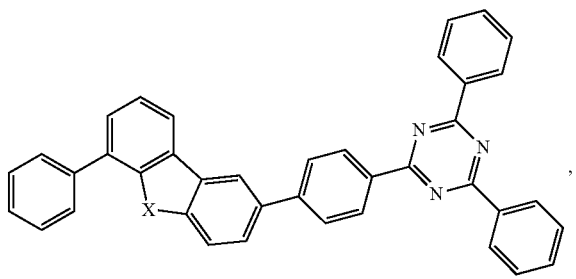

Compound C196 through C198 each represented by the formula
wherein in Compound C196: X = O,
in Compound C197: X = S,
in Compound C198: X = Se

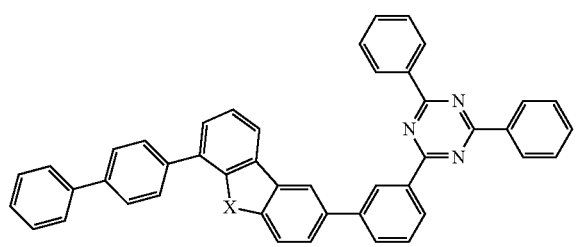

Compound C199 through C201 each represented by the formula
wherein in Compound C199: X = O,
in Compound C200: X = S,
in Compound C201: X = Se

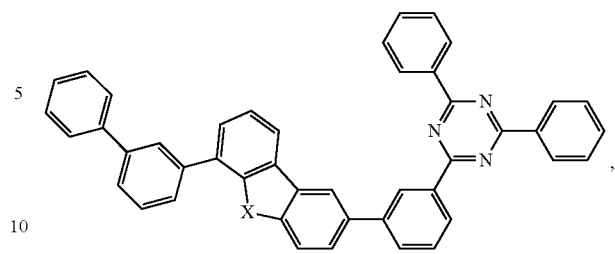

Compound C202 through C204 each represented by the formula
wherein in Compound C202: X = O,
in Compound C203: X = S,
in Compound C204: X = Se

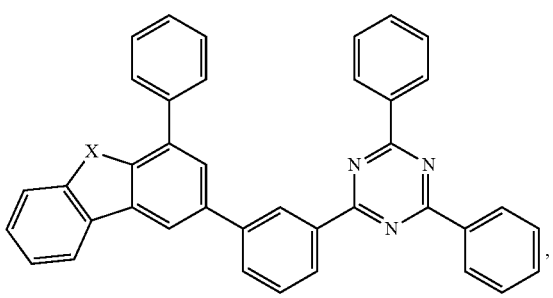

Compound C205 through C207 each represented by the formula
wherein in Compound C205: X = O,
in Compound C206: X = S,
in Compound C207: X = Se

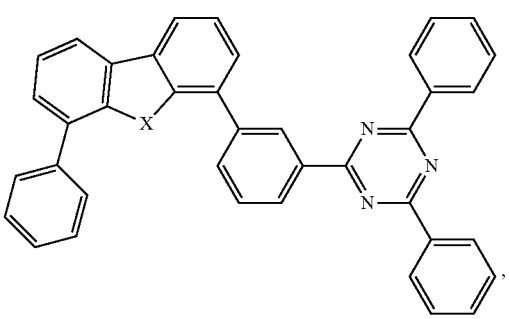

Compound C208 through C210 each represented by the formula
wherein in Compound C208: X = O,
in Compound C209: X = S,
in Compound C210: X = Se

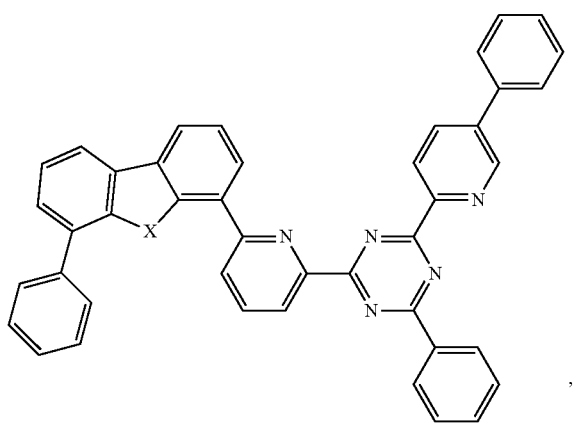

Compound C211 through C213 each represented by the formula
wherein in Compound C211: X = O,
in Compound C212: X = S,
in Compound C213: X = Se

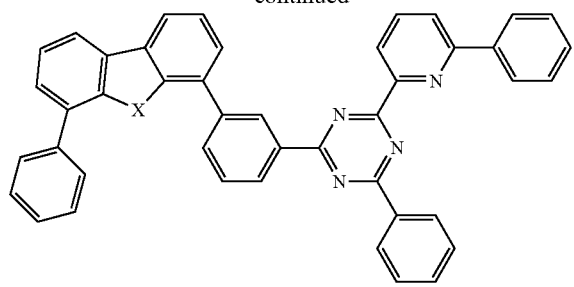

Compound C214 through C216 each represented by the formula
wherein in Compound C214: X = O,
in Compound C215: X = S,
in Compound C216: X = Se

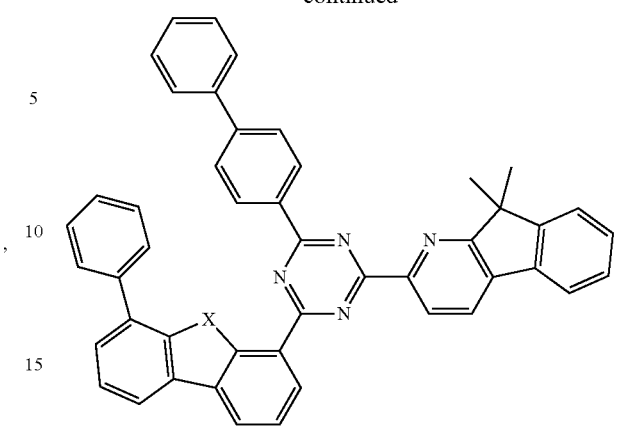

Compound C223 through C225 each represented by the formula
wherein in Compound C223: X = O,
in Compound C224: X = S,
in Compound C225: X = Se

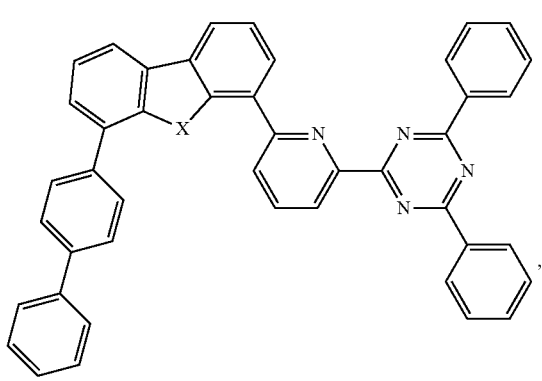

Compound C217 through C219 each represented by the formula
wherein in Compound C217: X = O,
in Compound C218: X = S,
in Compound C219: X = Se

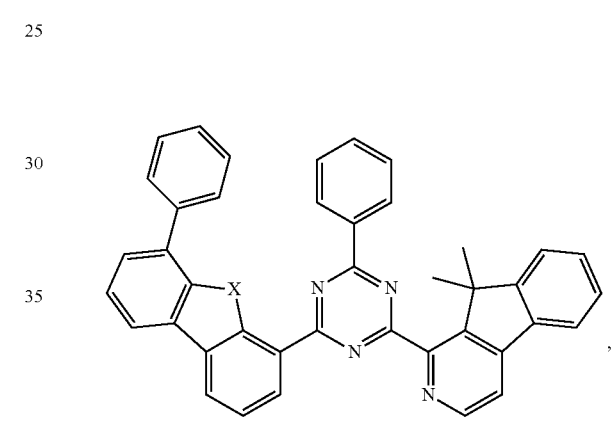

Compound C226 through C228 each represented by the formula
wherein in Compound C226: X = O,
in Compound C227: X = S,
in Compound C228: X = Se

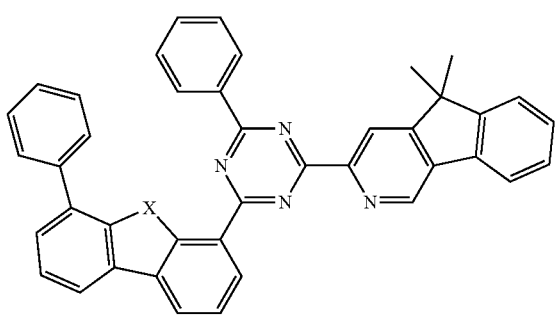

Compound C220 through C222 each represented by the formula
wherein in Compound C220: X = O,
in Compound C221: X = S,
in Compound C222: X = Se

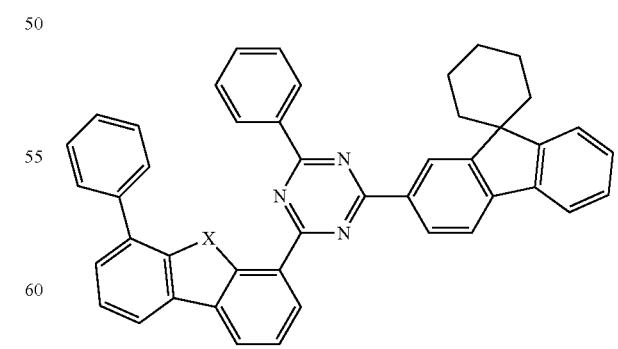

Compound C229 through C231 each represented by the formula
wherein in Compound C229: X = O,
in Compound C230: X = S,
in Compound C231: X = Se

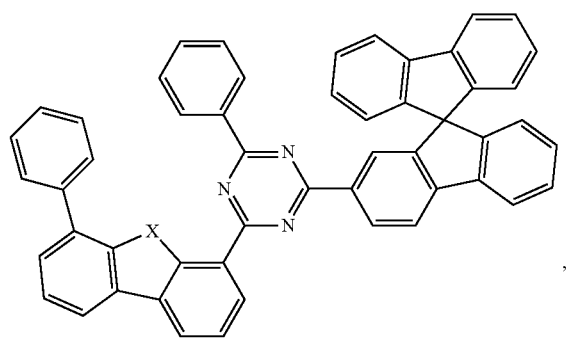

Compound C232 through C234 each represented by the formula
wherein in Compound C232: X = O,
in Compound C233: X = S,
in Compound C234: X = Se

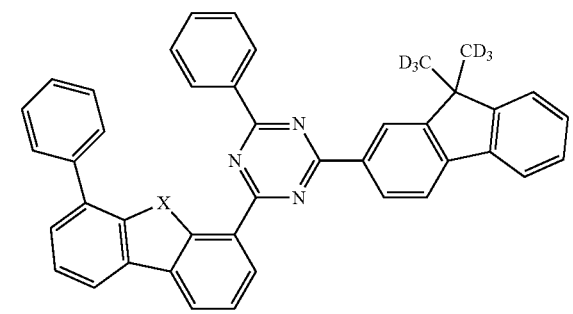

Compound C241 through C243 each represented by the formula
wherein in Compound C241: X = O,
in Compound C242: X = S,
in Compound C243: X = Se

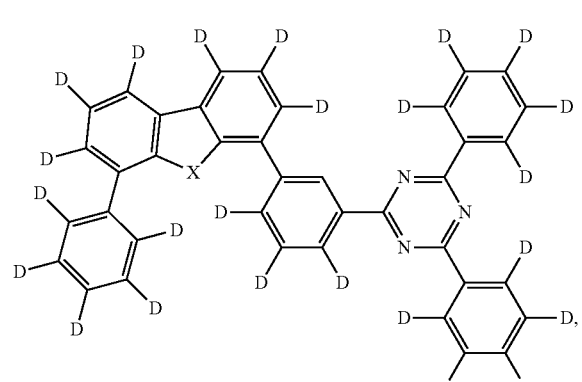

Compound C235 through C237 each represented by the formula
wherein in Compound C235: X = O,
in Compound C236: X = S,
in Compound C237: X = Se

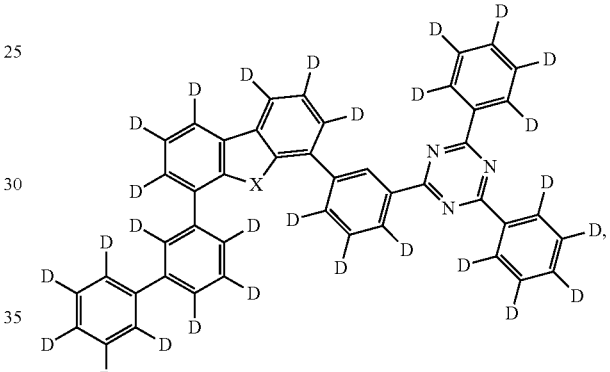

Compound C244 through C246 each represented by the formula
wherein in Compound C244: X = O,
in Compound C245: X = S,
in Compound C246: X = Se

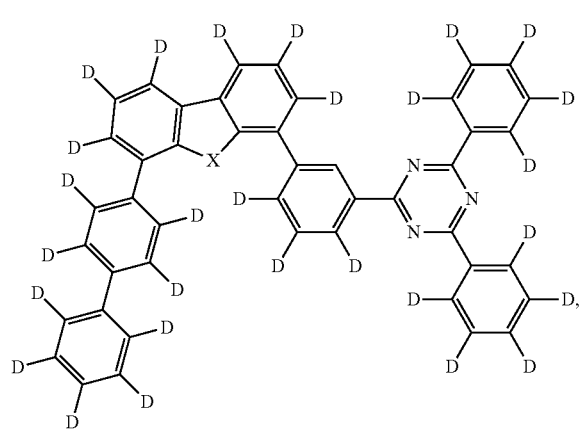

Compound C238 through C240 each represented by the formula
wherein in Compound C238: X = O,
in Compound C239: X = S,
in Compound C240: X = Se

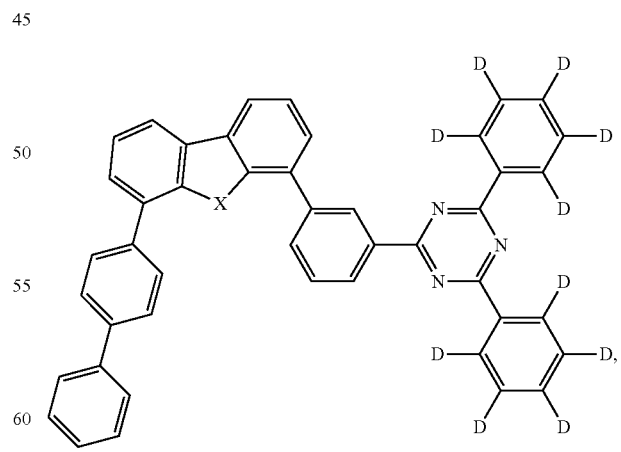

Compound C247 through C249 each represented by the formula
wherein in Compound C247: X = O,
in Compound C248: X = S,
in Compound C249: X = Se

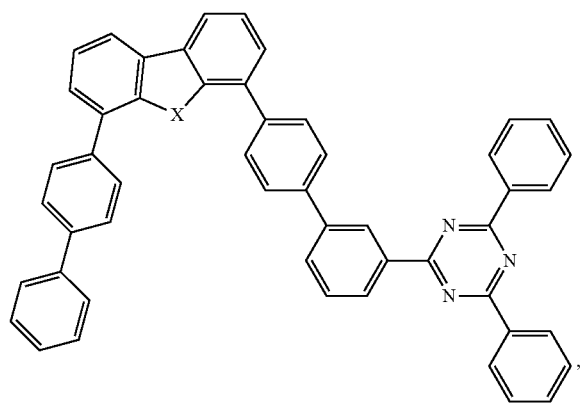

Compound C250 through C252 each represented by the formula
wherein in Compound C250: X = O,
in Compound C251: X = S,
in Compound C252: X = Se

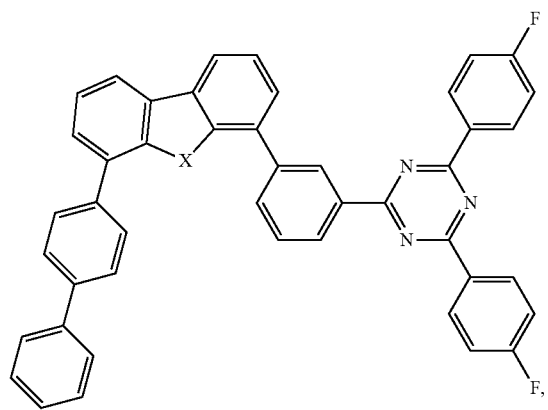

Compound C253 through C255 each represented by the formula
wherein in Compound C253: X = O,
in Compound C254: X = S,
in Compound C255: X = Se Compound D1

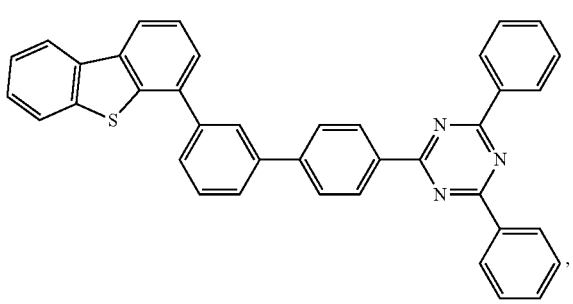

Compound D2

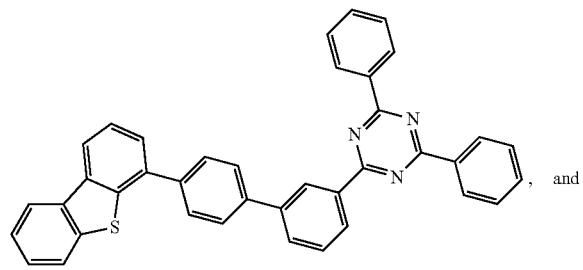

Compound D3

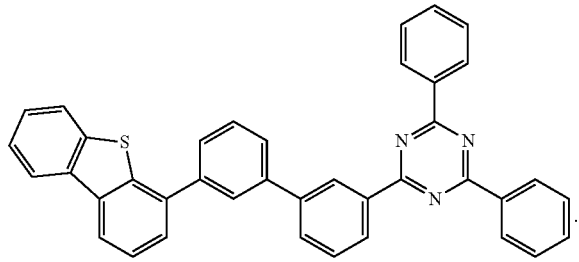

9. The OLED of claim 1, wherein the phosphorescent dopant is a metal coordination complex having a metal-carbon bond.

10. The OLED of claim 9, wherein the metal is selected from the group consisting of: Ir, Os, Pt, Pd, Ag, Au, and Cu.

11. The OLED of claim 9, wherein the metal coordination complex comprises a ligand comprising a chemical moiety selected from the group consisting of: pyridazine, pyrimidine, pyrazine, and triazine.

12. The OLED of claim 9, wherein the metal coordination complex has the formula of $M(L^1)_x(L^2)_y(L^3)_z$,
wherein $L^1$, $L^2$ and $L^3$ can be the same or different,
wherein x is 1, 2, or 3,
wherein y is 0, 1, or 2,
wherein z is 0, 1, or 2,
wherein x+y+z is the oxidation state of the metal M,
wherein $L^1$, $L^2$ and $L^3$ are each independently selected from the group consisting of:

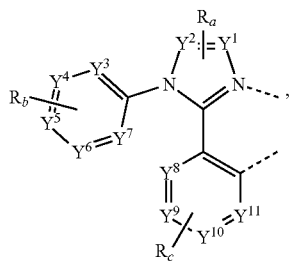

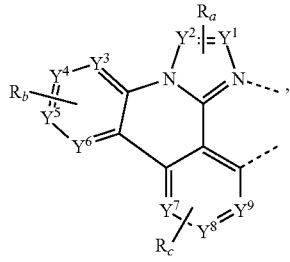

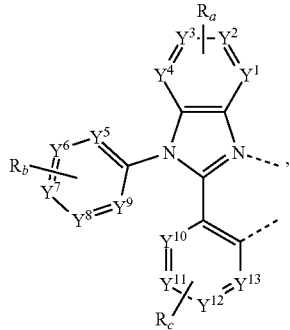

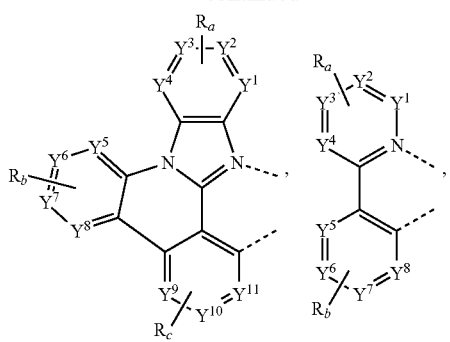
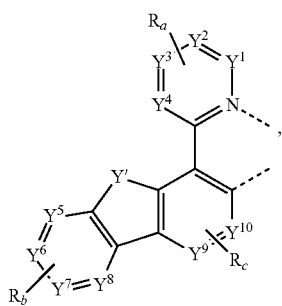
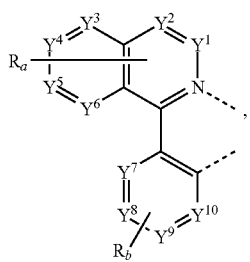
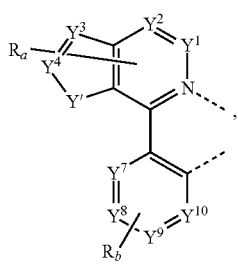
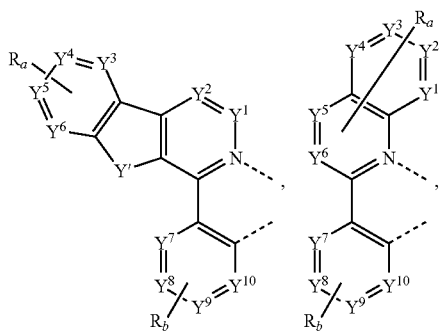
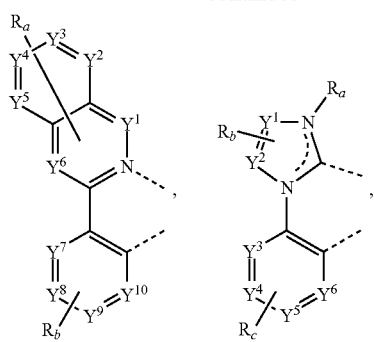
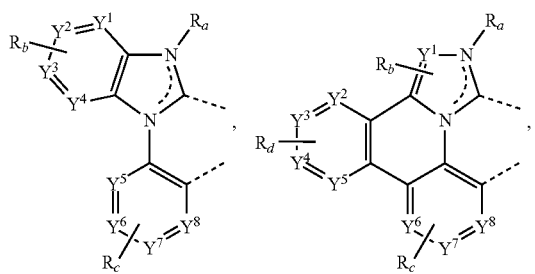
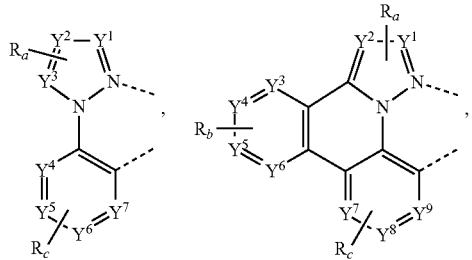
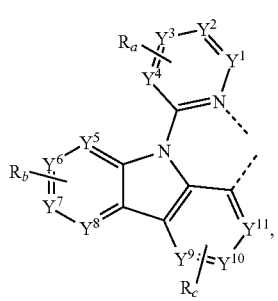
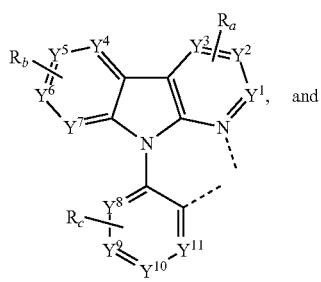

-continued

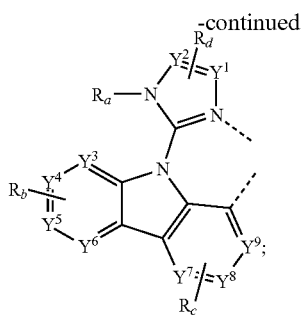

wherein $L^2$ and $L^3$ can also be

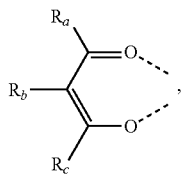

wherein each $Y^1$ to $Y^{13}$ are independently selected from the group consisting of carbon and nitrogen, wherein Y' is selected from the group consisting of $BR_e$, $NR_e$, $PR_e$, O, S, Se, C=O, S=O, $SO_2$, $CR_eR_f$, $SiR_eR_f$, and $GeR_eR_f$;

wherein $R_e$ and $R_f$ are optionally fused or joined to form a ring, wherein each $R_a$, $R_b$, $R_c$, and $R_d$ may independently represent from mono substitution to the maximum possible number of substitution, or no substitution, wherein each $R_a$, $R_b$, $R_c$, $R_d$, $R_e$ and $R_f$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, and wherein any two adjacent substituents of $R_a$, $R_b$, $R_c$, and $R_d$ are optionally fused or joined to form a ring or form a multidentate ligand.

13. The OLED of claim 12, wherein the metal coordination complex has a formula selected from the group consisting of: $Ir(L_A)_3$, $Ir(L_A)(L_B)_2$, $Ir(L_A)_2(L_B)$, $Ir(L_A)_2(L_C)$, and $Ir(L_A)(L_B)(L_C)$; wherein $L_A$, $L_B$, and $L_C$ are different from each other.

14. The OLED of claim 12, wherein the metal coordination complex has a formula of $Pt(L_A)(L_B)$, wherein $L_A$, and $L_B$ can be same or different, and wherein $L_A$, and $L_B$ are optionally connected to form a tetradentate ligand.

15. The OLED of claim 13, wherein the metal coordination complex has a formula of $Ir(L_A)_2(L_C)$, wherein $L_A$ is selected from the group consisting of:

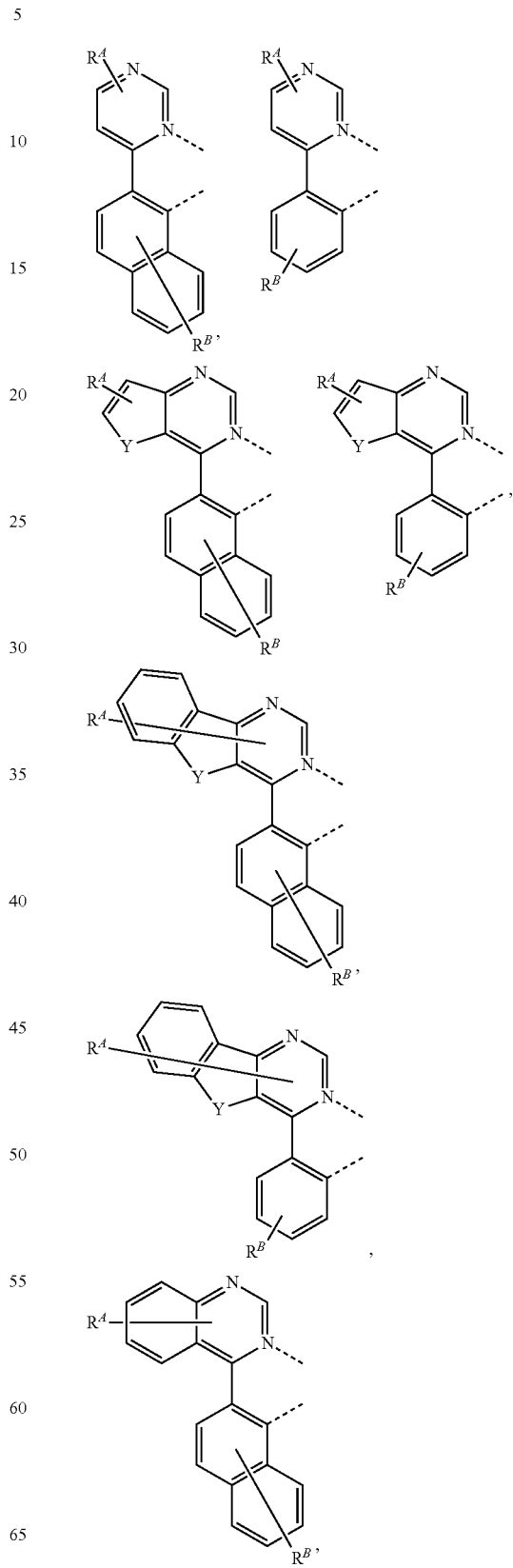

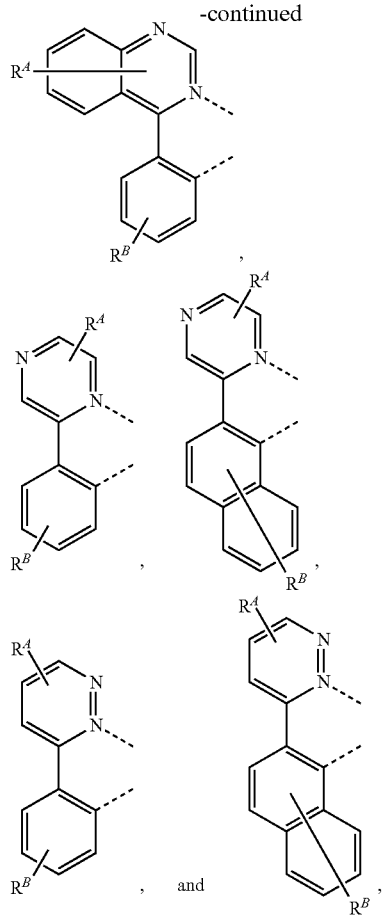

wherein $L_C$ is

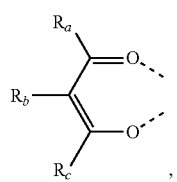

and wherein each $R^A$, and $R^B$ may independently represent from mono substitution to the maximum possible number of substitution, or no substitution, wherein each $R^A$, and $R^B$ is independently selected from the group consisting of: hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, and wherein any two adjacent substituents of $R^A$, and $R^B$ are optionally fused or joined to form a ring or form a multidentate ligand.

16. The OLED of claim 15, wherein the metal coordination complex is at least one selected from the group consisting of:

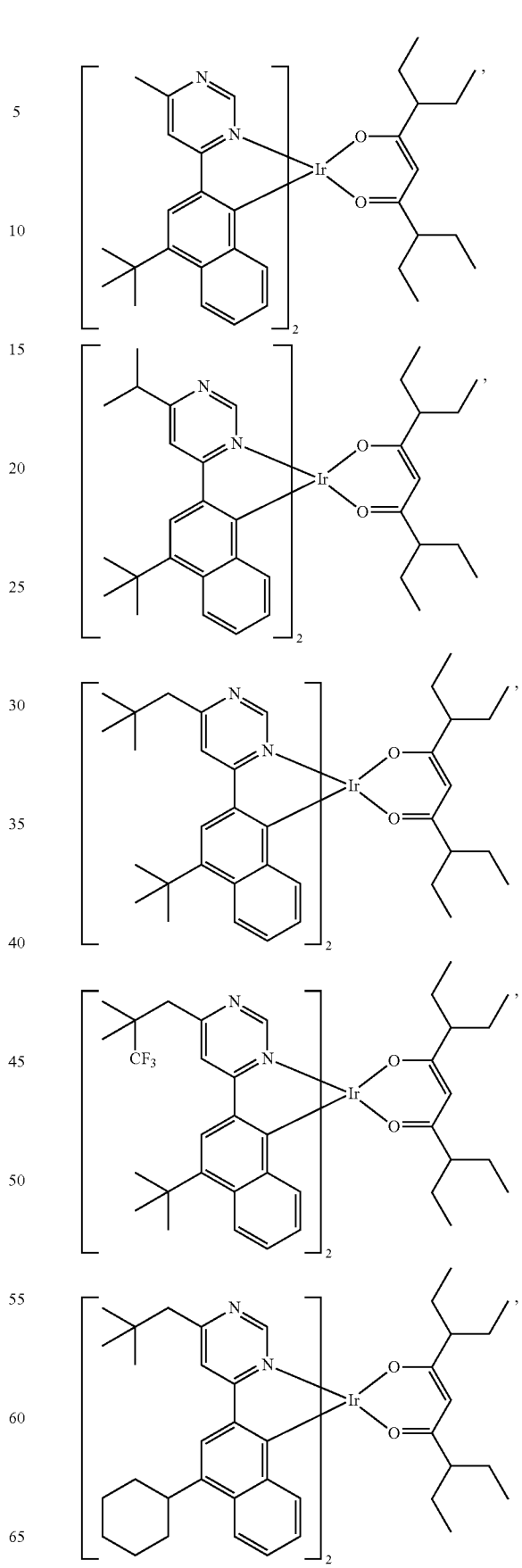

157
-continued
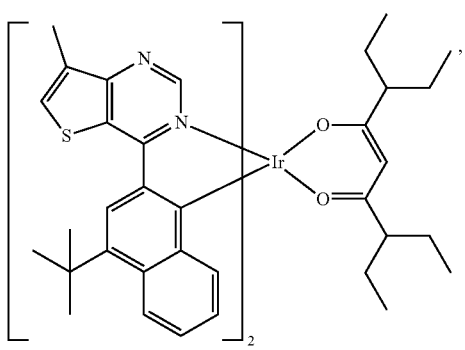
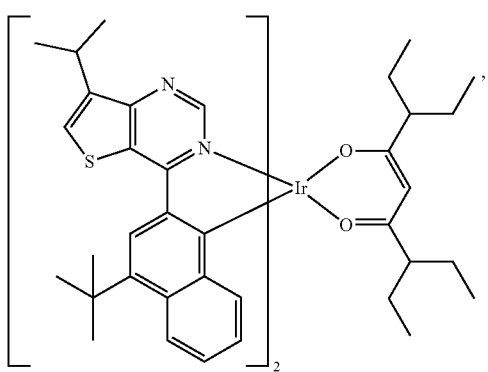
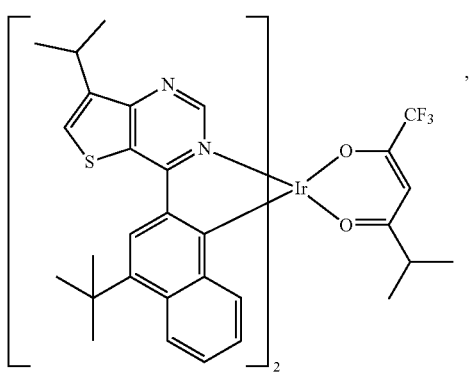
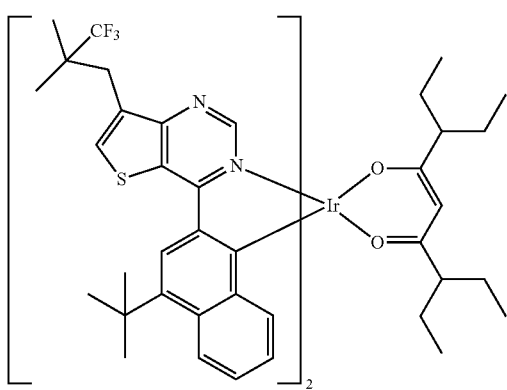
158
-continued
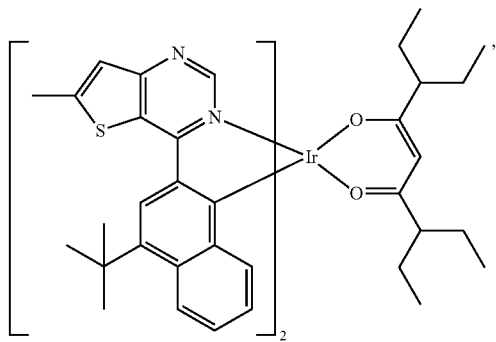
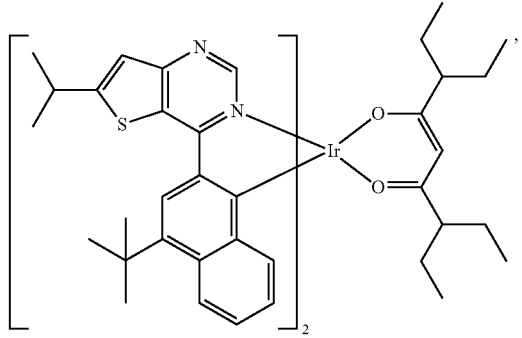
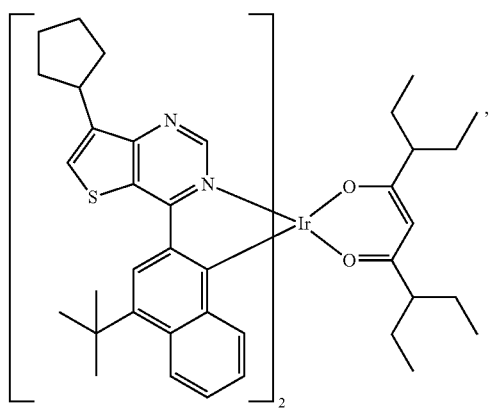
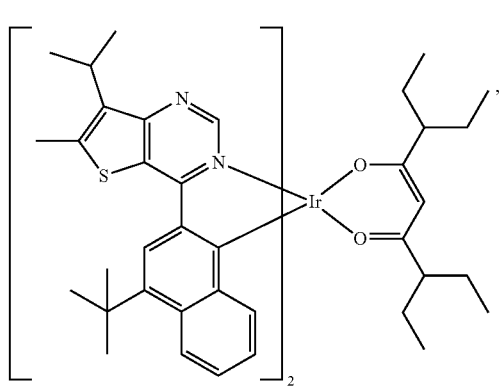

159
-continued
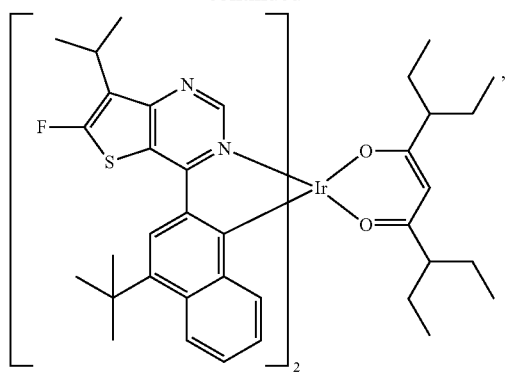
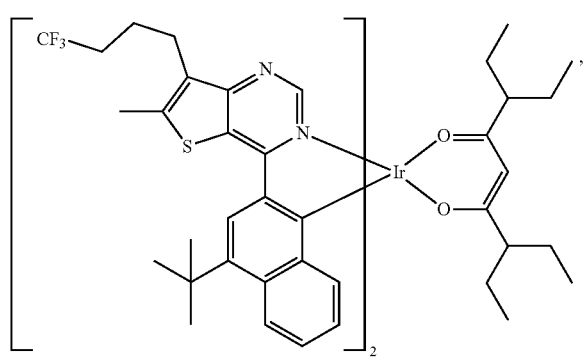
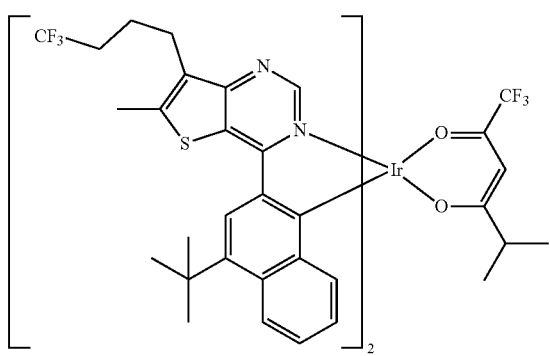
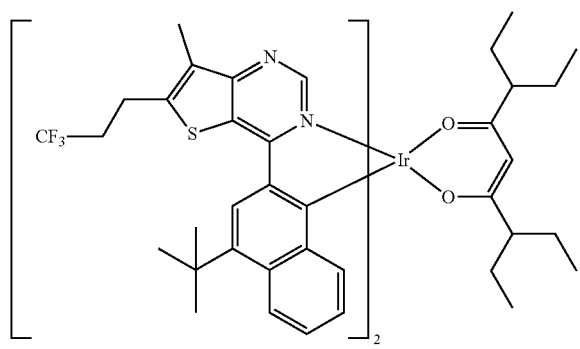
160
-continued
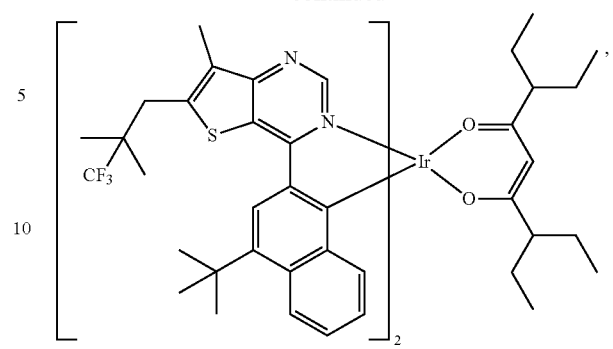
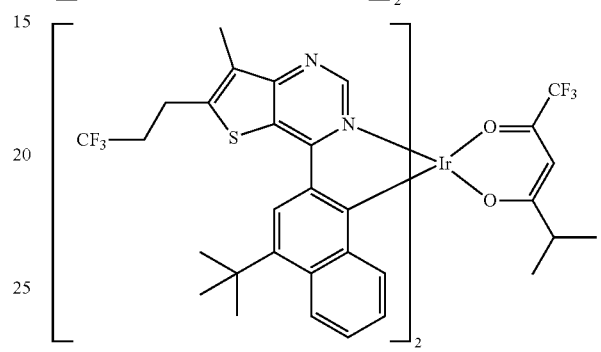
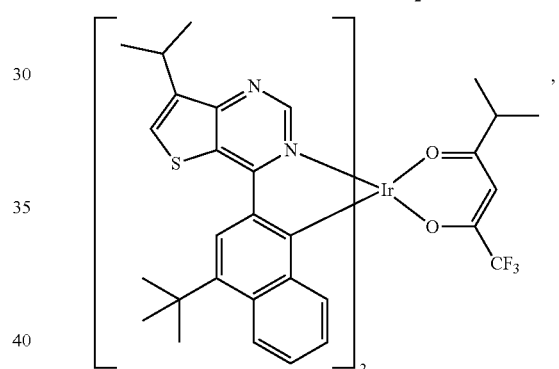
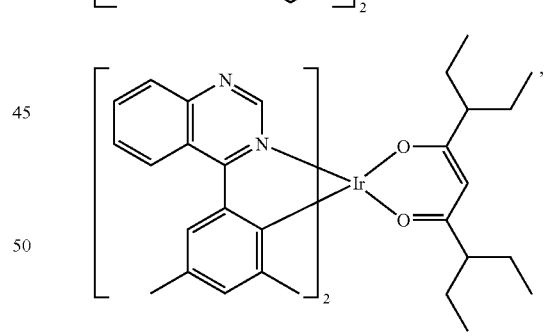
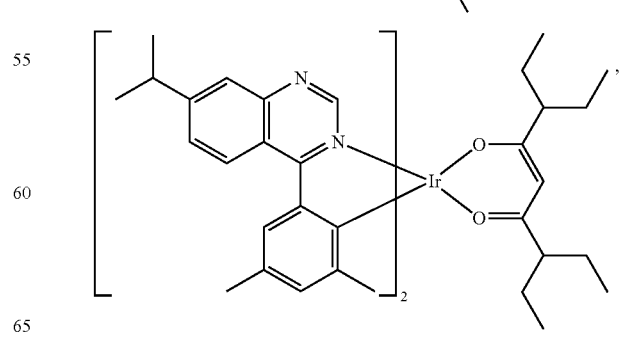

-continued
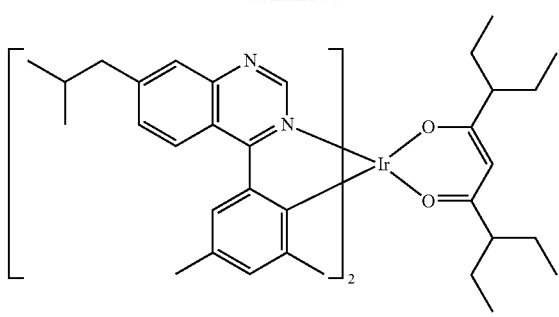
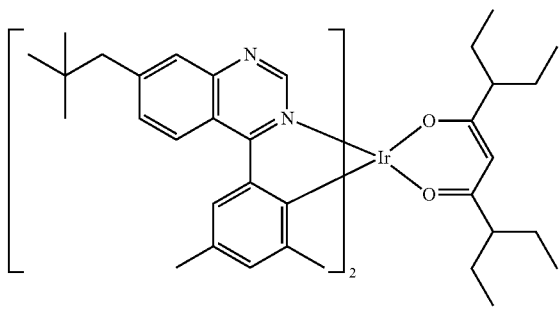
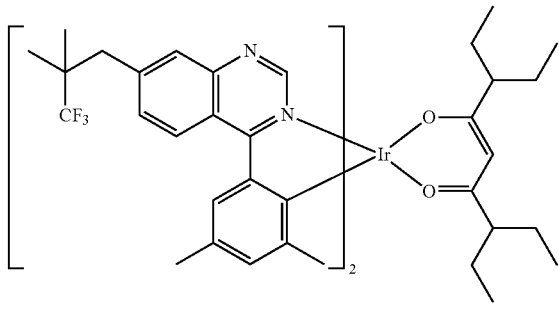
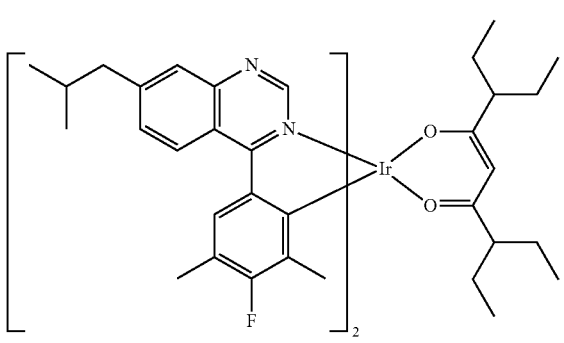
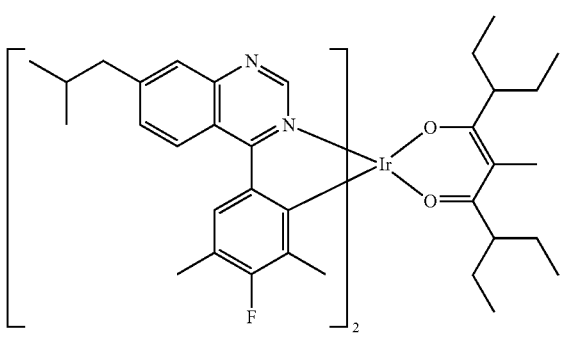
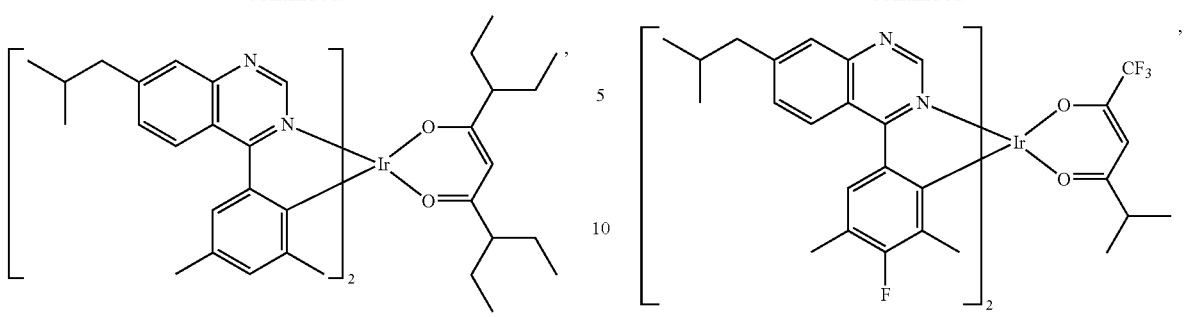
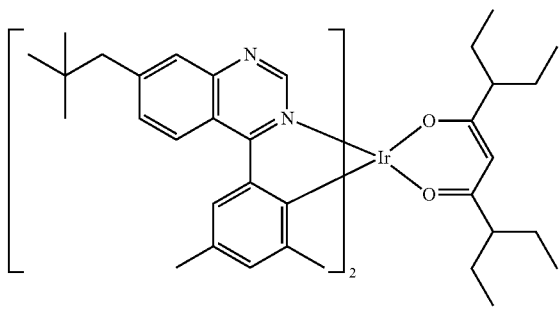
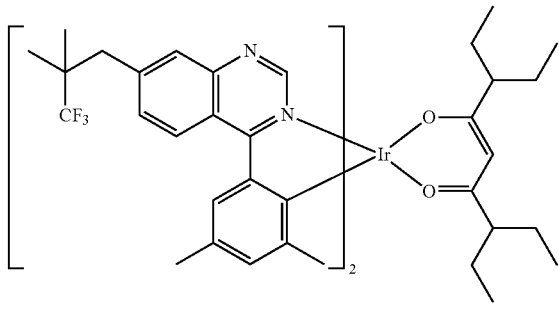
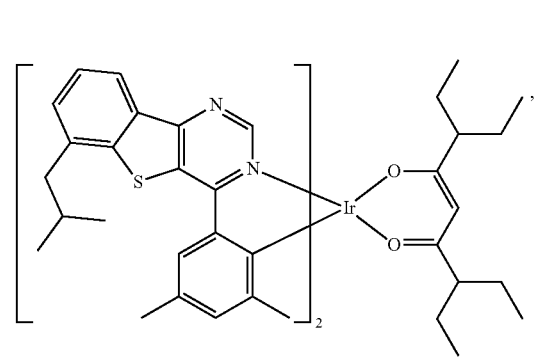
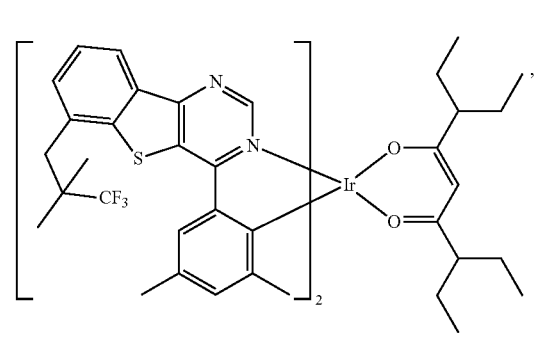

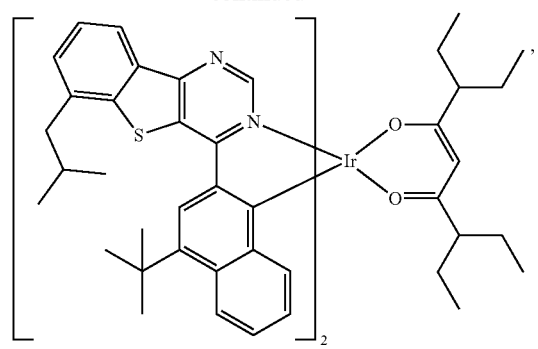

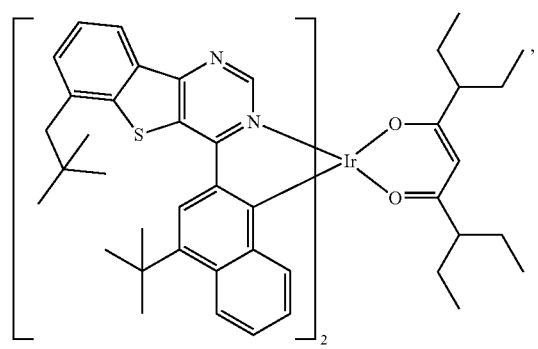

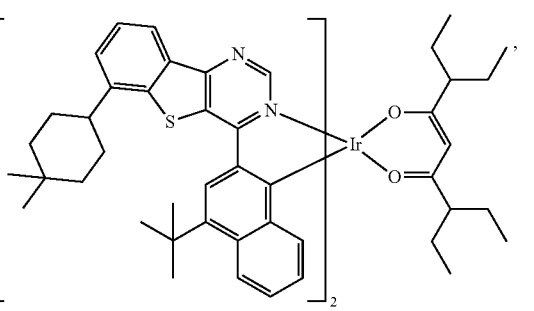

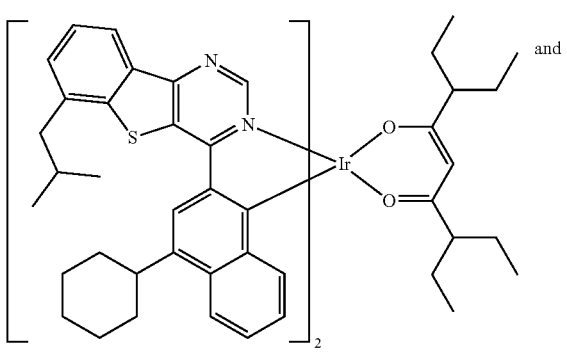

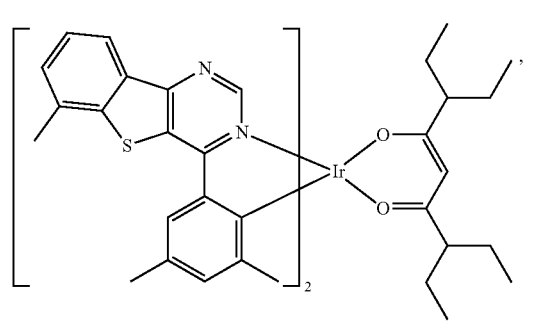

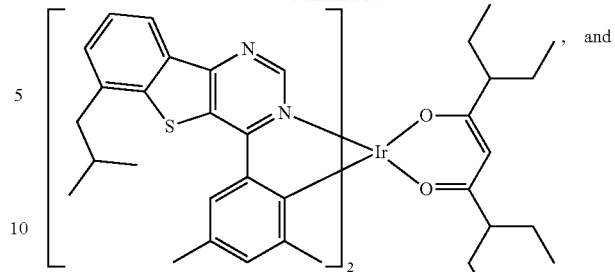

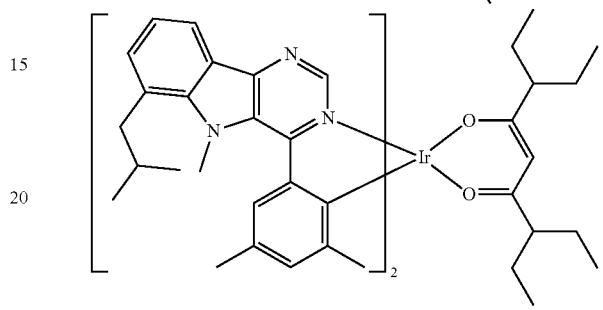

17. The OLED of claim 14, wherein the metal coordination complex is a Pt complex having a tetradentate ligand.

18. The OLED of claim 17, wherein the tetradentate ligand has four coordination atoms selected from the group consisting of: (two anionic C, two neutral N); (one anionic C, one carbene C, one neutral N, and one anionic N); (two anionic C, one carbene C, one neutral N); (one anionic C, one anionic N, two neutral N); (one anionic C, one anionic O, two neutral N); and (two carbene C, two anionic N).

19. The OLED of claim 1, wherein the electron blocking layer comprises a compound of Formula II:

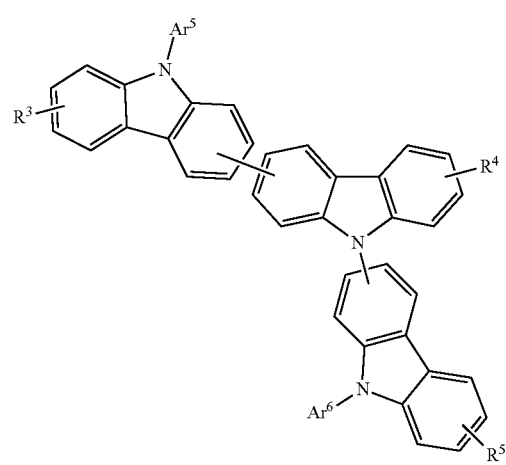

Formula II wherein $R^3$, $R^4$, and $R^5$ each independently represent mono to the maximum allowable substitution, or no substitution, wherein each $R^3$, $R^4$, and $R^5$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, and wherein each $Ar^5$ and $Ar^6$ is independently selected from the group consisting of aryl, heteroaryl, and combination thereof.

20. A consumer product including an organic light emitting device (OLED) comprising:
   an anode;
   a cathode;
   an emissive layer disposed between the anode and the cathode; and
   a hole blocking layer disposed between the emissive layer and the cathode,
   wherein the emissive layer comprises a phosphorescent dopant,
   wherein the phosphorescent dopant has an emission with a peak maximum wavelength greater than or equal to 600 nm when measured at room temperature in 0.5% doped PMMA (Poly(methyl methacrylate)) thin film,
   wherein the energy of a highest occupied molecular orbital (HOMO) of the phosphorescent dopant is lower than or equal to −5.1 eV, and
   wherein the energy of the HOMO of the hole blocking layer is at least 0.1 eV lower than the energy of the HOMO of the phosphorescent dopant.

* * * * *

UNITED STATES PATENT AND TRADEMARK OFFICE
CERTIFICATE OF CORRECTION

PATENT NO. : 11,515,482 B2                                                                    Page 1 of 4
APPLICATION NO. : 16/596948
DATED : November 29, 2022
INVENTOR(S) : Vadim Adamovich, Eric A. Margulies and Pierre-Luc T. Boudreault It is certified that error appears in the above-identified patent and that said Letters Patent is hereby corrected as shown below:

In the Claims

In Claim 8, Column 119, after Line 67, insert the following structures:

Compound A73 through A75, each represented by the formula

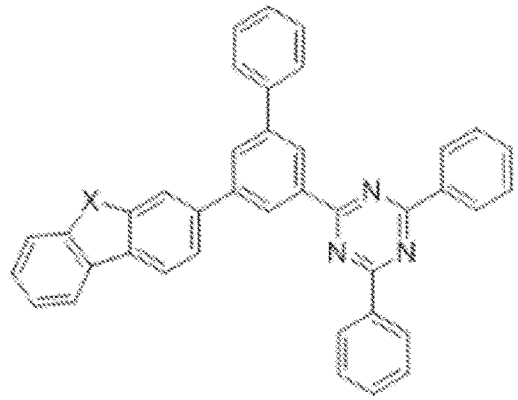

Compound A76 through A78, each represented by the formula

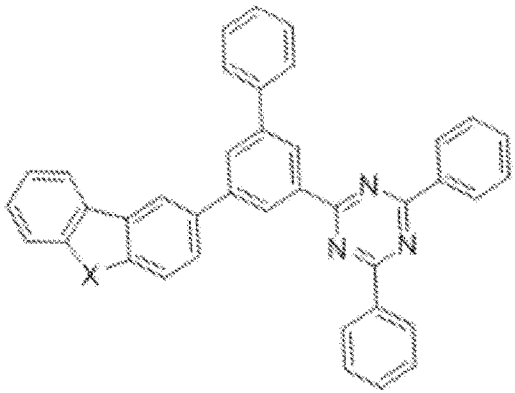

wherein in Compound A73: X=O,
in Compound A74: X=S,
--in Compound A75: X=Se                 , wherein in Compound A76: X=O,
in Compound A77: X=S,
in Compound A78: X=Se                 , Compound A79 through A81, each represented Compound A82 through A84, each Signed and Sealed this
Fourteenth Day of February, 2023

Katherine Kelly Vidal
*Director of the United States Patent and Trademark Office* by the formula

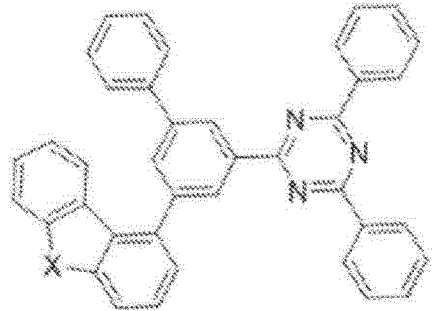

wherein in Compound A79: X=O,
in Compound A80: X=S,
in Compound A81: X=Se ,

Compound A85 through A87, each represented by the formula

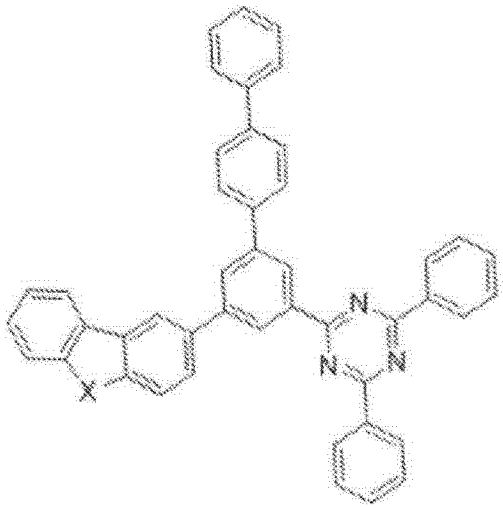

wherein in Compound A85: X=O,
in Compound A86: X=S,
in Compound A87: X=Se ,

Compound A91 through A93, each represented represented by the formula

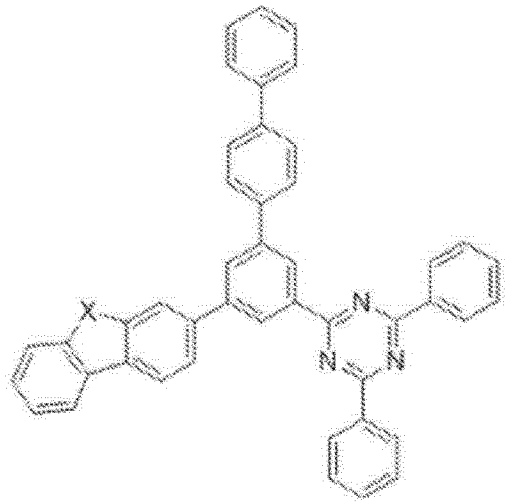

wherein in Compound A82: X=O,
in Compound A83: X=S,
in Compound A84: X=Se ,

Compound A88 through A90, each represented by the formula

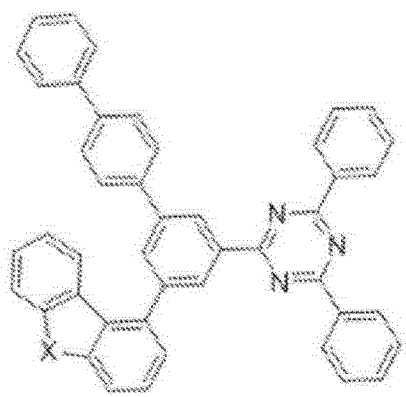

wherein in Compound A88: X=O,
in Compound A89: X=S,
in Compound A90: X=Se ,

Compound A94 through A96, each by the formula

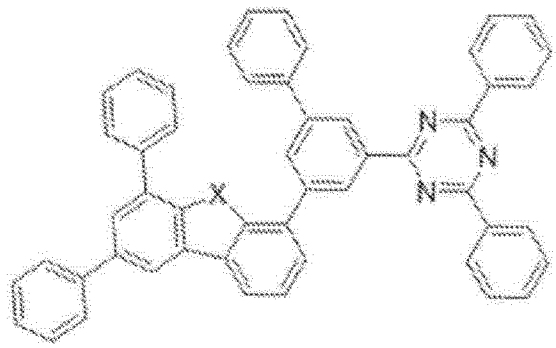

wherein in Compound A91: X=O,
in Compound A92: X=S,
in Compound A93: X=Se            , Compound A97 through A99, each represented by the formula

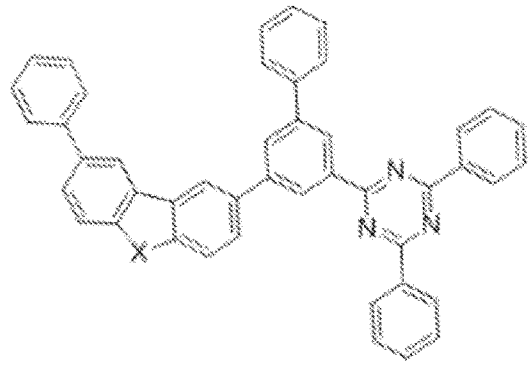

wherein in Compound A97: X=O,
in Compound A98: X=S,
in Compound A99: X=Se            , Compound A103 through A105, each represented by the formula

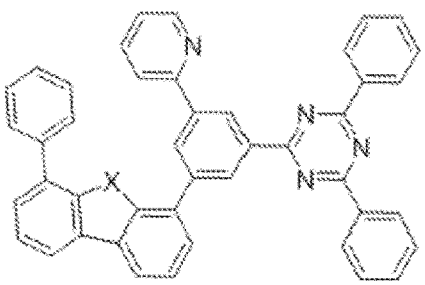

wherein in Compound A103: X=O,
in Compound A104: X=S,
in Compound A105: X=Se            , represented by the formula

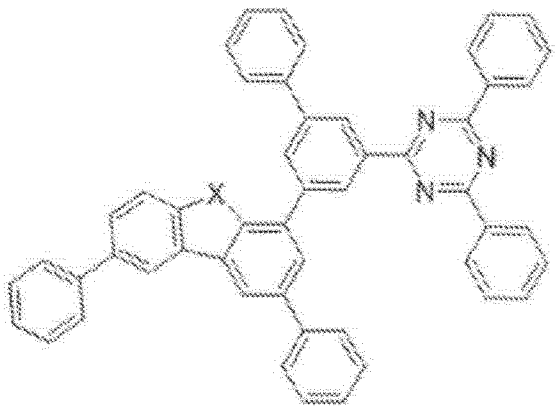

wherein in Compound A94: X=O,
in Compound A95: X=S,
in Compound A96: X=Se            , Compound A100 through A102, each represented by the formula

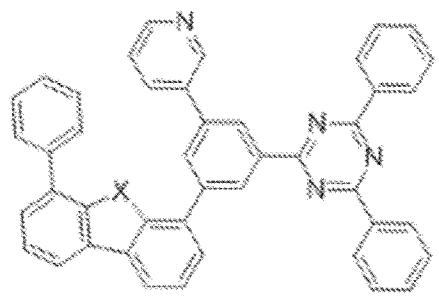

wherein in Compound A100: X=O,
in Compound A101: X=S,
in Compound A102: X=Se            , Compound A106 through A108, each represented by the formula

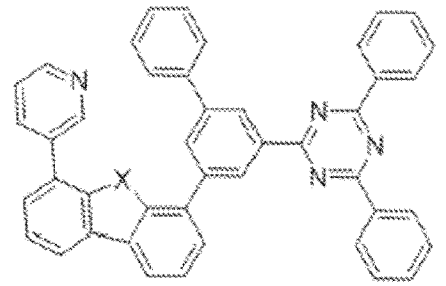

wherein in Compound A106: X=O,
in Compound A107: X=S,
in Compound A108: X=Se            ,--

In Claim 16, Column 157, after Line 67, insert the following structures: